United States Patent
Lacy et al.

(10) Patent No.: US 11,255,109 B2
(45) Date of Patent: Feb. 22, 2022

(54) EXIT DEVICE SYSTEMS AND METHODS

(71) Applicant: Schlage Lock Company LLC, Carmel, IN (US)

(72) Inventors: Yong K. Lacy, Carmel, IN (US); Paul R. Arlinghaus, Fishers, IN (US); Dan Pfunder, Noblesville, IN (US); Mohammed M. Ali, Bangalore (IN); Suresha Chandrasekhara, KGF (IN); Vijayakumar Mani, Bangalore (IN)

(73) Assignee: Schlage Lock Company LLC, Carmel, IN (US)

( * ) Notice: Subject to any disclaimer, the term of this patent is extended or adjusted under 35 U.S.C. 154(b) by 931 days.

(21) Appl. No.: 15/903,683

(22) Filed: Feb. 23, 2018

(65) Prior Publication Data

US 2018/0245373 A1 Aug. 30, 2018

Related U.S. Application Data

(60) Provisional application No. 62/463,346, filed on Feb. 24, 2017, provisional application No. 62/481,068, (Continued)

(51) Int. Cl.
*E05B 65/10* (2006.01)
*E05B 47/00* (2006.01)
(Continued)

(52) U.S. Cl.
CPC ............ *E05B 65/108* (2013.01); *E05B 17/22* (2013.01); *E05B 41/00* (2013.01);
(Continued)

(58) Field of Classification Search
CPC ......... Y10T 292/0908; Y10T 292/0909; Y10T 292/091; E05B 65/108; E05B 65/1046;
(Continued)

(56) References Cited

U.S. PATENT DOCUMENTS 3,614,145 A * 10/1971 Zawadzki ........... E05B 65/1053
292/92
4,006,471 A 2/1977 Pappas
(Continued)

FOREIGN PATENT DOCUMENTS

| WO | 2006016826 A1 | 2/2006 |
| WO | 2014063043 A1 | 4/2014 |
| WO | 2015105946 A1 | 7/2015 |

OTHER PUBLICATIONS

International Search Report; International Searching Authority; International Patent Application No. PCT/US2018/019473; dated Jun. 26, 2018; 4 pages.
(Continued)

*Primary Examiner* — Carlos Lugo
(74) *Attorney, Agent, or Firm* — Taft Stettinius & Hollister LLP

(57) ABSTRACT

An exit device according to one embodiment includes a plurality of sensors and an electronic dogging mechanism. The exit device is configured to locally analyze sensor data to determine the security state of the exit device, report data to a management system via a wireless communication channel established between the exit device and the management system, and receive and process instructions to perform an electronic dogging operation.

21 Claims, 33 Drawing Sheets

Related U.S. Application Data filed on Apr. 3, 2017, provisional application No. 62/565,563, filed on Sep. 29, 2017.

(51) Int. Cl.

| | | |
|---|---|---|
| *E05B 81/76* | (2014.01) | |
| *E05B 41/00* | (2006.01) | |
| *E05B 17/22* | (2006.01) | |
| *E05B 63/24* | (2006.01) | |
| *E05B 65/06* | (2006.01) | |
| *E05C 19/16* | (2006.01) | |
| *G01R 15/20* | (2006.01) | |
| *G07C 9/00* | (2020.01) | |
| *E05B 45/06* | (2006.01) | |
| *E05B 47/06* | (2006.01) | |
| *G08B 13/08* | (2006.01) | |
| *G08B 25/10* | (2006.01) | |
| *E05B 39/04* | (2006.01) | |
| *E05B 17/00* | (2006.01) | |
| *G08B 13/06* | (2006.01) | |

(52) U.S. Cl.
CPC ........ *E05B 47/0001* (2013.01); *E05B 63/246* (2013.01); *E05B 65/06* (2013.01); *E05B 65/1013* (2013.01); *E05B 65/1053* (2013.01); *E05B 65/1093* (2013.01); *E05B 81/77* (2013.01); *E05C 19/166* (2013.01); *G01R 15/202* (2013.01); *G07C 9/00309* (2013.01); *E05B 17/0083* (2013.01); *E05B 39/04* (2013.01); *E05B 47/0012* (2013.01); *E05B 47/0615* (2013.01); *E05B 2045/067* (2013.01); *E05B 2045/0625* (2013.01); *E05B 2045/0655* (2013.01); *E05B 2047/0014* (2013.01); *E05B 2047/0067* (2013.01); *E05B 2047/0069* (2013.01); *E05B 2047/0089* (2013.01); *E05Y 2400/44* (2013.01); *G08B 13/06* (2013.01); *G08B 13/08* (2013.01); *G08B 25/10* (2013.01); *Y10T 292/0908* (2015.04)

(58) Field of Classification Search
CPC ............. E05B 65/1086; E05B 65/1093; Y10S 292/24; Y10S 292/65
USPC ....... 70/92, 278.7, 279.1, 283, 465, DIG. 52
See application file for complete search history.

(56) References Cited

U.S. PATENT DOCUMENTS

| | | | |
|---|---|---|---|
| 4,412,356 A | 10/1983 | Klaus et al. | |
| 4,540,208 A * | 9/1985 | Logan, Jr | E05B 65/1066 292/201 |
| 4,613,176 A * | 9/1986 | Kelly | E05B 47/0607 292/201 |
| 4,631,528 A | 12/1986 | Handel et al. | |
| 4,659,884 A * | 4/1987 | Wollenhaupt | E05B 47/0002 200/50.01 |
| 4,717,909 A | 1/1988 | Davis | |
| 4,893,852 A * | 1/1990 | Harris | E05B 47/00 250/342 |
| 4,976,476 A | 12/1990 | Cross et al. | |
| 5,070,442 A | 12/1991 | Syron-Townson et al. | |
| 5,072,973 A * | 12/1991 | Gudgel | E05C 17/28 292/55 |
| 5,085,475 A | 2/1992 | Austin et al. | |
| 5,340,171 A * | 8/1994 | Slaybuagh | E05B 47/023 292/201 |
| 5,429,399 A * | 7/1995 | Geringer | E05B 41/00 292/251.5 |
| 5,492,382 A * | 2/1996 | McBride | E05B 47/0002 292/201 |
| 5,517,176 A | 5/1996 | Lavelle et al. | |
| 5,927,765 A * | 7/1999 | Austin | E05B 63/0065 292/194 |
| 5,988,708 A | 11/1999 | Frolov et al. | |
| 6,009,732 A | 1/2000 | Haeck et al. | |
| 6,104,594 A | 8/2000 | Frolov et al. | |
| 6,116,661 A | 9/2000 | Overbey et al. | |
| 6,318,138 B1 | 11/2001 | Mathews et al. | |
| 6,386,597 B1 | 5/2002 | Walsh, III | |
| 6,394,508 B1 | 5/2002 | Zehrung | |
| 6,565,130 B1 * | 5/2003 | Walsh, III | E05B 47/0002 292/201 |
| 6,609,738 B1 * | 8/2003 | Roth | E05B 65/108 292/144 |
| 6,720,861 B1 | 4/2004 | Rodenbeck et al. | |
| 6,783,167 B2 * | 8/2004 | Bingle | E05B 83/26 292/DIG. 43 |
| 7,055,871 B2 | 6/2006 | Toledo et al. | |
| 7,138,912 B2 * | 11/2006 | Fitzgibbon | E05F 15/72 340/521 |
| 7,484,777 B2 * | 2/2009 | Condo | E05B 65/1053 292/92 |
| 7,503,597 B2 | 3/2009 | Cohrs, Jr. et al. | |
| 7,536,885 B1 * | 5/2009 | Ross | E05B 65/1073 292/251.5 |
| 7,614,265 B2 | 11/2009 | Belden, Jr. et al. | |
| 7,616,090 B2 | 11/2009 | Baker et al. | |
| 7,862,091 B2 * | 1/2011 | Escobar | E05B 47/023 292/93 |
| 8,070,192 B2 * | 12/2011 | Tien | E05B 65/1053 292/92 |
| 8,182,003 B2 * | 5/2012 | Dye | E05B 65/1053 292/92 |
| 8,480,136 B2 | 7/2013 | Dye et al. | |
| 8,495,836 B2 | 7/2013 | Lowder et al. | |
| 8,764,071 B2 * | 7/2014 | Lanigan | E05F 15/53 292/92 |
| 8,851,530 B2 * | 10/2014 | Geringer | E05B 65/1046 292/92 |
| 8,915,523 B2 * | 12/2014 | Tillman | E05B 65/1093 292/92 |
| 8,978,305 B2 * | 3/2015 | Morstatt | E05B 47/026 49/394 |
| 9,151,096 B2 | 10/2015 | Hunt et al. | |
| 9,361,771 B2 | 6/2016 | Comerford et al. | |
| 9,903,142 B2 * | 2/2018 | Van Wiemeersch | .... E05B 77/54 |
| 10,107,015 B2 * | 10/2018 | Geringer | ............ E05B 47/0012 |
| 10,273,725 B2 * | 4/2019 | Van Wiemeersch | ... B60K 35/00 |
| 10,301,845 B2 * | 5/2019 | Hsu | E05B 47/0001 |
| 2006/0059963 A1 | 3/2006 | Conforti | |
| 2011/0016938 A1 | 1/2011 | Chi | |
| 2012/0242092 A1 | 9/2012 | Frolov et al. | |
| 2013/0321125 A1 | 12/2013 | Geringer et al. | |
| 2014/0109479 A1 | 4/2014 | Morstatt et al. | |
| 2014/0292481 A1 | 10/2014 | Dumas et al. | |
| 2015/0137528 A1 | 5/2015 | Geringer et al. | |
| 2015/0184426 A1 * | 7/2015 | Arlinghaus | ........... E05B 15/004 292/138 |
| 2016/0189503 A1 | 6/2016 | Johnson et al. | |
| 2016/0230423 A1 | 8/2016 | Lehner, Jr. et al. | |
| 2016/0319570 A1 | 11/2016 | Wong et al. | |

OTHER PUBLICATIONS

Written Opinion; International Searching Authority; International Patent Application No. PCT/US2018/019473; dated Jun. 26, 2018; 15 pages.

Canadian Office Action; Canadian Intellectual Property Office; Canadian Patent Application No. 3,057,981; dated Dec. 2, 2020; 4 pages.

Von Duprin, LX/LX-LC Switch Retrofit Kit Installation Instructions, 2014, 5 pages, 941039-00, copyright Allegion 2014.

Von Duprin, RX2 Double RX Switch Installation Instructions, 2014, 2 pages 941089-00, copyright Allegion 2014.

(56) References Cited

OTHER PUBLICATIONS

Von Duprin, RX/RX-LC/S1 Switch Retrofit Kit Installation Instructions, 2014, 4 pages, 941038-00, copyright Allegion 2014.
Sargent ASSA ABLOY, School Security Solutions, 2014, 2 pages, copyright 2014 Sargent Manufacturing Company, an ASSA ABLOY Group company.
Securitron ASSA ABLOY, The Leader in Electronic Locking Products and Systems, 2015 Catalog, 2015, 132 pages, copyright 2015 Hanchett Entry Systems, Inc., an ASSA ABLOY Group company.
SDS, Exit Check Integrated Delayed Egress Locks, 2013, 8 pages, copyright 2013 Security Door Controls.
Allegion, Von Duprin QEL exit device a quieter way to make an entrance, 2014, 2 pages, copyright 2014 Allegion.
Allegion, FALCON Classroom security indicators MA Series locks, 2014, 2 pages, copyright 2014 Allegion.
ASSA ABLOY, ElectroLynx Door Security Solutions Hardwiring Made Easy, 8 pages, copyright ASSA ABLOY Sales & Marketing Group Inc. 2005, 2006.
Yale, 7000 Series Architectural Exit Devices ASSA ABLOY, 50 pages, copyright 2002, 2013, Yale Security, Inc., an ASSA ABLOY Group company.

\* cited by examiner

EXIT DEVICE SYSTEMS AND METHODS

CROSS-REFERENCE TO RELATED APPLICATIONS

This application claims the benefit of each of U.S. Provisional Patent Application No. 62/463,346, filed on Feb. 24, 2017, U.S. Provisional Patent Application No. 62/481,068, filed on Apr. 3, 2017, and U.S. Provisional Patent Application No. 62/565,563, filed on Sep. 29, 2017, the contents of each of which are incorporated herein by reference in their entirety.

BACKGROUND

Exit devices are commonly mounted on the interior side of doors (e.g., in large facilities or public buildings) to hold the doors in closed positions while permitting easy egress. Exit devices typically include springs that bias a pushbar toward an extended position and a latchbolt configured to extend into or otherwise engage a door frame mounted strike to secure the door. The latchbolt typically may be retracted when a pushbar is depressed by virtue of a mechanical linkage therebetween.

In some circumstances, such as emergency situations, it may be desirable to secure all openings in a building to prevent intruders from entering. Under other circumstances, it may be desirable to "dog" the exit device to hold the latchbolt in a retracted position and the pushbar in a depressed or retracted position, which allows the door to be opened from an exterior side of the door (i.e., opposite the pushbar) for an extended period of time. Such circumstances may include, for example, during normal business hours or in an environment where noise is obtrusive. By "dogging" the exit device, door users may pass through the door with minimal, if any, noise from the exit device. Various electrical and electromechanical dogging mechanisms may be used to selectively maintain the exit device in such a dogged state, thereby selectively retaining the latchbolt in the retracted position. However, many conventional dogging mechanisms have certain limitations relating, for example, to convenience, safety, and power consumption requirements.

Certain conventional dogging mechanisms are purely mechanical, and require a custodian or other authorized person to manually set the exit device to the dogged or undogged state. Such manual operation is not only time-consuming, but may also lead to dangerous situations. For example, in the event of an emergency that necessitates securing the building, such as a "lockdown" situation, the time required to manually set each exit device in the building to the undogged state may far exceed an acceptable response time.

Other conventional systems include an electrically-activated driver (e.g., a motor, solenoid, or electromagnet) which drives the pushbar to the depressed/retracted position against the biasing force of internal springs. In order to "dog" such exit devices, the driver generally must remain energized in order to counteract the springs urging the pushbar to the extended position. Such systems typically have high power consumption requirements and require a connection to line power, which may be cost-prohibitive or otherwise disadvantageous in certain situations. Additionally, even in situations in which line power is readily available, the requirement that the driver remain activated while in the dogging state may result in significant or excessive amounts of power being used by the exit device.

In certain circumstances, a particular exit device may include one or more sensors to confirm, for example, that a door is in position (closed). However, such sensor data is typically not provided to an access control or security system, which requires that a custodian or other authorized person tour the facility to confirm that each door is closed and secure.

Certain exit devices may be provided with two or more electronic components (e.g., sensors, controllers, visual indicators, and electromechanical actuators) in electrical communication with one another via a set of wires. When the components are spaced apart from one another, installation of such components may require routing the wires along at least a portion of the length of the exit device. Current approaches to such wire routing typically take one of two forms, each of which has certain limitations. A first approach involves routing between the base plate and the floor of the channel member to which the base plate is mounted. However, this approach typically limits the number of wires that can be run, typically requires the exit device to be disassembled to add or remove wires, and can damage wires as the baseplate is reinserted into the channel member. A second approach involves using wire ties to hold the wires in the correct position as the wires are routed around moving parts in the drive assembly. This approach can be difficult and time-consuming, and if done improperly, may result in the wires being damaged by the moving components during operation of the exit device. Given the limitations of the current approaches to wire routing, it can be difficult to upgrade or otherwise retrofit an existing exit device in the field. As a result of this difficulty and the attendant costs, many property managers are discouraged from adapting to changes in security needs.

As is evident from the foregoing, many conventional dogging mechanisms, and exit device systems generally, have various limitations. For these reasons among others, a need remains for further improvements in this technological field.

SUMMARY

According to at least one embodiment, an exit device may include an electronic dogging mechanism and various sensor, control, and/or wire management assemblies (e.g., retrofit kit modules). Further, the exit device may be configured to locally analyze various sensor data to determine the security state of the exit device, report various data (e.g., audit data, detected device tampering, a detected door prop condition, a forced door condition, and/or other data) to a person in the vicinity via a visual indicator of the exit device and/or wirelessly to a management system via a wireless communication channel, and/or receive/process control instructions to perform an electronic dogging operation, dogging schedule data, and/or other suitable data. This summary is not intended to be used as an aid in limiting the scope of the claimed subject matter. Further embodiments, forms, and features of the present application shall become apparent from the description and figures provided herewith.

BRIEF DESCRIPTION OF THE DRAWINGS

The concepts described herein are illustrative by way of example and not by way of limitation in the accompanying figures. For simplicity and clarity of illustration, elements illustrated in the figures are not necessarily drawn to scale.

Where considered appropriate, references labels have been repeated among the figures to indicate corresponding or analogous elements.

DETAILED DESCRIPTION

Figure 1:
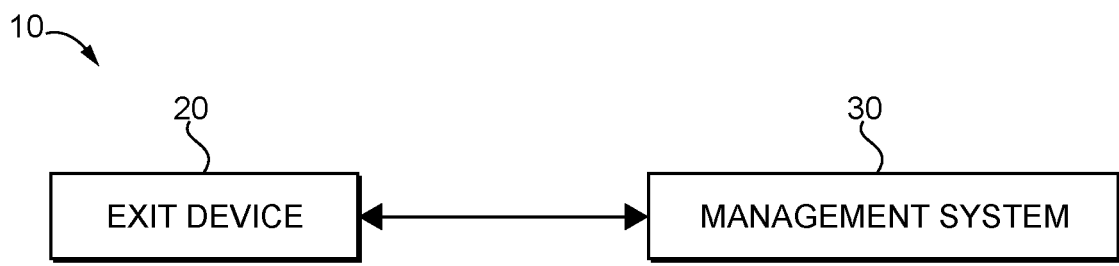
FIG. 1 is a simplified block diagram of at least one embodiment of a system for wireless door prop notification.

Although the concepts of the present disclosure are susceptible to various modifications and alternative forms, specific embodiments have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. It should further be appreciated that although reference to a "preferred" component or feature may indicate the desirability of a particular component or feature with respect to an embodiment, the disclosure is not so limiting with respect to other embodiments, which may omit such a component or feature. Further, when a particular feature, structure, or characteristic is described in connection with an embodiment, it is submitted that it is within the knowledge of one skilled in the art to implement such feature, structure, or characteristic in connection with other embodiments whether or not explicitly described.

Additionally, it should be appreciated that items included in a list in the form of "at least one of A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C). Further, with respect to the claims, the use of words and phrases such as "a," "an," "at least one," and/or "at least one portion" should not be interpreted so as to be limiting to only one such element unless specifically stated to the contrary, and the use of phrases such as "at least a portion" and/or "a portion" should be interpreted as encompassing both embodiments including only a portion of such element and embodiments including the entirety of such element unless specifically stated to the contrary.

The disclosed embodiments may, in some cases, be implemented in hardware, firmware, software, or a combination thereof. The disclosed embodiments may also be implemented as instructions carried by or stored on one or more transitory or non-transitory machine-readable (e.g., computer-readable) storage media, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures unless indicated to the contrary. Additionally, the inclusion of a structural or method feature in a particular figure is not meant to imply that such feature is required in all embodiments and, in some embodiments, may not be included or may be combined with other features.

As used herein, the terms "longitudinal," "lateral," and "transverse" are used to denote motion or spacing along three mutually perpendicular axes, wherein each of the axes defines two opposite directions. In the coordinate system illustrated in FIG. 3, the X-axis defines first and second longitudinal directions, the Y-axis defines first and second transverse directions, and the Z-axis defines first and second lateral directions. Additionally, the longitudinal directions defined by the X-axis may be referred to as the proximal direction (to the right in FIG. 4) and the distal direction (to the left in FIG. 4). These terms are used for ease and convenience of description, and are without regard to the orientation of the system with respect to the environment. For example, descriptions that reference a longitudinal direction may be equally applicable to a vertical direction, a horizontal direction, or an off-axis orientation with respect to the environment.

Furthermore, motion or spacing along a direction defined by one of the axes need not preclude motion or spacing along a direction defined by another of the axes. For example, elements which are described as being "laterally offset" from one another may also be offset in the longitudinal and/or transverse directions, or may be aligned in the longitudinal and/or transverse directions. The terms are therefore not to be construed as limiting the scope of the subject matter described herein.

Figure 2:
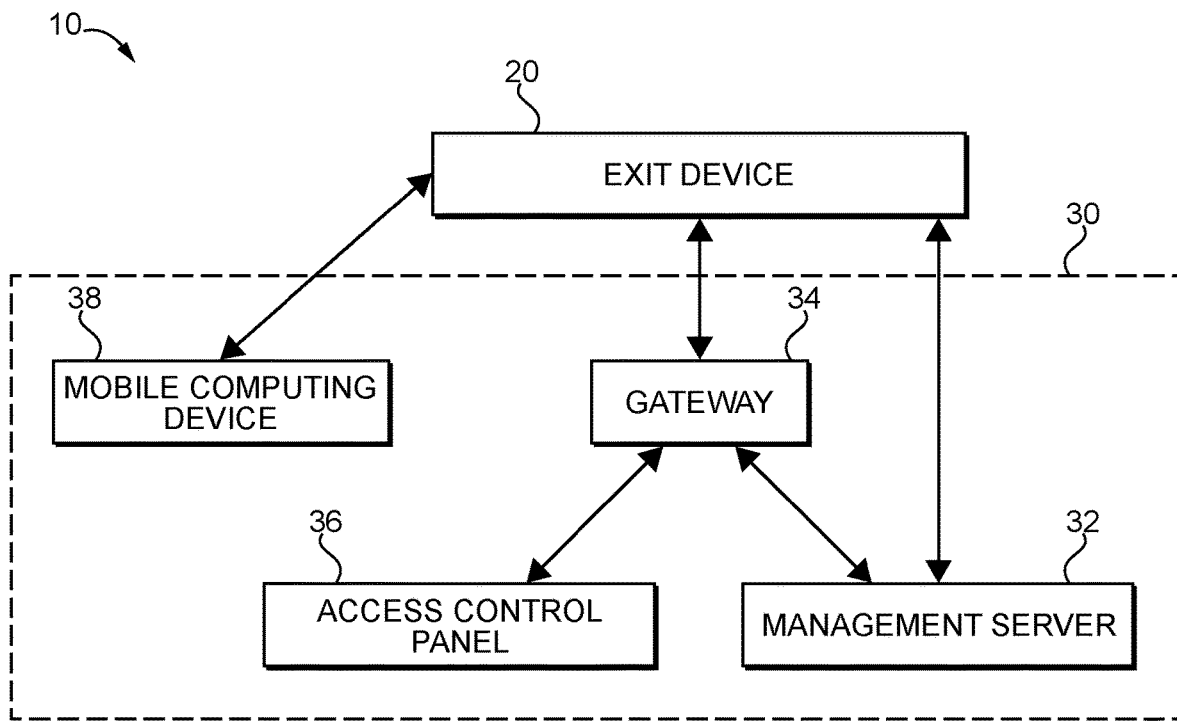
FIG. 2 is a simplified block diagram of at least one embodiment of the system of FIG. 1.

Referring now to FIGS. 1 and 2, a system 10 may include an exit device 20 and a management system 30. As described in detail below, the illustrative system 10 may allow for wireless management of a security state of the exit device 20. In particular, the system 10 may include an elegant and cost-effective mechanism that allows the management system 30 to wirelessly communicate with the exit device 20, for example, to control the dogging state of the exit device 20. It should be appreciated that the speed of the undogging solution (e.g., seconds after a scheduled undogging event or wirelessly receiving a command from the management system 30) may be significantly faster than manually touring a facility. Additionally, in some embodiments, the continuous or periodic sensing and monitoring of the security state of the exit device 20 may allow for propped/forced doors and/or other conditions to be detected and reported to the management system 30 (e.g., without requiring a full perimeter security system). As such, the intelligence, communications, and sensing capabilities of the exit device 20 may provide a platform for sensing product health conditions through diagnostic and prognostic evaluation of how an entryway is operating. Further, the exit device 20 may perform a holistic evaluation of the security state of the exit device 20 based on the sensor data and provide a notification to a user and/or technician. For example, as described below, the notification may be transmitted wirelessly to the management system 30 (or other suitable entity), displayed on a visual indicator of the exit device 20, and/or otherwise outputted (e.g., via an audible indicator). In some embodiments, the sensors of the exit device 20 may be used as an independent security mechanism or an extension of an existing security system.

As described in detail below, in some embodiments, the exit device 20 of the system 10 may intelligently sense that a condition associated with a propped or forced door has occurred and notify the management system 30 of such occurrence, for example, to aid facility security management. In particular, the system 10 may be embodied as at least a portion of a distributed perimeter security system related to detection and notification of door prop conditions for entries with exit devices. The system 10 or, more specifically, the exit device 20 may involve a wireless link to a management software or panel solution (e.g., the management system 30), embedded processing capabilities to detect door prop conditions and/or other conditions (e.g., a forced door), and a set of sensors that generate sensor data to be assessed with respect to detection of an occurrence of a door prop condition. It should be appreciated that the local analysis (i.e., on the exit device 20) of the sensor data and local detection of the security state of the door and/or associated conditions (e.g., a door prop condition or a forced door condition) may significantly simplify and reduce the cost of a perimeter security system, for example, by abstracting or simplifying the data that is transmitted to the management system 30. For example, in some embodiments, the exit device 20 may analyze the raw sensor data and convert the data into a different format (e.g., a more user-friendly format, a more compact data format, etc.) indicative of the security state of the door, door condition(s), and/or door parameter(s). Further, in some embodiments, the system 10 may be deployed without having an access control or integrated lock solution for a particular building. In some embodiments, one or more components of the exit device 20 described herein may be included in an add-on or retrofit product to existing exit devices in the field.

It should be appreciated that, depending on the particular embodiment, the management system 30 may include one or more devices or subsystems. As shown in FIG. 2, in some embodiments, the management system 30 may include a management server 32, a gateway device 34, an access control panel 36, and/or a mobile computing device 38. The management system 30 may serve as a facility management interface, which may reside on one or more of the devices of the management system 30. For example, the management system 30 may include an online server (e.g., the management server 32, a cloud-based server, and/or another suitable server), a handheld application (e.g., executed by the mobile computing device 38), an OEM software solution (e.g., executed by an OEM server, the management server 32, a cloud-based server, and/or another suitable server), and/or access control panel (e.g., the access control panel 36). In some embodiments, one or more devices of the management system 30 may form a portion of a cloud computing environment.

As described herein, the exit device 20 is configured to locally analyze various sensor data to determine the security state of the exit device 20 (e.g., based on a holistic analysis of sensor data). Further, the exit device 20 may report the security state, audit data (e.g., raw sensor data or analyzed results thereof), detected device tampering, a detected door prop condition, a forced door condition, and/or other suitable data to one or more devices of the management system 30 via a wireless communication channel/link established (e.g., directly or indirectly, ad hoc or persistent) between the exit device 20 and the management system device(s), via a visual indicator of the exit device 20, and/or via another feedback mechanism (e.g., an audible alert projected from the exit device 20). As described herein, the exit device 20 may also wirelessly receive various data from the management system 30 such as, for example, control instructions to perform a dogging operation (e.g., dog-on-next-exit or undog), dogging schedule data, and/or other suitable data. In some embodiments, it should be appreciated that the exit device 20 may also transmit other data to (and receive other data from) the various devices of the management system 30.

As shown in FIG. 2, the illustrative exit device 20 may communicate with various devices of the management system 30 using various communication protocols. In particular, the exit device 20 may wirelessly communicate with the devices of the management system 30 using various wireless communication protocols depending on the particular implementation. Accordingly, as described below, the exit device 20 may include various wireless and/or other communication circuitry 414 (e.g., discrete and/or integrated transceivers) to communicate with the management system 30. For example, in some embodiments, the exit device 20 may be configured to communicate with one or more devices of the management system 30 using Wi-Fi (e.g., infrastructure or ad hoc mode), Wi-Fi Direct, Bluetooth (including Bluetooth Low Energy (BLE)), Zigbee, Near Field Communication (NFC), IEEE 802.15, and/or another suitable wireless communication protocol.

In the illustrative embodiment, the exit device 20 may communicate with the management server 32 over a Wi-Fi connection and/or with the mobile computing device 38 over a Bluetooth connection. Additionally, the exit device 20 may communicate with the management server 32 and/or the access control panel 36 via the gateway device 34. As such, in the illustrative embodiment, the exit device 20 may communicate with the gateway device 34 over a Wi-Fi connection and/or a Bluetooth connection, and the gateway device 34 may, in turn, forward the communicated data to the relevant management server 32 and/or access control panel 36. In particular, the gateway device 34 may communicate with the access control panel 36 over a serial communication link (e.g., using RS-485 standard communication), and the gateway device 34 may communicate with the management server 32 over a Wi-Fi connection, an Ethernet connection, or another wired/wireless communication connection. As such, it should be appreciated that the exit device 20 may communicate with the management system 30 via an online mode with a persistent real-time communication connection or via an offline mode (e.g., prompted by the detection of a door prop condition or other relevant condition) depending on the particular embodiment. As indicated above, in other embodiments, it should be appreciated that the exit device 20 may communicate with the devices of the management system 30 via another suitable communication protocol.

Further, in some embodiments, the management system 30 may communicate with multiple exit devices 20 at a single site (e.g., a particular building) and/or across multiple sites. That is, in such embodiments, the management system 30 may be configured to receive security state data, audit data, prop notifications, forced door notifications, and/or other data from exit devices 20 distributed across a single building, multiple buildings on a single campus, or across multiple locations. As such, in some embodiments, a single management system 30 may be leveraged to manage a vast array of exit devices 20 or, more particularly, security state data, audit data, prop notifications, and/or other data detected thereon and reported accordingly.

It should be appreciated that the exit device 20 may be embodied as any exit device suitable and structured to perform the functions described herein. For example, in some embodiments, the exit device 20 may be embodied as, or include similar features as, the exit device 100 shown and described in reference to FIGS. 3-13. In other embodiments, however, it should be appreciated that one or more features of the exit device 100 may be altered or omitted from a particular exit device 20 and/or the exit device 20 may include one or more features not shown or described in reference to the exit device 100.

Figure 3:
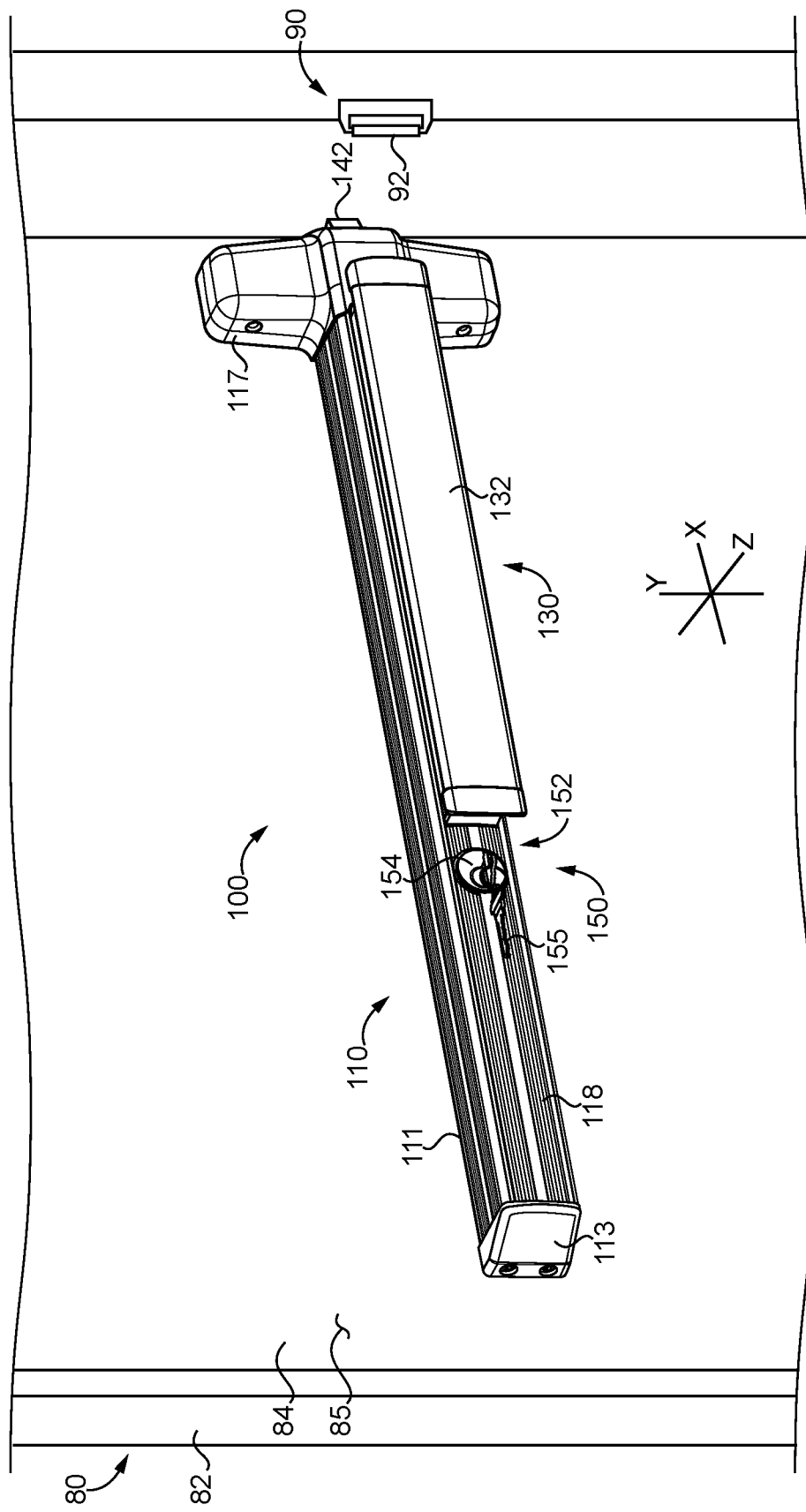
FIG. 3 is a perspective view of at least one embodiment of an exit device of FIGS. 1 and 2.

Referring now to FIG. 3, illustrated therein is a closure assembly 80 including a frame 82, and a swinging door 84 having an interior side face 85 and an opposite exterior side face. The door 84 is pivotably mounted to the frame 82 by a set of hinges such that a pushing force on the interior side face 85 urges the door 84 to swing outwardly in an opening direction. The illustrated exit device 100 is mounted to the interior side face 85 of the door 84, and is configured to interact with a strike 90 to selectively retain the door 84 in a closed position relative to the frame. While other forms are contemplated, the illustrated strike 90 is mounted to the interior side of the frame 82, and includes a roller 92.

Figure 4:
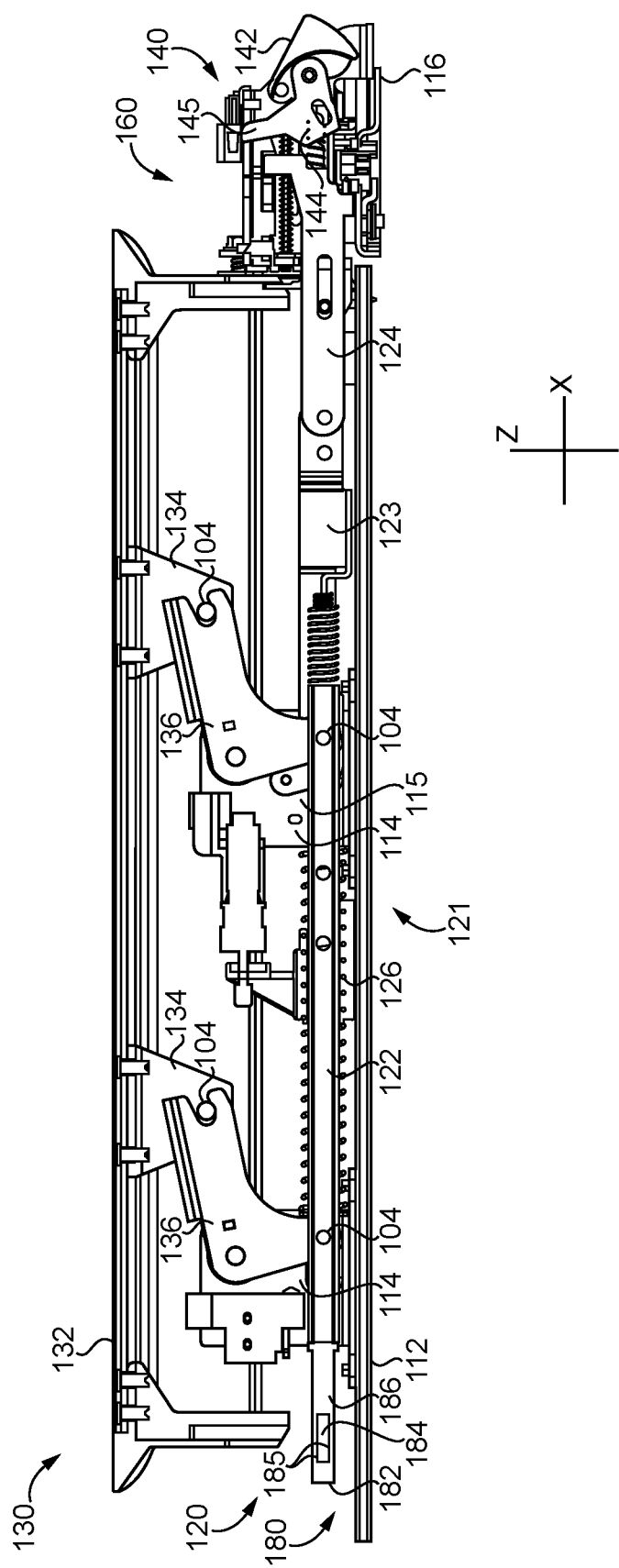
FIG. 4 is a cross-sectional view of a portion of the exit device of FIG. 3.

With additional reference to FIG. 4, the exit device 100 includes a mounting assembly 110 configured for mounting on a surface of a door, and a drive assembly 120 having an unactuated state and an actuated state. As described in further detail below, the drive assembly 120 includes a pushbar assembly 130 operable to transition the drive assembly 120 from the unactuated state to the actuated state when manually actuated by a user. In the illustrated form, the exit device 100 also includes a latchbolt assembly 140 operably connected with the drive assembly 120, and a dogging assembly 150 operable to selectively retain the drive assembly 120 in the actuated state.

The mounting assembly 110 generally includes an elongated channel member 111, a base plate 112 mounted in the channel member 111, and a pair of mounting brackets 114 coupled to the base plate 112. The channel member 111 extends in the longitudinal (X) direction, has a width in the transverse (Y) direction, and has a depth in the lateral (Z) direction. Each of the mounting brackets 114 includes a pair of transversely spaced walls 115 which extend laterally away from the base plate 112. The illustrated mounting assembly 110 also includes a header plate 116 positioned at a proximal end of the channel member 111, and a header casing 117 mounted to the header plate 116. The mounting assembly 110 further includes a cover plate 118, which encloses a distal end portion of the channel defined by the channel member 111. An end cap 113 may be mounted to the distal end of the channel member 111 to further enclose the channel and to aid in preventing the cover plate 118 from sliding in the distal direction. The mounting assembly 110 also includes a header bracket 160, which is mounted to the header plate 116 within the header casing 117.

The drive assembly 120 includes a drive train 121, which is longitudinally movable between a proximal deactuated position and a distal actuated position. In the illustrative embodiment, the drive train 121 includes a drive bar 122, a fork bar 123 coupled to a proximal end portion of the drive bar 122, a connector 124 coupled to a proximal end portion of the fork bar 123, and a link bar 180 coupled to a distal end portion of the drive bar 122. The link bar 180 includes an opening which is formed near a distal end of the drive train 121. In the illustrative embodiment, the opening is provided in the form of a slot 184, which is defined by a distal end wall 182, a proximal end wall 186, and a pair of longitudinally-extending sidewalls 185 extending between and connecting the end walls 182, 186. In other embodiments, one of the sidewalls 185 may be omitted such that the link bar 180 defines a hook. The drive assembly 120 also includes a main compression spring 126, which biases the drive train 121 in the proximal direction toward the deactuated position, thereby biasing the drive assembly 120 toward the deactuated state.

As noted above, the drive assembly 120 also includes a pushbar assembly 130. The pushbar assembly 130 generally includes a manually actuated pushbar 132, a pair of pushbar brackets 134 coupled to the pushbar 132, and a pair of bell cranks 136 operably connecting the pushbar 132 with the drive bar 122. Each bell crank 136 is pivotably mounted to a corresponding one of the mounting brackets 114, and includes a first arm pivotably connected to a corresponding one of the pushbar brackets 134 and a second arm pivotably connected to the drive bar 122. The pivotal connections may, for example, be provided by pivot pins 104. The pushbar 132 is laterally movable between an extended or deactuated position and a depressed or actuated position, and the bell cranks 136 translate lateral movement of the pushbar 132 to longitudinal movement of the drive bar 122.

In the illustrative embodiment, the latchbolt assembly 140 includes a latchbolt 142, a retractor 144 pivotably connected to the latchbolt 142, and a spring 146 engaged with the retractor 144. The latchbolt 142 is pivotably mounted to the header bracket 160 for pivotal movement between a deactuated or extended latching position and an actuated or retracted unlatching position. The retractor 144 operably connects the latchbolt 142 with the connector 124 of the drive train 121, and includes an extension 145 that extends through a slot formed in the ceiling of the header bracket 160. The spring 146 is engaged between the connector 124 and the retractor 144, and urges the latchbolt 142 and retractor 144 away from the connector 124.

With the drive assembly 120 in the deactuated state, the latchbolt 142 is in the extended position, and is operable to engage the strike 90 to retain the door 84 in the closed position. More specifically, if a user attempts to open the door 84 with the latchbolt 142 in the extended position (e.g., by applying a pushing force to the interior side face 85), such outward swinging motion is prevented by engagement of the latchbolt 142 with the strike 90.

When the pushbar 132 is depressed, the bell cranks 136 translate the laterally-inward motion of the pushbar 132 to distal motion of the drive train 121. As a result, the connector 124 retracts the retractor 144, which in turn drives the latchbolt 142 to the retracted position. In the retracted position, the latchbolt 142 is able to clear the strike roller 92 to permit the door 84 to be moved in an outwardly-swinging direction.

When the pushbar 132 is released, the spring 126 urges the drive train 121 toward the deactuated position. As the drive assembly 120 returns to the deactuated state, the latchbolt 142 returns to the extended position. The connector 124 may be connected to the retractor 144 via a lost motion connection that enables the drive assembly 120 to remain in the deactuated state while the latchbolt 142 moves between the extended and retracted positions, and the spring 146 biases the latchbolt 142 toward the extended position. Thus, if the actuating force is removed while the door 84 is in an open position, the strike roller 92 is able to move the latchbolt 142 to the retracted position as the door 84 approaches the closed position. When the door 84 reaches the closed position, the spring 146 may return the latchbolt 142 to the extended position to latch the door 84 to the frame 82.

In the illustrative embodiment, the exit device 100 is provided as a rim-type exit device, in which the latchbolt assembly 140 is mounted to the header plate 116 and is housed in the header casing 117. It is also contemplated that, in other embodiments, the exit device 100 may be provided in another configuration, such as mortise, surface vertical, or concealed vertical. In such embodiments, the portion of the latchbolt assembly 140 housed in the header casing 117 may or may not include the latchbolt 142, and may instead include one or more retractors by which the drive train 121 may be connected to a latchbolt 142. For example, in embodiments in which the exit device 100 is provided in a surface vertical configuration, a latchbolt may be mounted above or below the header casing 117 and connected to the retractor via a connector. In such forms, the retractors may translate longitudinal movement of the drive train 121 to lateral motion of the connector to retract and extend the remotely-mounted latchbolt.

As noted above, the dogging assembly 150 is operable to selectively retain the drive assembly 120 in the actuated state. More specifically, the dogging assembly 150 has a releasing or non-dogging state in which the drive assembly 120 is operable to transition between the actuated and unactuated states, and a holding or dogging state in which the dogging assembly 150 is operable to maintain the drive assembly 120 in the actuated state. The dogging assembly 150 may include a manual dogging actuator 152 operable to transition the dogging assembly 150 between the releasing and holding states. In the illustrative embodiment, the manual dogging actuator 152 is provided in the form of a lock cylinder 154 operable to change the state of the dogging assembly 150 upon insertion of a proper key 155. In other embodiments, the manual dogging actuator 152 may be provided in another form, such as a form operable by a hex key. In other embodiments, the manual dogging actuator 152 may be omitted, and the state of the dogging assembly 150 may only be controlled electronically.

As described in further detail below, the exit device 100 has a plurality of conditions or states, including an "undogged" condition/state, a "ready to dog" or "dog-on-next-exit" condition/state, and a "dogged" condition/state. In the undogged condition, the dogging assembly 150 is in the non-dogging state, and the drive assembly 120 is free to transition between the actuated and unactuated states thereof. In the "ready to dog" or "dog-on-next-exit" condition, the dogging assembly 150 is in the dogging state, the drive assembly 120 is in the unactuated state, and the exit device 100 will transition to the dogged condition the next time the drive assembly 120 is actuated (i.e. the next time the pushbar 132 is depressed). In the dogged condition, the dogging assembly is in the dogging state, and the dogging assembly 150 retains the drive assembly 120 in the actuated state. In other words, in the illustrative embodiment, the exit device 100 includes a dogging mechanism that may be positioned in various states or configurations to hold the pushbar 132 in a retracted position (e.g., by virtue of the relevant linkages) or allow the pushbar 132 to retract and extend. In the dogged position and the "ready to dog" position, the dogging mechanism is positioned to hold the pushbar 132 in the retracted position (e.g., upon the next depression of the pushbar 132 in the case of the "ready to dog" state). However, in the undogged position, the dogging mechanism is not positioned to hold the pushbar 132 in the retracted position; rather, depressing the pushbar 132 will not result in the pushbar 132 being held retracted and the pushbar 132 will return to the extended position upon the user's release of the pushbar 132. In other embodiments, it should be appreciated that a particular exit device 20 may include only a dogged state and an undogged state.

Figure 5:
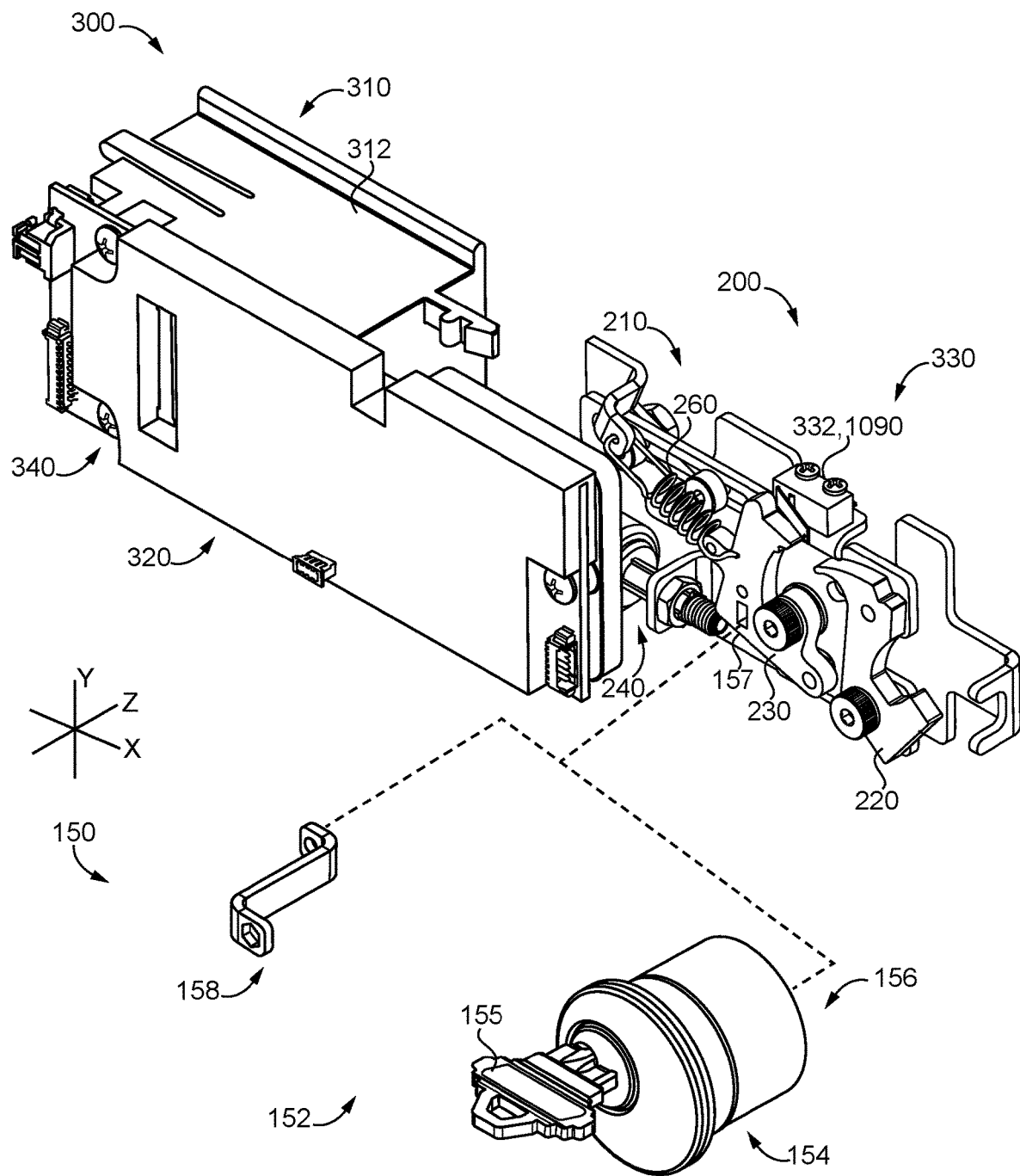
FIG. 5 is an exploded assembly view of at least one embodiment of a dogging control assembly.
Figure 6:
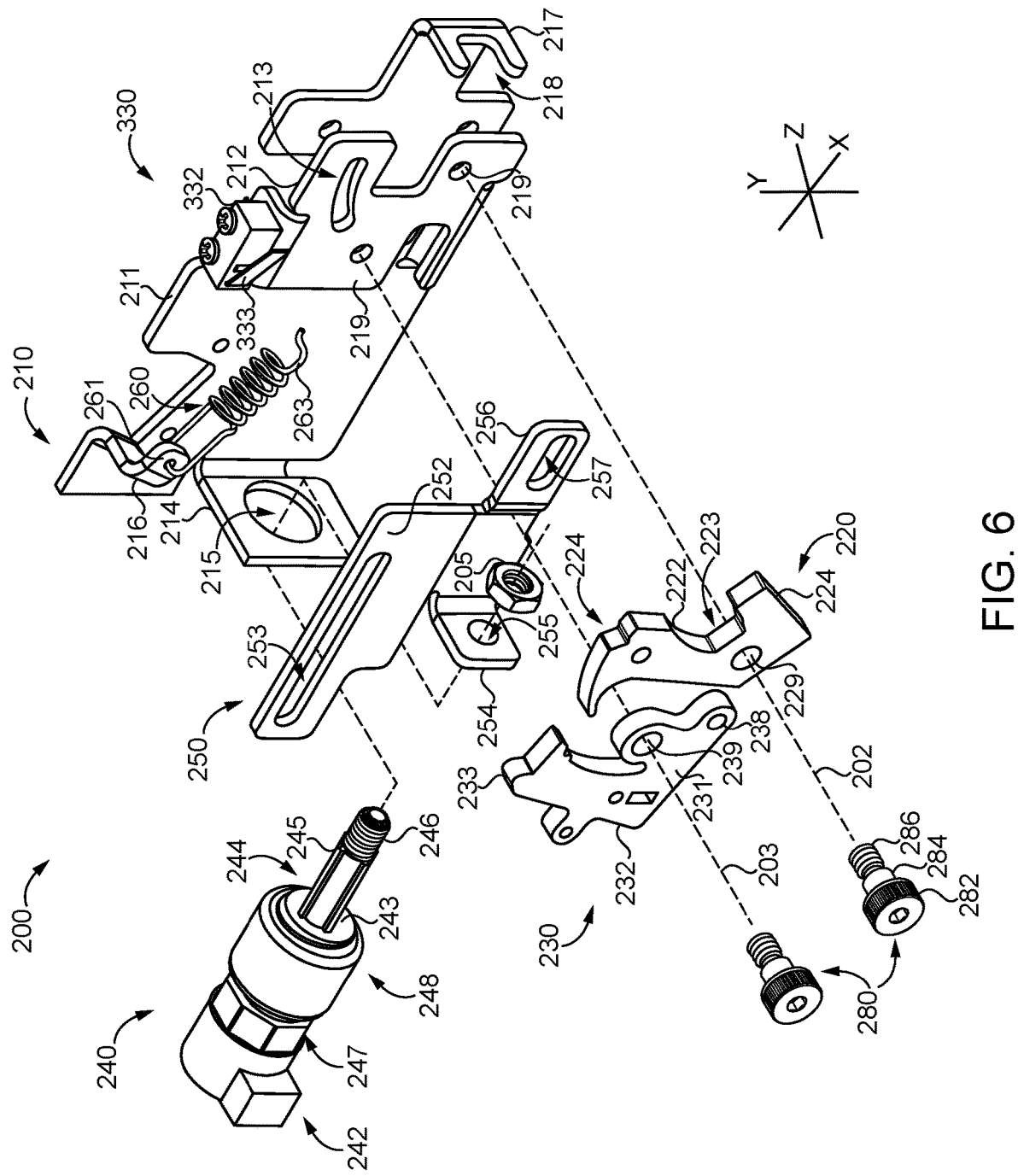
FIG. 6 is an exploded assembly view of at least one embodiment of a dogging mechanism.
Figure 7:
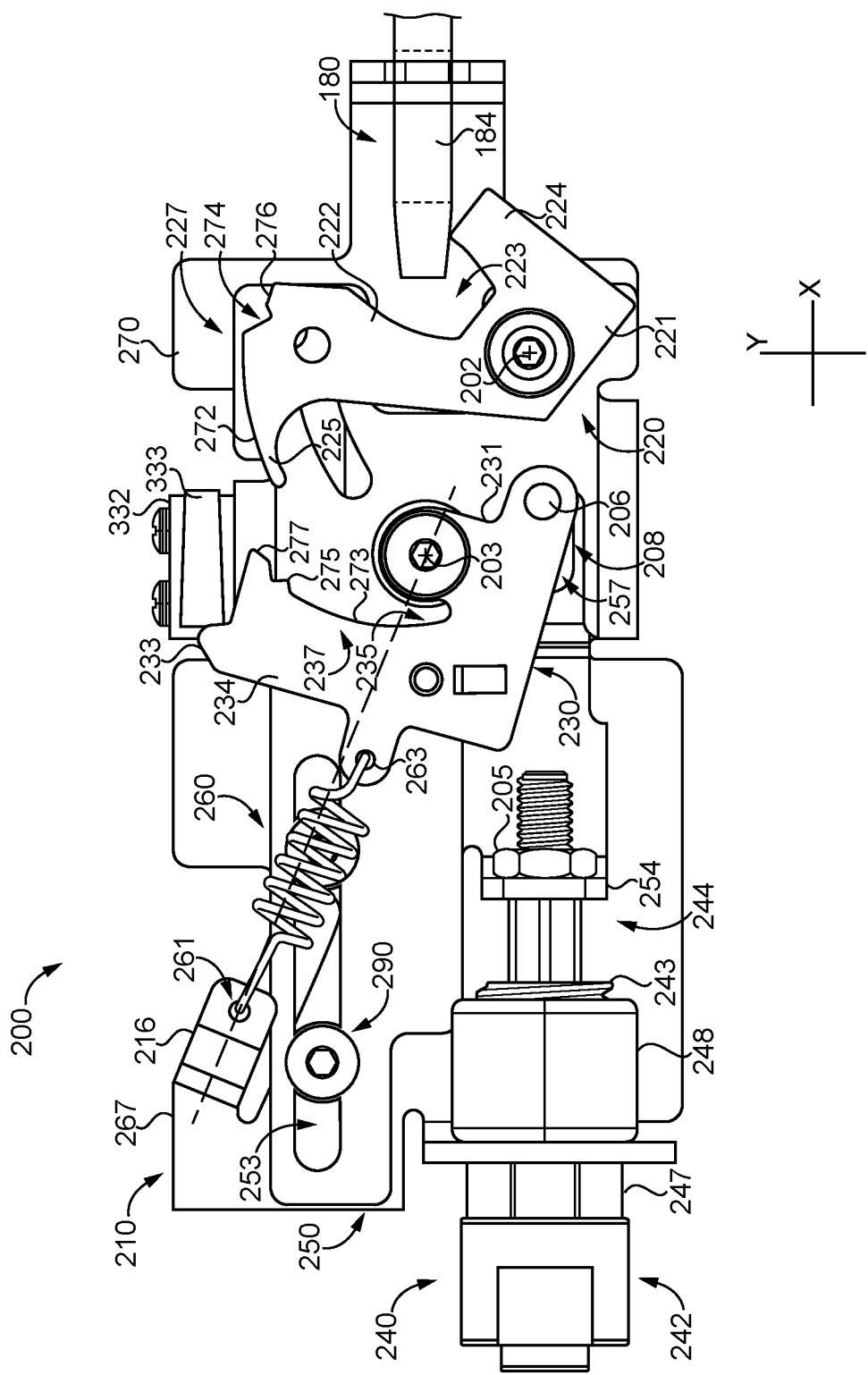
FIG. 7 is a plan view of the dogging mechanism of FIG. 6.

Referring now to FIGS. 5-7, the dogging assembly 150 includes a dogging mechanism 200, and may further include a control assembly 300 operable to actuate and control the dogging mechanism 200. In the illustrative embodiment, the dogging control assembly 300 includes an onboard power source 310, a controller 320 operable to selectively activate the dogging mechanism 200 using power drawn from the power source 310, a sensor assembly 330, and a wireless communication device 340. The sensor assembly 330 includes the dogging sensor 332 which, as described herein, is configured to sense the state of the dogging mechanism 200. Further details regarding an illustrative implementation of the sensor assembly 330 are provided below with reference to the sensor assembly 1000 illustrated in FIG. 20. It should be appreciated that, in some embodiments, the dogging control assembly 300 or one or more components thereof may form a portion of the control system 400 of FIG. 14. Further, in some embodiments, the dogging assembly 150 and/or the control system 400 may, in part or wholly, form a portion of a retrofit kit for use with exit devices in the field.

In the illustrative embodiment, the dogging mechanism 200 generally includes a mounting plate 210, a hook 220 operable to selectively engage the link bar 180, a trigger 230 operable to selectively engage the hook 220, an electromechanical dogging actuator or driver 240, a link plate 250 connected between the trigger 230 and the driver 240, an over-center spring mechanism 260 connected between the mounting plate 210 and the trigger 230, and an engagement mechanism 270 defined by the hook 220 and the trigger 230. As described in further detail below, the dogging mechanism 200 has an actuated state in which the dogging mechanism 200 is capable of retaining the drive assembly 120 in the actuated state thereof, and a deactuated state in which the drive assembly 120 is free to transition between the actuated and deactuated states thereof. Additionally, in the illustrative embodiment, the dogging mechanism 200 is capable of being transitioned between the actuated and deactuated states thereof both manually (via the manual dogging actuator 152) and electronically (via the dogging control assembly 300).

The dogging mechanism 200 also includes a plurality of coupling members 280, each of which may provide a movable coupling between the mounting plate 210 and a movable component of the dogging mechanism 200. While other forms are contemplated, each of the illustrated coupling members 280 includes a head 282, a cylindrical body 284 extending from the head 282, and a threaded end 286. The body 284 of each coupling member 280 is received within an opening formed in a component such that the component is movable relative to the coupling member 280. Each of the coupling members 280 also extends through an aperture 219 in the mounting plate 210 such that each coupling member 280 has a fixed position relative to the mounting plate 210. In some embodiments, one or more of the apertures 219 may be threaded such that the coupling members 280 are directly engaged with the mounting plate 210. It is also contemplated that, in some embodiments, one or more of the apertures 219 may be unthreaded, and that the threaded ends 286 may be threadedly engaged with a nut.

The mounting plate 210 generally includes a rear plate 211 and a front plate 212, which is laterally offset from the rear plate 211 and includes an arcuate slot 213. The mounting plate 210 also includes a motor support arm 214, an anchor arm 216, and a guide arm 217. The motor support arm 214 extends laterally from a distal end portion of the rear plate 211 and includes an opening 215. The anchor arm 216 extends laterally from the rear plate 211 and provides an anchor point for one end of the spring 260. The guide arm 217 extends laterally from the proximal end portion of the rear plate 211 and includes a guide slot 218. With the dogging mechanism 200 installed in the exit device 100, the link bar 180 extends through the guide slot 218 such that a distal end of the link bar 180 is in close proximity to the hook 220.

The hook 220 includes a body portion 221, an arm 222 extending from a first side of the body portion 221, and a finger 224 extending from a second side of the body portion 221 such that a recess 223 is formed between the arm 222 and the finger 224. The arm 222 includes an extension 225 extending toward the trigger 230, and an outer contact surface 227 which partially defines the engagement mechanism 270. The body portion 221 of the hook 220 includes an opening 229 that receives the body 284 of one of the coupling members 280 such that the hook 220 is pivotable about a hook pivot axis 202 defined by the coupling member 280. As described in further detail below, the hook 220 is pivotable about the hook pivot axis 202 through a range of angular hook positions, including a deactuated hook position $220_D$ (FIGS. 9 and 11) and an actuated hook position $220_A$ (FIGS. 10 and 12).

The trigger 230 generally includes a body portion 231, an arm 234, and a recess 235. The body portion 231 may have an arcuate outer surface, and the extension 225 of the hook 220 may have an arcuate inner surface structured to conform to the outer surface of the body portion 231. The arm 234 extends from a first side of the body portion 231 such that the recess 235 is formed between the body portion 231 and the arm 234. The arm 234 includes an inner contact surface 237 that partially defines the engagement mechanism 270. The trigger 230 also includes an attachment point 236 at which the spring 260 can be attached to the trigger 230, and an opening 238 operable to receive a pin 206. The body portion 231 of the trigger 230 includes an opening 239 that receives the body 284 of one of the coupling members 280 such that the trigger 230 is pivotable about a trigger pivot axis 203 defined by the coupling member 280.

As described in further detail below, the trigger 230 is pivotable about the trigger pivot axis 203 through a range of angular trigger positions, each of which defines a corresponding state of the dogging mechanism 200. More specifically, the trigger 230 has a release or deactuated position $230_D$ defining an undogged state (FIGS. 9 and 10), a ready-to-dog or ready position $230_R$ defining a ready state (FIG. 11), and a holding or actuated position $230_A$ defining a dogged state (FIG. 12). The trigger 230 also includes a protrusion 233 that activates and deactivates the dogging status sensor 332 as the trigger 230 pivots between these positions. Additionally, the undogged state of the dogging mechanism 200 corresponds to the non-dogging state of the dogging assembly 150, and the ready and dogged states of the dogging mechanism 200 correspond to the dogging state of the dogging assembly 150. Furthermore, while the illustrated trigger 230 pivots between the positions described above, it is also contemplated that the trigger may move between corresponding positions in another manner, such as linearly.

As indicated above, the engagement mechanism 270 is partially defined by the outer contact surface 227 of the hook 220, and is partially defined by the inner contact surface 237 of the trigger 230. The outer contact surface 227 of the hook 220 defines an arcuate outer surface 272, a notch 274, and a plateau 276; and the inner contact surface 237 of the trigger 230 defines an arcuate inner surface 273, a protrusion 275, and a plateau 277. Additionally, the outer contact surface 227 of the hook 220 may be considered to define a first engagement surface 278 including the notch 274, and the inner contact surface 237 of the trigger 230 may be considered to include a second engagement surface 279 defined by the protrusion 275. As described in further detail below, the engagement mechanism 270 is operable to selectively retain the hook 220 and trigger 230 in each of a plurality of relative positions during operation of the dogging mechanism 200.

The driver 240 includes a motor 242 having a housing 243, and an output shaft 244 driven by the motor 242. The output shaft 244 is movably mounted in the housing 243 and translates linearly when the motor 242 is actuated. The driver 240 is selectively operable in an extending first mode and a retracting second mode. When the driver 240 is operated in the extending first mode, the motor 242 causes the output shaft 244 to extend or move in the proximal direction. When the driver 240 is operated in the retracting second mode, the motor 242 causes the output shaft 244 to retract or move in the distal direction. In the illustrative embodiment, the motor 242 is a rotary stepper motor, and the driver 240 is provided in the form of a captive linear actuator that causes the output shaft 244 to translate linearly in response to rotation of the motor 242. It is also contemplated that, in other embodiments, another form of linear actuator may be utilized, such as an external linear actuator or a non-captive linear actuator, for example. While other forms are contemplated, the illustrated output shaft 244 includes a shoulder 245 and a threaded portion 246 extending beyond the shoulder 245 in the proximal direction.

The motor 242 is coupled to the motor support arm 214 such that the motor 242 has a fixed location relative to the mounting plate 210. While other forms of coupling are contemplated, in the illustrative embodiment, the housing 243 is externally threaded, and an internally threaded nut 247 is threaded onto the housing 243. Additionally, the housing 243 extends through the opening 215 in the motor support arm 214, and an internally threaded casing 248 is threaded onto the housing 243 such that the arm 214 is captured between the nut 247 and the casing 248.

The link plate 250 includes a body portion 252 that includes a longitudinally-extending mounting slot 253. The link plate 250 also includes an extension 256, which extends distally from the body portion 252 and defines a longitudinally-extending coupling slot 257. The link plate 250 is slidably coupled to the mounting plate 210 by one or more coupling members 280 extending through the mounting slot 253. In the illustrative embodiment, the bodies 284 of two coupling members 280 are received within the slot 253, such that the coupling members 280 restrict movement of the link plate 250 to the longitudinal path defined by the mounting slot 253. The link plate 250 is connected to the trigger 230 via the coupling slot 257. In the illustrative embodiment, a pin 206 is press fit into the opening 238 in the trigger 230 and extends into coupling slot 257 such that a lost motion connection 208 is defined between the link plate 250 and the trigger 230. In other embodiments, the lost motion connection 208 may be provided in another manner. For example, the press fit pin 206 may be replaced by a boss integrally formed with the trigger 230.

The link plate 250 also includes a tab 254, which extends laterally from the body portion 252 and is connected to the output shaft 244 of the driver 240. While other forms of connection are contemplated, in the illustrative embodiment, the shoulder 245 of the output shaft 244 abuts the distal side of the tab 254, and the threaded portion 246 extends through an opening 255 in the tab 254. Additionally, a nut 205 is screwed onto the threaded portion 246 such that the tab 254 is captured between the shoulder 245 and the nut 205. As a result, the link plate 250 is coupled to the output shaft 244 for longitudinal movement therewith, such that the driver 240 is operable to move the link plate 250 longitudinally among a plurality of positions. As noted above, the link plate 250 is confined to movement in the longitudinal direction by the coupling members 280 that extend through the mounting slot 253. The confinement of the link plate 250 to movement in the longitudinal direction may ensure that the output shaft 244 is not subjected to side-loading as the driver 240 moves the link plate 250 among the plurality of link plate positions.

The illustrated over-center spring mechanism 260 is provided in the form of an over-center spring 260, which is connected between the mounting plate 210 and the trigger 230. A first end of the spring 260 is engaged with the arm 216 to define a first anchor point 261 for the spring 260, and the opposite second end of the spring 260 is engaged with the trigger 230 at the attachment point 236 to define a second anchor point 263 for the spring 260. The first anchor point 261 has a fixed location relative to the mounting plate 210, and may therefore also be referred to as the fixed anchor point 261. Additionally, the second anchor point 263 is movable relative to the mounting plate 210, and may therefore alternatively be referred to as the movable anchor point 263.

Figure 8A:
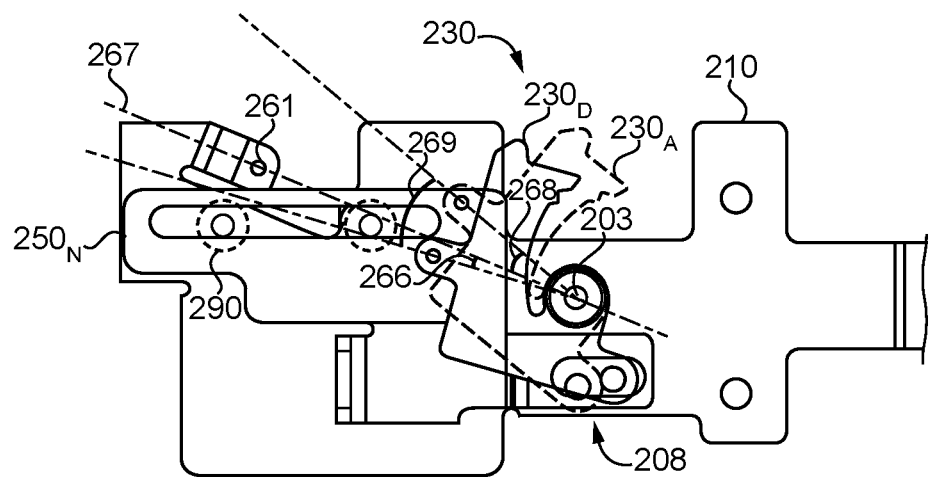
FIGS. 8A-8C illustrate a portion of the dogging mechanism of FIG. 6 with a link plate in various positions, including a neutral position (FIG. 8A), an actuating position (FIG. 8B), and a deactuating position (FIG. 8C)
Figure 8B:
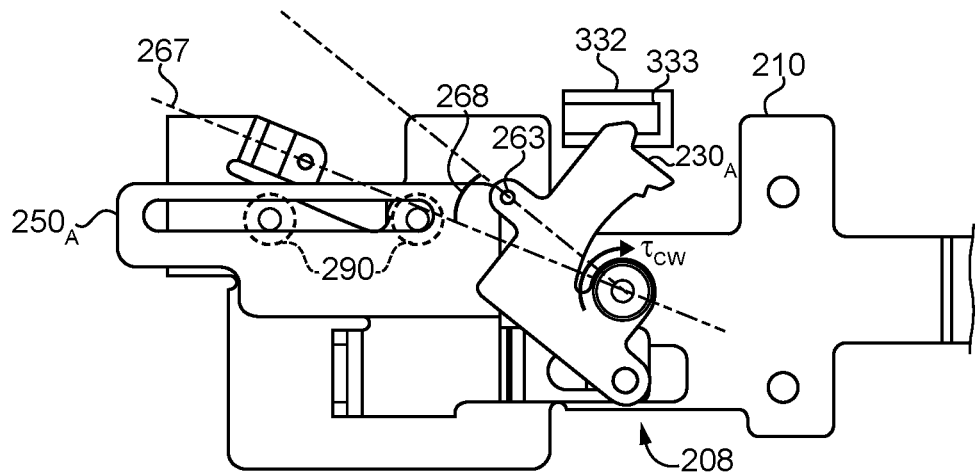
Figure 8C:
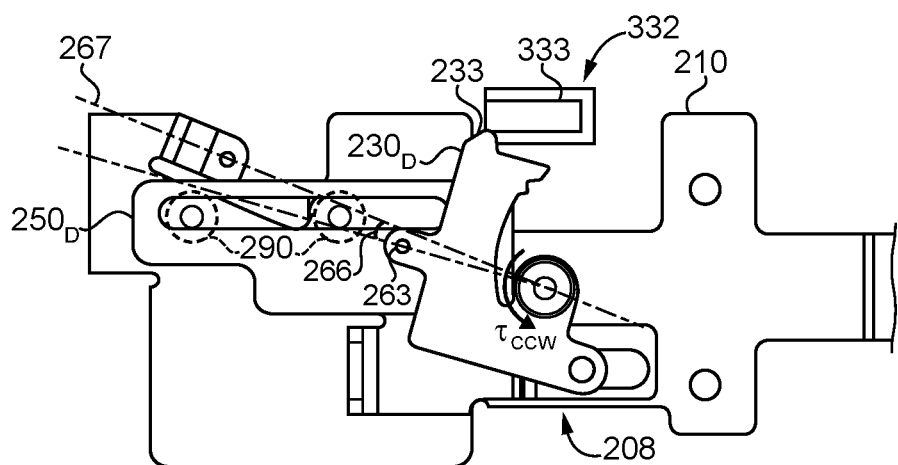

With additional reference to FIGS. 8A-8C, the over-center spring 260 is configured to selectively bias the trigger 230 in each of two opposite rotational directions. The direction in which the over-center spring 260 biases the trigger 230 is dependent upon the position of the movable anchor point 263 relative to a boundary plane 267, which extends along the trigger pivot axis 203 and includes the fixed anchor point 261.

As illustrated in FIG. 8A, the trigger 230 is pivotable through a total pivot range 269, which extends between a releasing or deactuated trigger position $230_D$ and a holding or actuated trigger position $230_A$. The total pivot range 269 includes a deactuated range 266, which spans from the deactuated trigger position $230_D$ to an angular position at which the movable anchor point 263 is located on the boundary plane 267. The total pivot range 269 also includes an actuated range 266, which spans from the actuated position $230_A$ to the angular position at which the movable anchor point 263 is located on the boundary plane 267. Thus, as the movable anchor point 263 crosses the boundary plane 267, the trigger 230 transitions between the deactuated range 266 and the actuated range 268.

As described above, the trigger 230 selectively activates the dogging status sensor 332 as the trigger 230 moves through the pivot range 269. While other forms of sensor may be utilized, the illustrated dogging sensor is a switch 332 including a leaf spring or spring arm 333 operable to transition the switch 332 between first and second states. More specifically, the switch 332 has a default state when the spring arm 333 is in a home position, and transitions to a non-default state when the spring arm 333 is moved to a depressed position. The switch 332 is mounted to the mounting plate 210 adjacent the trigger 230, and the spring arm 333 extends into the path along which a protrusion 233 on the trigger 230 travels as the trigger 230 pivots. As a result, the spring arm 333 is depressed when engaged by the protrusion 233, and returns to the home position when disengaged from the protrusion 233.

FIG. 8B illustrates the dogging mechanism 200 in the actuated state, which corresponds to the dogging state of the dogging assembly 150. In this state, the trigger 230 is in the actuated range 266, and the moving anchor point 263 is positioned on a first side of the boundary plane 267. As a result, the biasing force of the spring 260 generates a clockwise torque $\tau_{CW}$ urging the trigger 230 toward the actuated trigger position $230_A$. Additionally, the protrusion 233 is engaged with the leaf spring 333, thereby setting the dogging status switch 332 to the non-default state. Thus, the non-default state of the dogging status switch 332 may indicate that the trigger 230 is in the actuated range 268, thereby indicating that the dogging mechanism 200 is in the actuated state.

FIG. 8C illustrates the dogging mechanism 200 in the deactuated state, which corresponds to the non-dogging state of the dogging assembly 150. In this state, the trigger 230 is in the deactuated range 266, and the moving anchor point 263 is positioned on a second side of the boundary plane 267. As a result, the biasing force of the spring 260 generates a counter-clockwise torque $\tau_{CCW}$ urging the trigger 230 toward the deactuated trigger position $230_D$. Additionally, the protrusion 233 is disengaged from the leaf spring 333, thereby setting the dogging status switch 332 to the default state. Thus, the default state of the dogging status switch 332 may indicate that the trigger 230 is in the deactuated range 266, thereby indicating that the dogging mechanism 200 is in the deactuated state.

In light of the foregoing, it should be appreciated that the illustrative over-center spring mechanism 260 is operable to selectively bias the trigger 230 in each of two opposite rotational directions based upon the position of the moving anchor point 263 relative to the boundary plane 267. More specifically, when the trigger 230 is in the actuated range 268 (FIG. 8B), the moving anchor point 263 is positioned on a first side of the boundary plane 267, and the biasing force of the spring 260 generates a clockwise torque $\tau_{CW}$ urging the trigger 230 toward the actuated trigger position $230_A$. By contrast, when the trigger 230 is in the deactuated range 266 (FIG. 8C), the moving anchor point 263 is positioned on a second side of the boundary plane 267, and the biasing force of the spring 260 generates a counter-clockwise torque $\tau_{CCW}$ urging the trigger 230 toward the deactuated trigger position $230_D$. Thus, as the moving anchor point 263 crosses the boundary plane 267, the direction of the biasing torque imparted to the trigger 230 by the spring 260 changes directions. Stated another way, the over-center spring 260 is configured to selectively bias the trigger 230 toward each of the deactuated trigger position $230_D$ and the actuated trigger position $230_A$.

The angular position of the trigger 230, and thus the direction in which the trigger 230 is biased, depends upon the actuated or deactuated state of the dogging mechanism 200. More specifically, the trigger 230 is located in the deactuated range 266 when the dogging mechanism 200 is in the deactuated state, and is located in the actuated range 268 when the dogging mechanism 200 is in the actuated state. Thus, the trigger 230 is biased toward the deactuated trigger position $230_D$ when the dogging mechanism 200 is in the deactuated state, and is biased toward the actuated trigger position $230_A$ when the dogging mechanism 200 is in the actuated state. Additionally, due to the fact that the state of the dogging status switch 332 corresponds to the position of the trigger 230, the actuated/deactuated state of the dogging mechanism 200 may be inferred from the state of the switch 332.

As noted above, the dogging mechanism 200 is capable of being manually adjusted between the actuated and deactuated states. Manual control of the dogging mechanism 200 involves manually moving the trigger 230 between the deactuated range 266 and the actuated range 268 using the manual dogging actuator 152. The actuator 152 is connected to the trigger 230 at an attachment point 157, which may be offset from the trigger pivot axis 203. Thus, the trigger 230 can be pivoted between the deactuated range 266 and the actuated range 268 by exerting a corresponding force on the trigger 230 at the attachment point 157.

In embodiments in which the actuator 152 is provided in the form of a hex key bar 158, one end of the bar 158 may be engaged with the attachment point 157, for example via a pin. The other end of the bar 158 may include an opening aligned with the trigger pivot axis 203, such that an appropriate tool may be utilized to rotate the bar 158, thereby causing a corresponding rotation or pivoting of the trigger 230. In the illustrative embodiment, the bar 158 has a hexagonal opening structured to receive a hex key or Allen wrench. It is also contemplated that the opening may be provided with a different geometry, such as a cross-shaped geometry configured to receive the tip of a Phillips head screwdriver.

In embodiments in which the actuator 152 is provided in the form of a lock cylinder 154, a cam 156 attached to the plug of the lock cylinder 154 may be engaged with the attachment point 157. When a proper key 155 is inserted and the plug is rotated, rotation of the plug causes a corresponding rotation of the trigger 230. While two exemplary forms of the manual dogging actuator 152 have been illustrated, it is to be understood that other forms of manual actuators may be utilized to move the trigger 230 between the actuated and deactuated positions.

As described herein, the illustrative dogging mechanism 200 is also capable of being electronically adjusted between the actuated and deactuated states. In the illustrative embodiment, electronic control of the dogging mechanism 200 involves electronically actuating the driver 240 to move the trigger 230 between the deactuated range 266 and the actuated range 268. Further details regarding electronic actuation of the dogging mechanism 200 will now be provided with reference to FIGS. 8A-8C, which illustrate various positions of the trigger 230 and link plate 250 relative to the mounting plate 210 during electronic control of the dogging mechanism 200. In the interest of clarity, certain features of the mounting plate 210, such as the front plate 212, have been omitted from FIGS. 8A-8C.

FIG. 8A illustrates the link plate 250 in a neutral position $250_N$ relative to the mounting plate 210. As noted above, the link plate 250 is connected to the trigger 230 via the lost motion connection 208 provided by the pin 206 and coupling slot 257. As a result of this lost motion connection 208, when the link plate 250 is in the neutral position $250_N$, the trigger 230 is capable of pivoting between the deactuated position $230_D$ and the actuated position $230_A$ under control of the manual dogging actuator 152. Thus, as the position of the trigger 230 is manually adjusted, the pin 206 travels along the coupling slot 257, such that the link plate 250 does not interfere with the manual control of the dogging mechanism 200. When in the neutral position $250_N$, the link plate 250 is capable of being moved to each of a retracted or distal actuating position $250_A$ (FIG. 8B) and an extended or proximal deactuating position $250_D$ (FIG. 8C) by the driver 240.

During electronic actuation of the dogging mechanism 200, the driver 240 may first be operated in the retracting mode, thereby causing the link plate 250 to move distally from the neutral position $250_N$ (FIG. 8A) to the actuating position $250_A$ (FIG. 8B). As the link plate 250 moves distally, the proximal edge of the coupling slot 257 engages the pin 206, thereby urging the trigger 230 in the clockwise direction toward the actuated range 268. When the trigger 230 enters the actuated range 268, the spring 260 urges the trigger 230 toward the actuated position $230_A$. The driver 240 may then be operated in the extending mode to cause the link plate 250 to return to the neutral position $250_N$, while the lost motion connection 208 allows the trigger 230 to remain in the actuated range 268.

During electronic deactuation of the dogging mechanism 200, the driver 240 may first be operated in the extending mode, thereby causing the link plate 250 to move proximally from the neutral position $250_N$ (FIG. 8A) to the deactuating position $250_D$ (FIG. 8C). As the link plate 250 moves proximally, the distal edge of the coupling slot 257 engages the pin 206, thereby urging the trigger 230 in the counterclockwise direction toward the deactuated range 266. When the trigger 230 enters the deactuated range 266, the spring 260 urges the trigger 230 toward the deactuated trigger position $230_D$. The driver 240 may then be driven in the retracting mode to cause the link plate 250 to return to the neutral position $250_N$, while the lost motion connection 208 allows the trigger 230 to remain in the deactuated range 266.

Figure 9:
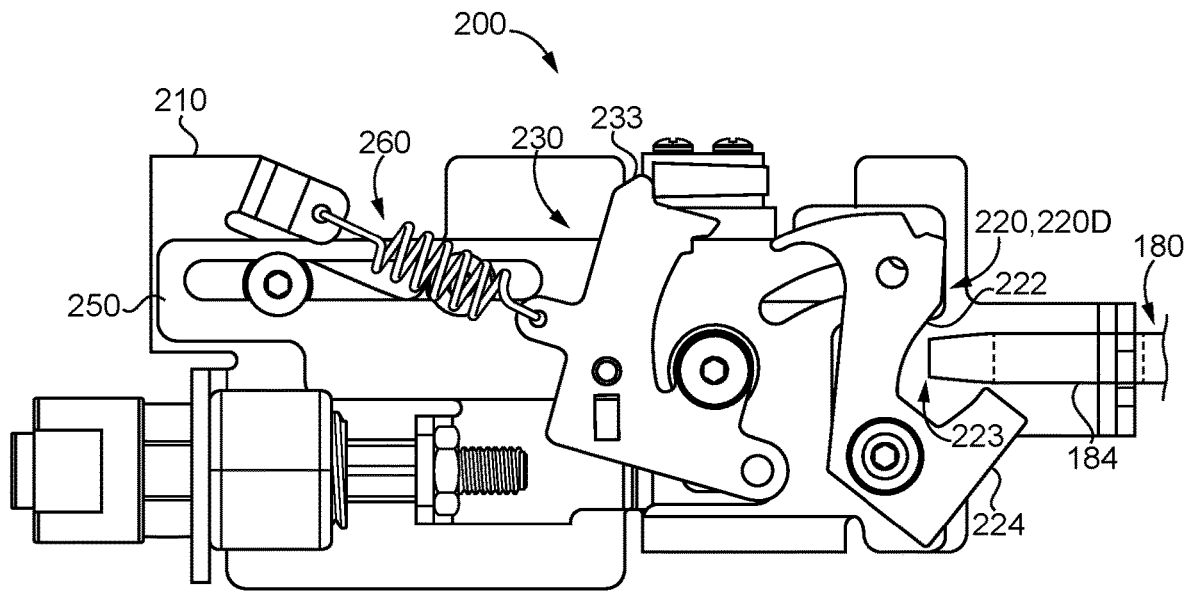
FIG. 9 illustrates the dogging mechanism of FIG. 6 in a first operational state corresponding with an undogged, latch extended condition of the exit device.
Figure 10:
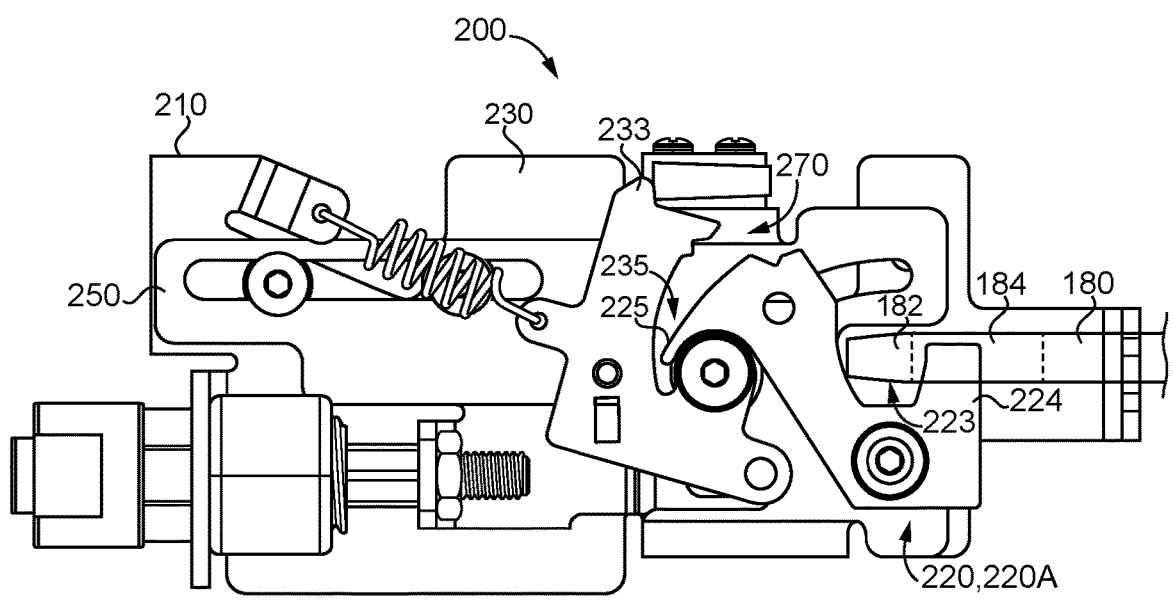
FIG. 10 illustrates the dogging mechanism of FIG. 6 in a second operational state corresponding with an undogged, latch retracted condition of the exit device.
Figure 11:
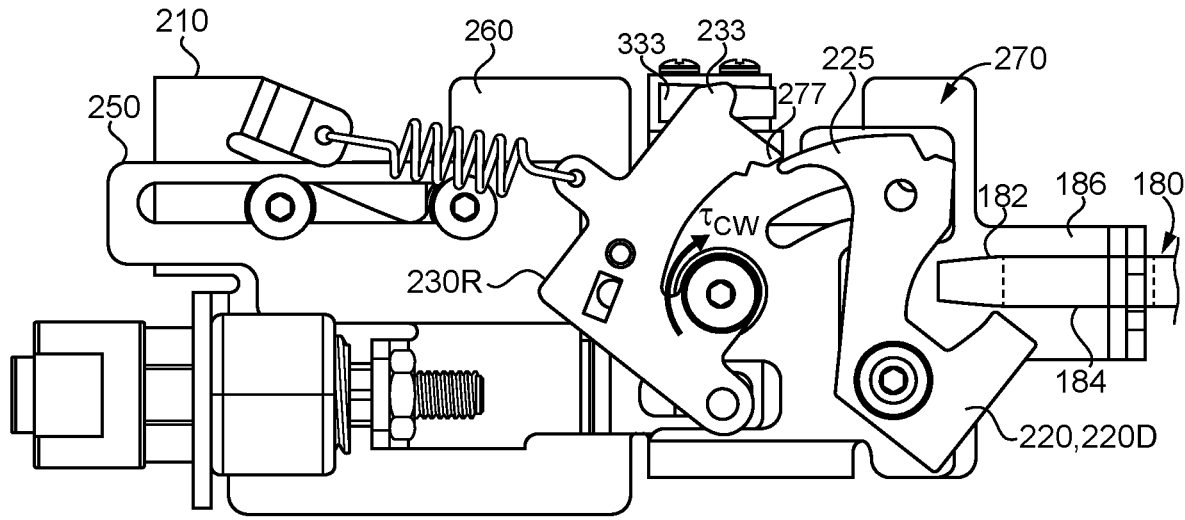
FIG. 11 illustrates the dogging mechanism of FIG. 6 in a third operational state corresponding with a dog-on-next-exit condition of the exit device.
Figure 12:
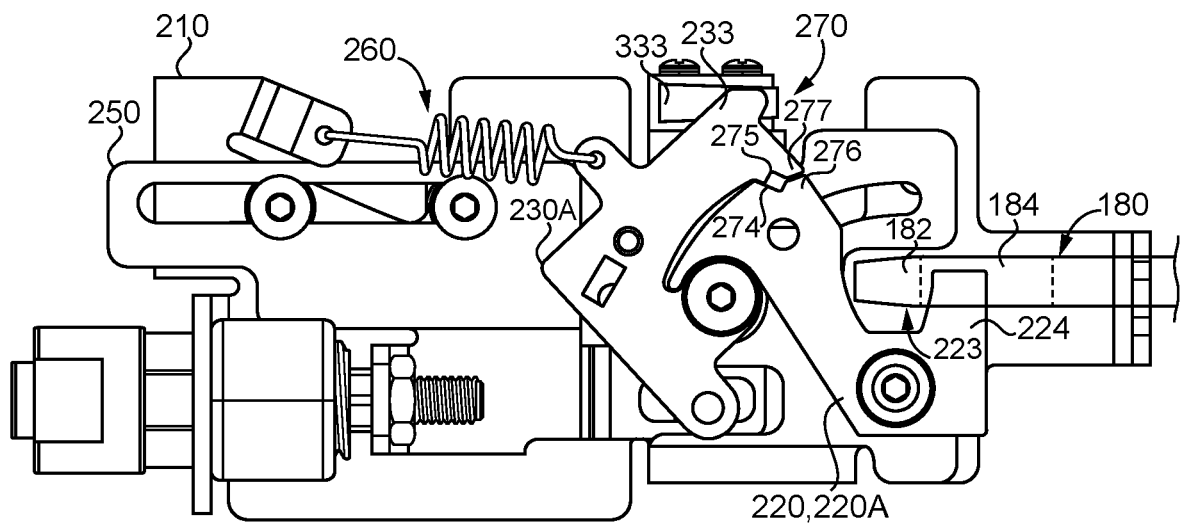
FIG. 12 illustrates the dogging mechanism of FIG. 6 in a fourth operational state corresponding with a dogged condition of the exit device.

FIGS. 9-12 illustrate the dogging mechanism 200 in various operational states. More specifically, FIGS. 9 and 10 illustrate operational states with the dogging mechanism 200 in the deactuated state, and FIGS. 11 and 12 illustrate operational states with the dogging mechanism 200 in the actuated state. Additionally, FIGS. 9 and 11 correspond to the deactuated state of the drive assembly 120, and FIGS. 10 and 12 correspond to the actuated state of the drive assembly 120. Each operational state illustrated in FIGS. 9-12 corresponds to a given condition of the exit device 100. More specifically, the first and second operational states illustrated in FIGS. 9 and 10 correspond to the undogged condition, the third operational state illustrated in FIG. 11 corresponds to the ready to dog or dog on next exit condition, and the fourth operational state illustrated in FIG. 12 corresponds to the dogged condition.

FIGS. 9 and 10 illustrate the dogging mechanism 200 in first and second operational states corresponding to the undogged condition of the exit device 100. With the exit device 100 in the undogged condition, the dogging mechanism 200 is in the deactuated state, the trigger 230 is in the deactuated trigger position $230_D$, and the drive assembly 120 is free to transition between the actuated and deactuated states thereof. The first operational state (FIG. 9) corresponds to the undogged condition with the drive assembly 120 in the deactuated state, and may alternatively be referred to as the undogged, latch extended state. The second operational state (FIG. 10) corresponds to the undogged condition with the drive assembly 120 in the actuated state, and may alternatively be referred to as the undogged, latch retracted state.

In the first operational state (FIG. 9), each of the drive assembly 120 and the dogging mechanism 200 is in the deactuated state thereof, the hook 220 is in the deactuated hook position $220_D$, and the trigger 230 is in the deactuated trigger position $230_D$. With the drive assembly 120 in the deactuated state, the distal end of the drive assembly 120 is positioned in close proximity to the hook 220. The dogging mechanism 200 may be transitioned to the second operational state by depressing the pushbar 132, thereby actuating the drive assembly 120. As the drive assembly 120 is actuated, the link bar 180 moves distally (to the left in FIG. 9), and the distal end of the link bar 180 engages the arm 222 of the hook 220. As the link bar 180 continues to retract, the hook 220 pivots toward the actuated hook position $220_A$, and the finger 224 enters the slot 184.

When the drive assembly 120 reaches the actuated state, the dogging mechanism 200 is in the second operational state (FIG. 10). In this operational state, the hook 220 is in the actuated hook position $220_A$, the distal end of the link bar 180 is received in the recess 223, and the finger 224 is received in the slot 184. When the pushbar 132 is released, the main spring 126 urges the drive assembly 120 toward the deactuated state. As a result, the link bar 180 moves in the proximal direction (to the right in FIG. 10), and the distal wall 182 engages the finger 224, thereby urging the hook 220 toward the deactuated hook position $220_D$. Due to the fact that the trigger 230 is in the releasing or deactuated trigger position $230_D$, the hook 220 is free to return to the deactuated hook position $220_D$. Thus, with the exit device 100 in the undogged condition, the drive assembly 120 is free to transition between the actuated state and the deactuated state.

In the illustrative embodiment, the link bar 180 moves longitudinally as the drive assembly 120 transitions between the deactuated and actuated states. Accordingly, the hook 220 is configured to move between the actuated hook position $220_A$ and the deactuated hook position $220_D$ in response to such longitudinal movement of the link bar 180. It is also contemplated that the link bar 180 may move in another manner as the drive assembly 120 transitions states, and that such alternative movement may move the hook 220 between the actuated and deactuated hook positions. For example, the hook 220 may engage a second hook that pivots or rotates as the drive assembly 120 moves between the actuated and unactuated states.

FIG. 11 illustrates the dogging mechanism 200 in a third operational state, which may alternatively be referred to as the ready state. The dogging mechanism 200 may be transitioned from the first operational state (FIG. 9) to the third operational state (FIG. 11) by moving the trigger 230 from the deactuated range 266 to the actuated range 268, thereby actuating the dogging mechanism 200. When the trigger 230 enters the actuated range 268, the spring 260 urges the trigger 230 toward the actuated position $230_A$, and the protrusion 233 engages the spring arm 333, thereby causing the switch 332 to transition to the non-default state. As the trigger 230 pivots toward the actuated position $230_A$, the trigger 230 reaches the ready position $230_R$, in which the plateau 277 of the trigger 230 is engaged with the hook extension 225. As a result, the hook 220 maintains the trigger 230 in the ready position 230$_R$ against the biasing force of the over-center spring 260.

The dogging mechanism 200 may be transitioned from the third operational state (FIG. 11) to the fourth operational state (FIG. 12) by depressing the pushbar 132, thereby actuating the drive assembly 120. As the drive assembly 120 is actuated, the link bar 180 urges the hook 220 toward the actuated hook position 220$_A$ in the manner described above. As the hook 220 pivots toward the actuated position 220$_A$, the plateau 277 of the trigger 230 travels along the arcuate portion 272 of the outer engagement surface 227 of the hook 220. When the hook 220 reaches the actuated position 220$_A$, the spring 260 urges the trigger 230 to the holding or actuated trigger position 230$_A$, thereby setting the dogging mechanism 200 to the fourth operational state.

Figure 13:
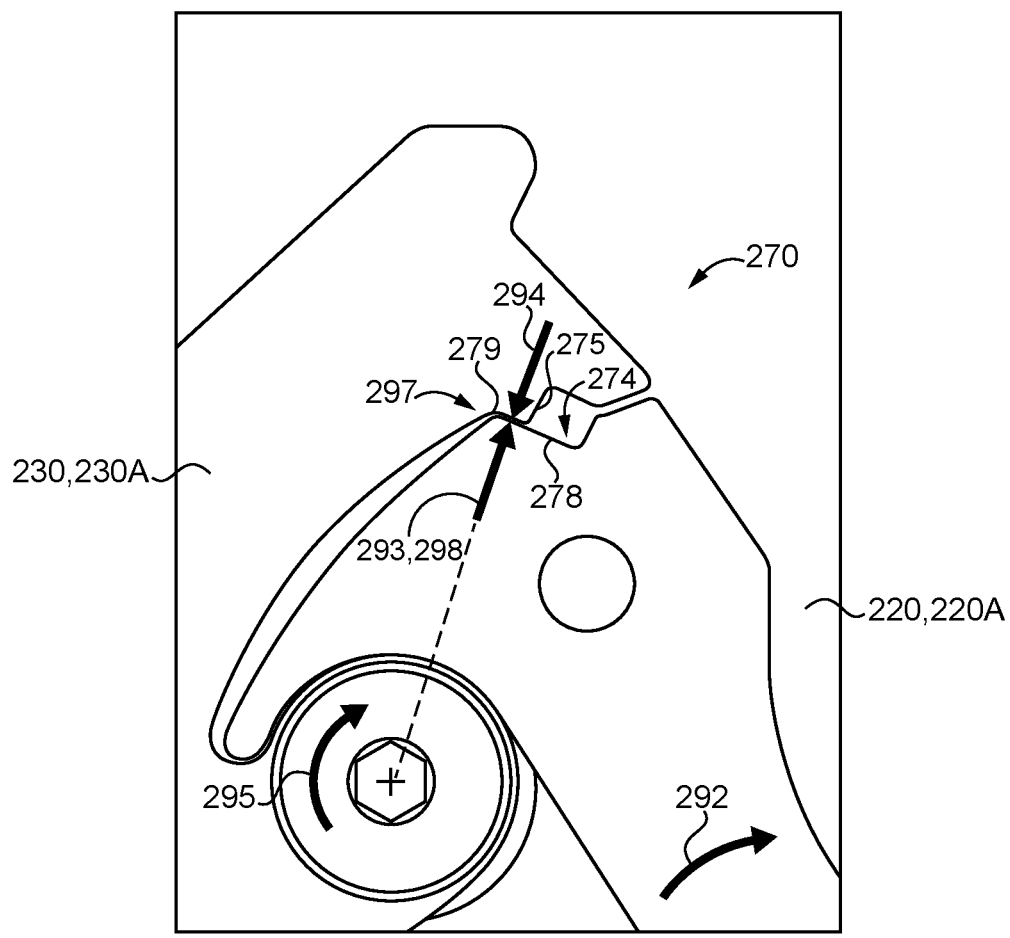
FIG. 13 is an enlarged view of a portion of the dogging mechanism of FIG. 6 in the fourth operational state shown in FIG. 12.

FIGS. 12 and 13 illustrate the dogging mechanism 200 in the fourth operational state, which may alternatively be referred to as the dogged state. In the dogged state, the hook 220 is in the actuated hook position 220$_A$ and the trigger 230 is in the actuated trigger position 230$_A$. As a result, the engagement mechanism 270 is in an engaged state, in which the contact surfaces 227, 237 of the hook 220 and the trigger 230 are in contact with one another. More specifically, the first engagement surface 278 defined by the notch 274 is engaged with the second engagement surface 279 defined by the protrusion 275, and the plateaus 276, 277 may be in contact with one another.

When the dogging mechanism 200 is in the dogged state and the pushbar 132 is released, the drive assembly 120 urges the link bar 180 in the proximal direction. As a result, the link bar 180 exerts a torque 292 on the hook 220, and the torque 292 urges the hook 220 toward the deactuated hook position 220$_D$. However, the trigger 230 counteracts this torque 292 and retains the hook 220 in the actuated hook position 220$_A$. More specifically, the torque 292 on the hook 220 causes the hook engagement surface 278 to exert a force 293 on the trigger engagement surface 279 in a direction 298 normal to the engagement surfaces 278, 279 at the contact point 297, and the trigger 230 exerts an equal and opposite second force 294 on the hook engagement surface 278.

In the illustrative embodiment, the engagement surfaces 278, 279 are structured such that when the engagement mechanism 270 is in the engaged state, the direction 298 normal to the engagement surfaces 278, 279 is a radial direction extending from the trigger pivot axis 203 to the point of contact 297 between the engagement surfaces 278, 279. As a result, the force 293 is applied to the trigger 230 with a moment arm of negligible length, and the resultant torque 295 on the trigger 230 is therefore substantially zero. Due to the fact that the torque 292 on the hook 220 is mechanically counteracted by the trigger 230, the driver 240 need not be activated to retain the trigger 230 in the actuated position 230$_A$. Thus, the dogging mechanism 200 may retain the drive assembly 120 in the actuated state indefinitely without requiring the application of electrical power to the driver 240.

In order to allow the drive assembly 120 to move to the deactuated state, the trigger 230 may be pivoted away from the holding or actuated position 230$_A$ and toward the releasing or deactuated position 230$_D$. It should be appreciated that in order to move the trigger 230 to the deactuated range 266, one must overcome the net torque urging the trigger 230 in the clockwise direction. This net torque includes the clockwise torque $\tau_{CW}$ exerted by the over-center spring 260, the resultant torque 295, and the torque resulting from frictional forces between the engagement surfaces 278, 279. With the torque 295 on the trigger 230 substantially equal to zero, the amount of force that must be exerted on the trigger 230, whether by the manual actuator 152 or the driver 240, may be reduced. Such a reduction in the force requirements may result in a corresponding reduction in the amount of power supplied to the driver 240 when adjusting the state of the dogging mechanism 200 electronically.

As the trigger 230 pivots away from the actuated holding position 230$_A$, the engagement surfaces 278, 279 disengage from one another, thereby transitioning the engagement mechanism 270 to a disengaged state. As a result, the hook 220 is permitted to pivot toward the deactuated hook position 220$_D$, thereby enabling the drive assembly 120 to transition to the deactuated state. As the trigger 230 pivots toward the releasing deactuated position 230$_D$, the protrusion 233 disengages from the spring arm 333, and the switch 332 returns to the default state.

As is evident from the foregoing, the illustrative engagement mechanism 270 may be configured such that when the dogging mechanism 200 is in the dogged state, the resultant torque 295 on the trigger 230 is substantially zero. The term "substantially" as used herein may be applied to modify a quantitative representation which could permissibly vary without resulting in a change in the basic function to which it is related. For example, the substantially zero value of the resultant torque 295 is described hereinabove as enabling the engagement mechanism 270 to retain the trigger 230 in the actuated position 230$_A$ against the torque 292 on the hook 220 while permitting the trigger 230 to move to the deactuated position 230$_D$ when acted upon by the driver 240. However, the resultant torque 295 may permissibly be slightly greater than zero if these capabilities of the engagement mechanism 270 are not materially altered.

As will be appreciated, if the dogging mechanism 200 is actuated when the drive assembly 120 is in the actuated state, the dogging mechanism 200 may transition directly from the second operational state (undogged, latch extended) to the fourth operational state (dogged). With the dogging mechanism 200 in the second operational state, the inner surface of the hook extension 225 may be in contact with the outer surface of the trigger body portion 231. Due to the conforming arcuate geometries of these surfaces, the hook 220 does not impede rotation of the trigger 230. Accordingly, the trigger 230 may pivot from the deactuated trigger position 230$_D$ to the actuated trigger position 230$_A$ without being impeded by the hook 220.

In the illustrated embodiment, the lost motion connection 208 enables the dogging mechanism 200 to be independently adjusted manually (via the manual dogging actuator 152) and electronically (via the dogging control assembly 300). More specifically, the lost motion connection 208 enables the trigger 230 to pivot between the deactuated range 266 and the actuated range 268 under control of the manual dogging actuator 152 when the link plate 250 is in the neutral position 250$_N$. As such, each of the manual dogging actuator 152 and the electronic dogging actuator 300 is capable of moving the dogging mechanism 200 between the dogging and undogging states regardless of which actuator set the dogging mechanism 200 to its current state. For example, if the dogging mechanism 200 has been set to the dogging state by the manual dogging actuator 152, the dogging control assembly 300 is nonetheless capable of moving the dogging mechanism 200 to the undogging state. As described herein, this feature may facilitate undogging of the exit device 100 from a remote location, such as an access management system in communication with the exit device 20.

Additionally, the illustrated manual dogging actuator 152 is mechanically linked to the trigger 230 and is operable to mechanically drive the trigger 230 between the actuated range 268 and the deactuated range 266 as the manual dogging actuator 152 moves between an actuated position and a deactuated position. In other embodiments, the manual dogging actuator 152 may be mechanically decoupled from the trigger 230 such that the manual actuator 152 is inoperable to mechanically drive the trigger 230 between the actuated range 268 and the deactuated range 266. By way of example, a manual dogging sensor may be associated with the manual dogging actuator 152 and in communication with the driver 240. Such a manual dogging sensor may be operable to sense the actuated and deactuated positions of the manual actuator 152, and to operate the driver 240 in response to the manual actuator 152 transitioning between the actuated and deactuated positions.

For example, when the manual dogging sensor indicates that the manual actuator 152 has moved from the actuated position to the deactuated position, the driver 240 may be operated to move the link plate 250 to the deactuating position $250_D$. Conversely, when the manual dogging sensor indicates that the manual actuator 152 has moved from the deactuated position to the actuated position, the driver 240 may be operated to move the link plate 250 to the actuating position $250_A$. In such forms, the lost motion connection 208 may provide a shorter range of lost motion between the link plate 250 and the trigger 230, such as a range sufficient to merely enable the trigger 230 to move between the ready position $230_R$ and the actuated position $230_A$ when the link plate 250 is in the actuating position $250_A$. In such embodiments, the link plate 250 may not necessarily have a neutral position $250_N$, and the driver 240 may simply move the link plate 250 between the actuating position $250_A$ and the deactuating position $250_D$.

Figure 14:
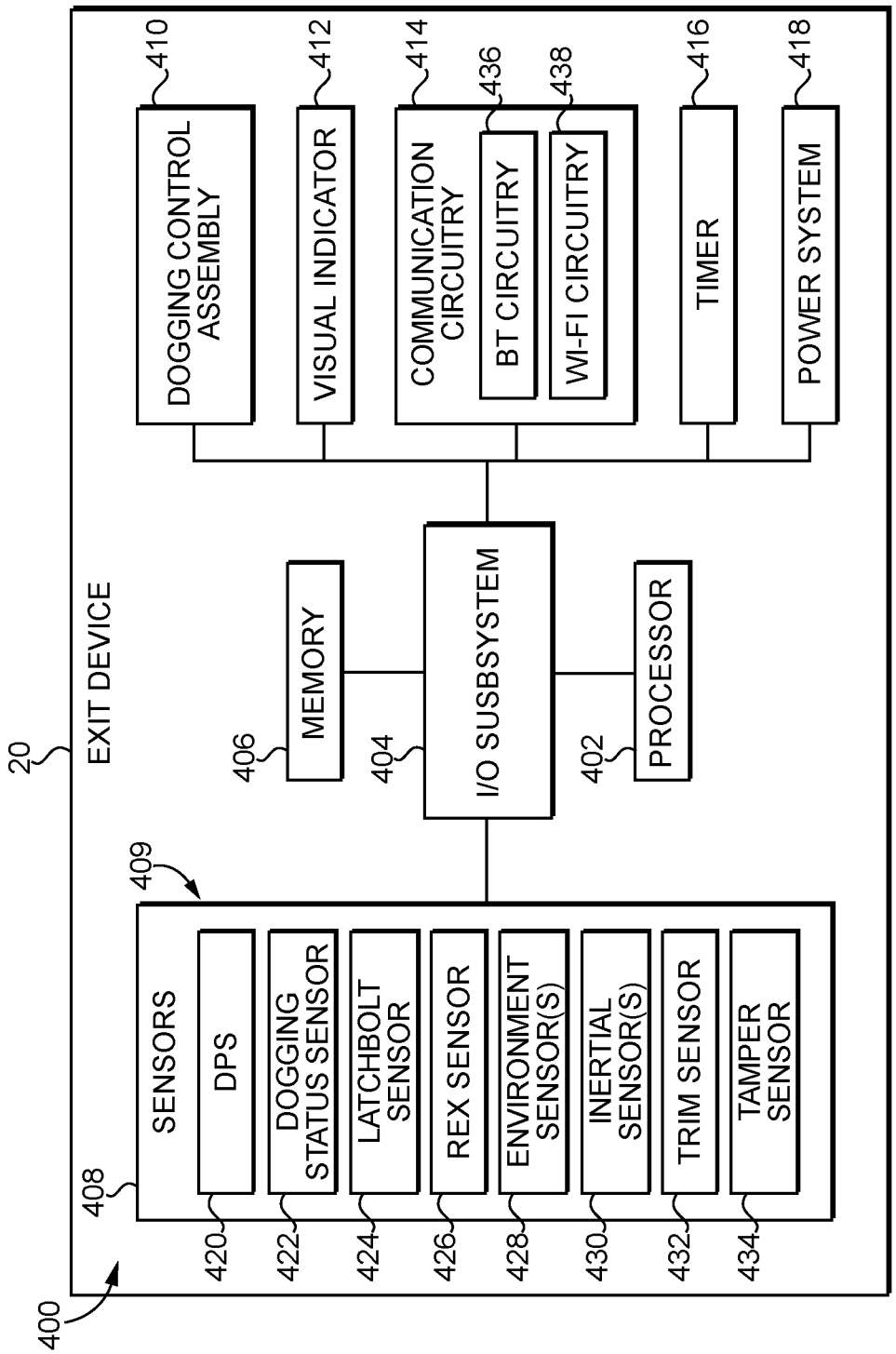
FIG. 14 is a simplified block diagram of at least one embodiment of a control system of the exit device of FIGS. 1-2.

Referring now to FIG. 14, a simplified block diagram of at least one embodiment of a control system 400 of the exit device 20 is shown. The illustrative control system 400 includes a processor 402, an input/output ("I/O") subsystem 404, a memory 406, sensors 408, a dogging control assembly 410, a visual indicator 412, communication circuitry 414, a timer 416, and a power system 418. It should be appreciated that one or more of the components of the control system 400 described herein may be embodied as, or form a portion of, one or more embedded controllers and/or integrated circuits of the exit device 20. Further, depending on the particular embodiment, the components of the control system 400 may be closely positioned to one another or distributed throughout the exit device 20 (i.e., separated from one another).

The processor 402 may be embodied as any type of processor(s) capable of performing the functions described herein. In particular, the processor 402 may be embodied as one or more single or multi-core processors, microcontrollers, or other processor or processing/controlling circuits. For example, in some embodiments, the processor 402 may include or be embodied as an arithmetic logic unit (ALU), central processing unit (CPU), digital signal processor (DSP), and/or another suitable processor(s). The processor 402 may be a programmable type, a dedicated hardwired state machine, or a combination thereof. Processors 402 with multiple processing units may utilize distributed, pipelined, and/or parallel processing in various embodiments. Further, the processor 402 may be dedicated to performance of just the operations described herein, or may be utilized in one or more additional applications. In the illustrative embodiment, the processor 402 is of a programmable variety that executes algorithms and/or processes data in accordance with operating logic as defined by programming instructions (such as software or firmware) stored in the memory 406. Additionally or alternatively, the operating logic for the processor 402 may be at least partially defined by hardwired logic or other hardware. Further, the processor 402 may include one or more components of any type suitable to process the signals received from input/output devices or from other components or devices and to provide desired output signals. Such components may include digital circuitry, analog circuitry, or a combination thereof.

The memory 406 may be of one or more types of non-transitory computer-readable media, such as a solid-state memory, electromagnetic memory, optical memory, or a combination thereof. Furthermore, the memory 406 may be volatile and/or nonvolatile and, in some embodiments, some or all of the memory 406 may be of a portable variety, such as a disk, tape, memory stick, cartridge, and/or other suitable portable memory. In operation, the memory 506 may store various data and software used during operation of the exit device 20 such as operating systems (e.g., real-time operating systems (RTOS)), applications, programs, libraries, and drivers. The memory 406 is communicatively coupled to the processor 402 via the I/O subsystem 404, which may be embodied as circuitry and/or components to facilitate input/output operations with the processor 402, the memory 406, and other components of the exit device 20. For example, the I/O subsystem 404 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. Depending on the particular embodiment, the memory 406 may be included with the processor 402 and/or coupled to the processor 402 depending on the particular embodiment. For example, in some embodiments, the processor 402, the I/O subsystem 404, the memory 406, and/or other components of the control system 400 may form a portion of a system-on-a-chip (SoC) and be incorporated on a single integrated circuit chip.

The sensors 408 are configured to generate sensor data based on, for example, an environment of the exit device 20. By way of example, the sensors 408 may detect various characteristics of the physical environment of the exit device 20 (internal and/or external to the exit device 20), electrical characteristics of the exit device 20, electromagnetic characteristics of the exit device 20 or its surroundings, and/or other suitable characteristics. Data from the sensors 408 may be used by the exit device 20 or, more particularly, the processor 402 to interpret the security and operation states of the exit device 20. For example, data from the sensors 408 may be used to determine the occurrence of a door prop condition, the occurrence of a forced door condition, whether the exit device 20 or a component thereof is in a secure/unsecure state, and/or whether the exit device 20 is in a dogged/undogged condition.

As shown in FIG. 14, the sensors 408 are in communication with the processor 402 via the I/O subsystem 404, and may be considered to define or be included in a sensor system 409. The illustrative sensors 408 include a door position sensor (DPS) 420, a dogging status sensor 422, a latchbolt sensor 424, a request-to-exit (REX) sensor 426, one or more environment sensors 428, one or more inertial sensors 430, a trim sensor 432, and a tamper sensor 434. However, it should be appreciated that, in various embodiments, one or more of the sensors 408 may be omitted from a particular exit device 20 or sensor system 409, and/or one or more additional sensors not described herein may be included in the exit device 20 and/or the sensor system 409. Further, in some embodiments, it should be appreciated that the sensors 408 may include multiple door position sensors 420, dogging status sensors 422, latchbolt sensors 424, REX sensors 426, trim sensors 432, and/or tamper sensors 434.

The illustrative door position sensor 420 is configured to generate sensor data (e.g., by virtue of one or more signals) associated with a door position status, which may be interpreted by the processor 402 to determine whether the door is in a closed position or an open position. In various embodiments, the door position sensor 420 may be embodied as, or otherwise include, a magnetometer, reed switch, physical switch, and/or other mechanism(s) suitable for determining whether the door is open/closed.

The dogging status sensor 422 is configured to generate sensor data (e.g., by virtue of one or more signals) associated with a dogging status, which may be interpreted by the processor 402 to determine whether the dogging mechanism is positioned to hold the pushbar 132 in the retracted position. More specifically, the dogging status sensor 422 may more directly correspond with a particular state/position of one or more components of the dogging mechanism, which by virtue of its linkage with the pushbar 132, may be indicative of whether the dogging mechanism is positioned to hold the pushbar 132 in the retracted position. In some embodiments, the dogging status sensor 422 may be embodied as, or otherwise include, a physical switch, an inductive sense mechanism, and/or other mechanism(s) suitable for determining the state of the dogging mechanism. By way of example, in some embodiments, the dogging status sensor 422 may be embodied as the dogging status switch 332 described with reference to the sensor assembly 330.

The latchbolt sensor 424 is configured to generate sensor data (e.g., by virtue of one or more signals) associated with a latchbolt status, which may be interpreted by the processor 402 to determine whether the latchbolt 142 is in an extended position or a retracted position. In various embodiments, the latchbolt sensor 424 may be embodied as, or otherwise include, an inductive sense mechanism, reed switch, physical switch, communication with an electric trim product, and/or other mechanism(s) suitable for determining whether the latchbolt 142 is extended or retracted.

The request-to-exit sensor 426 is configured to generate sensor data (e.g., by virtue of one or more signals) associated with a REX status, which may be interpreted by the processor 402 to determine whether the pushbar 132 is depressed/retracted or extended. In some embodiments, the request-to-exit sensor 426 may be embodied as, or otherwise include, an inductive sense mechanism, physical switch, reed switch, capacitive sense mechanism, and/or other mechanism(s) suitable for determining whether the pushbar 132 has been depressed.

The one or more environment sensors 428 are configured to generate sensor data (e.g., by virtue of one or more signals), which may be interpreted by the processor 402 to determine one or more corresponding internal or external environmental characteristics of the exit device 20. For example, the environment sensors 428 may include a temperature sensor configured to determine one or more internal temperatures of the exit device 20 and/or the temperature of the external physical environment of the exit device 20. In such embodiments, the temperature sensor may be embodied as, or otherwise include, a temperature dependent resistor. Further, in some embodiments, the environment sensors 428 may include a light sensor configured to sense an amount of light in the physical environment of the exit device 20. In such embodiments, the light sensor may be embodied as, or otherwise include, a photo-diode or other suitable light-sensing mechanism. In other embodiments, the environment sensors 428 may include additional or alternative sensors to determine other environmental characteristics of the exit device 20.

The one or more inertial sensors 430 are configured to generate sensor data (e.g., by virtue of one or more signals), which may be interpreted by the processor 402 to determine one or more inertial characteristics of the exit device 20. For example, in some embodiments, the inertial sensors 430 may include an accelerometer and/or gyrometer/gyroscope. In other embodiments, the inertial sensors 430 may include additional or alternative sensors to determine the same and/or other inertial characteristics of the exit device 20.

The trim sensor 432 is configured to generate sensor data (e.g., by virtue of one or more signals) associated with a trim lock status, which may be interpreted by the processor 402 to determine whether the trim of the exit device 20 is locked or unlocked. In some embodiments, the trim sensor 432 may be embodied as, or otherwise include, an inductive sense mechanism, physical switch, reed switch, communication with an electric trim product, and/or other mechanism(s) suitable for determining whether the trim is locked.

The tamper sensor 434 is configured to generate sensor data (e.g., by virtue of one or more signals) associated with a tamper status, which may be interpreted by the processor 402 to determine whether the exit device 20 has been tampered. In some embodiments, the tamper sensor 434 may be embodied as, or otherwise include, a lever-type switch, a magnetic reed switch, and/or other mechanism(s) suitable for determining whether one or more of the mechanical case covers of the exit device 20 has been tampered (e.g., exposing a portion of the control system 400 and/or another component of the exit device 20).

As indicated above, in some embodiments, additional and/or alternative sensors other than those described above may be included in the control system 400. For example, in various embodiments, the sensors 408 may be embodied as, or otherwise include, proximity sensors, optical sensors, light sensors, electromagnetic sensors, hall effect sensors, audio sensors, temperature sensors, motion sensor, piezoelectric sensors, cameras, and/or other types of sensors. Of course, the control system 400 may also include components and/or devices configured to facilitate the use of the sensors 408.

As described herein, in some embodiments, the dogging control assembly 410 is operable to actuate and control the dogging mechanism. For example, the dogging control assembly 410 may selectively activate the dogging mechanism to move the mechanism to a "dog-on-next-exit" state and/or release the pushbar 132 by moving the mechanism to an undogged state. In some embodiments, the dogging control assembly 410 may perform those functions in response to commands received from the management system 30. It should be appreciated that, in some embodiments, the dogging control assembly 410 may be similar to the dogging control assembly 300 described above.

In some embodiments, the management system 30 is configured to issue to the processor 402 commands (e.g., via a wireless communication connection over the communication circuitry 414) relating to the desired condition of the exit device 20. For example, the management system 30 may issue a dogging command when the dogged condition is desired, and may issue an undogging command when undogged condition is desired. In other embodiments, decisions relating to the dogging commands may be made by the processor 402 locally. The commands relating to the desired condition of the exit device 20 may, for example, be issued in response to input from a user, or according to a predetermined schedule stored in the memory 406.

The processor 402 is configured to electronically control the dogging mechanism 200 according to the commands received from the management system 30. More specifically, the processor 402 is configured to electronically adjust the dogging mechanism 200 to the actuated state in response to a dogging command, and to adjust the dogging mechanism 200 to the deactuated state in response to an undogging command. The processor 402 may adjust the actuated/deactuated state of the dogging mechanism 200 by operating the driver 240 using power from the power system 418. For example, the processor 402 may transmit power of a first polarity to cause the driver 240 to operate in the extending mode, and may transmit power of an opposite second polarity to cause the driver 240 to operate in the retracting mode. The power may be transmitted to the driver 240 as a series of electrical pulses, for example, in embodiments in which the motor 242 is provided in the form of a stepper motor.

To set the dogging mechanism 200 to the actuated state, the processor 402 may perform an actuating operation (e.g., transmitting a corresponding signal to cause the actuation). For example, the actuating operation may involve operating the driver 240 in the retracting mode to move the link 250 from the neutral position $250_N$ to the actuating position $250_A$, thereby pivoting the trigger 230 into the actuated range 268. The processor 402 may then determine that the trigger 230 has entered the actuated range 268, for example based upon the state of the dogging status switch 332, the amount of time that the driver 240 has been operated in the retracting mode, or the number of pulses sent to the driver 240. After determining that the trigger 230 has entered the actuated range 268, the processor 402 may then operate the driver 240 in the extending mode to return the link plate 250 to the neutral position $250_N$. Alternatively, the link plate 250 may be permitted to remain in the actuating position $250_A$, for example in embodiments in which the manual dogging actuator 152 is omitted or is mechanically decoupled from the trigger 230.

To set the dogging mechanism 200 to the deactuated state, the processor 402 may perform a deactuating operation (e.g., transmitting a corresponding signal to cause the deactuation). For example, the deactuating operation may involve operating the driver 240 in the extending mode to move the link 250 from the neutral position $250_N$ to the deactuating position $250_D$, thereby pivoting the trigger 230 into the deactuated range 266. The processor 402 may then determine that the trigger 230 has entered the deactuated range 266, for example based upon the state of the dogging status switch 332, the amount of time that the driver 240 has been operated in the extending mode, or the number of pulses sent to the driver 240. After determining that the trigger 230 has entered the deactuated range 266, the processor 402 may then operate the driver 240 in the retracting mode to return the link 250 to the neutral position $250_N$. Alternatively, the link plate 250 may be permitted to remain in the deactuating position $250_D$, for example in embodiments in which the manual dogging actuator 152 is omitted or is mechanically decoupled from the trigger 230.

As noted above, in the illustrative embodiment, the state of the dogging status switch 332 corresponds to the actuated or deactuated state of the dogging mechanism 200. Thus, the processor 402 may determine the state of the dogging mechanism 200 based upon the state of the dogging status switch 332. The sensor assembly 330 may further include additional or alternative sensors from which additional or alternative states of the exit device 20 may be determined. For example, the sensor assembly 330 may include a request-to-exit switch configured to sense the actuated/deactuated state of the drive assembly 120. Such a request-to-exit switch may enable the processor 402 to distinguish between the ready to dog condition and the dogged condition of the exit device 20. More specifically, when the dogging status switch 332 indicates that the dogging mechanism 200 is in the actuated state, the processor 402 may determine that the exit device 20 is in the ready to dog condition when the request to exit switch indicates that the drive assembly 120 is in the deactuated state, and may determine that the exit device 20 is in the dogged condition when the request-to-exit switch indicates that the drive assembly 120 is in the actuated state.

The visual indicator 412 may be embodied as any one or more devices or components configured to display a message to a user of the exit device 20. For example, in some embodiments, the visual indicator 412 may display the determined security state of the exit device 20 as described herein. Depending on the particular embodiment, the visual indicator 412 may be embodied, or otherwise include, one or more e-ink displays, LEDs, light pipes, LCDs, and/or other suitable visual indicator(s). In some embodiments, a mechanically-driven display system that includes two or more messages may be used such as, for example, a rotating tumbler actuated by a motor or linear actuator, a rotating display driven by a worm gear to display various messages against a fixed window in a cover of the exit device 20, or a sliding display within a mechanical case of the exit device 20 to display messages against a fixed window. Further details regarding illustrative forms of such mechanically-driven display systems are provided below with reference to FIGS. 34-37.

The communication circuitry 414 may be embodied as any communication circuitry, transceiver, device, or collection thereof, capable of enabling communications between the exit device 20 and other remote devices (e.g., the management system 30 and/or devices/components thereof, the management server 32, the gateway device 34, the mobile computing device 38, and/or other remote devices). The communication circuitry 414 may be configured to use any one or more communication technologies and associated protocols. As shown in FIG. 14 and described herein, the illustrative exit device 20 includes Bluetooth communication circuitry 436 and Wi-Fi communication circuitry 438. However, depending on the particular embodiment, the illustrative exit device 20 may be configured to communicate via Wi-Fi (e.g., infrastructure or ad hoc mode), Wi-Fi Direct, Bluetooth (including Bluetooth Low Energy (BLE)), Zigbee, Near Field Communication (NFC), IEEE 902.15, and/or other suitable wireless communication protocol(s).

The timer 416 is configured to track the amount of time associated with various conditions of the exit device 20. For example, as described herein, the timer 416 may be used to determine the amount of time the door is opened, the amount of time a door has been dogged outside of a permitted dogging schedule, and/or other conditions. Although the timer 416 is shown as a discrete component in FIG. 14, it should be appreciated that the timer 416 may form a portion of another component of the exit device 20 in other embodiments. For example, in some embodiments, the processor 402 may include the timer 416 (e.g., a real-time clock). It should be appreciated that, in some embodiments, the timer 416 may be a software- or firmware-implemented timer.

The exit device 20 may be internally powered (e.g., by virtue of an alkaline, lithium ion, or other type of battery) or externally powered (e.g., line powered by virtue of an AC mains power source, via Power over Ethernet (PoE), and/or via one or more other external power sources) via the power system 418 depending on the particular embodiment. As described above, various features of the dogging mechanism 200 reduce the amount of power consumed by the driver 240 during operation of the exit device 100. This reduced power consumption may enable the dogging control assembly 300 to be powered by the onboard power supply 310 without requiring connection to line power. Accordingly, in some embodiments, the exit device 20 may be utilized to provide wireless electronic dogging control on doors that are not wired to an electrical or access control system. In some embodiments, it should be appreciated that the exit device 20 has various power settings. For example, in some embodiments, various sensors 408 may be capable of entering a sleep state or reduced power state (e.g., periodically waking up every few seconds or according to another interval to check sensor data values).

Referring back to FIG. 2, it should be appreciated that each of the management server 32, the gateway device 34, the access control panel 36, and/or the mobile computing device 38 may be embodied as a computing device similar to the computing device 500 described below in reference to FIG. 15. For example, in the illustrative embodiment, each of the management server 32, the gateway device 34, the access control panel 36, and/or the mobile computing device 38 includes a processing device 502 and a memory 506 having stored thereon operating logic 508 for execution by the processing device 502 for operation of the corresponding device/system.

Figure 15:
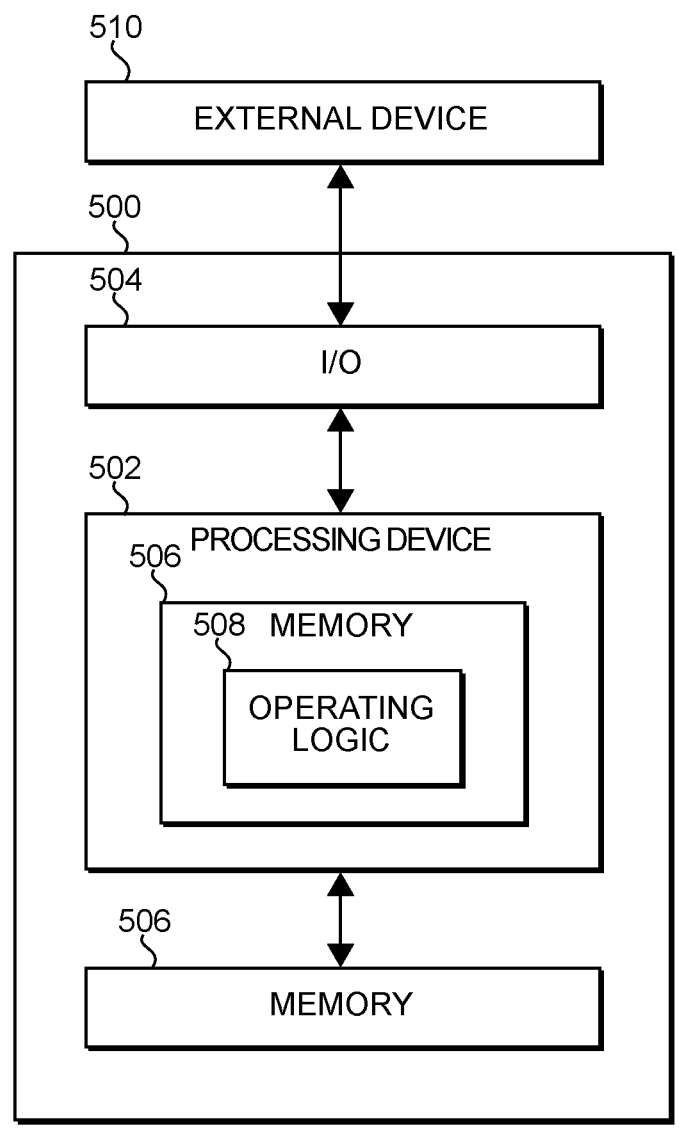
FIG. 15 is a simplified block diagram of at least one embodiment of a computing device.

Referring now to FIG. 15, a simplified block diagram of at least one embodiment of a computing device 500 is shown. The illustrative computing device 500 depicts at least one embodiment of a management server, gateway, access control device/panel, and/or mobile computing device that may be utilized in connection with the management server 32, the gateway device 34, the access control panel 36, and/or the mobile computing device 38 illustrated in FIG. 2. The computing device 500 includes a processing device 502 that executes algorithms and/or processes data in accordance with operating logic 508, an input/output device 504 that enables communication between the computing device 500 and one or more external devices 510, and memory 506 which stores, for example, data received from the external device 510 via the input/output device 504.

The input/output device 504 allows the computing device 500 to communicate with the external device 510. For example, the input/output device 504 may include a transceiver, a network adapter, a network card, an interface, one or more communication ports (e.g., a USB port, serial port, parallel port, an analog port, a digital port, VGA, DVI, HDMI, FireWire, CAT 5, or any other type of communication port or interface), and/or other communication circuitry. Communication circuitry may be configured to use any one or more communication technologies (e.g., wireless or wired communications) and associated protocols (e.g., Ethernet, Bluetooth®, Wi-Fi®, WiMAX, etc.) to effect such communication depending on the particular computing device 500. The input/output device 504 may include hardware, software, and/or firmware suitable for performing the techniques described herein.

The external device 510 may be any type of device that allows data to be inputted or outputted from the computing device 500. For example, in various embodiments, the external device 510 may be embodied as an exit device (e.g., the exit device 20), management server (e.g., the management server 32, another server in the management system 30, and/or a server in a cloud-computing environment), gateway (e.g., the gateway device 34), access control device (e.g., the access control panel 36), and/or mobile computing device (e.g., the mobile computing device 38), desktop computer, laptop computer, tablet computer, notebook, netbook, Ultrabook™, cellular phone, smartphone, wearable computing device, personal digital assistant, Internet of Things (IoT) device, processing system, router, switch, diagnostic tool, controller, printer, display, alarm, illuminated indicator (e.g., a status indicator), peripheral device (e.g., keyboard, mouse, touch screen display, etc.), and/or any other computing, processing, and/or communication device capable of performing the functions described herein. Furthermore, in some embodiments, it should be appreciated that the external device 510 may be integrated into the computing device 500.

The processing device 502 may be embodied as any type of processor(s) capable of performing the functions described herein. In particular, the processing device 502 may be embodied as one or more single or multi-core processors, microcontrollers, or other processor or processing/controlling circuits. For example, in some embodiments, the processing device 502 may include or be embodied as an arithmetic logic unit (ALU), central processing unit (CPU), digital signal processor (DSP), and/or another suitable processor(s). The processing device 502 may be a programmable type, a dedicated hardwired state machine, or a combination thereof. Processing devices 502 with multiple processing units may utilize distributed, pipelined, and/or parallel processing in various embodiments. Further, the processing device 502 may be dedicated to performance of just the operations described herein, or may be utilized in one or more additional applications. In the illustrative embodiment, the processing device 502 is of a programmable variety that executes algorithms and/or processes data in accordance with operating logic 508 as defined by programming instructions (such as software or firmware) stored in memory 506. Additionally or alternatively, the operating logic 508 for processing device 502 may be at least partially defined by hardwired logic or other hardware. Further, the processing device 502 may include one or more components of any type suitable to process the signals received from input/output device 504 or from other components or devices and to provide desired output signals. Such components may include digital circuitry, analog circuitry, or a combination thereof.

The memory 506 may be of one or more types of non-transitory computer-readable media, such as a solid-state memory, electromagnetic memory, optical memory, or a combination thereof. Furthermore, the memory 506 may be volatile and/or nonvolatile and, in some embodiments, some or all of the memory 506 may be of a portable variety, such as a disk, tape, memory stick, cartridge, and/or other suitable portable memory. In operation, the memory 506 may store various data and software used during operation of the computing device 500 such as operating systems, applications, programs, libraries, and drivers. It should be appreciated that the memory 506 may store data that is manipulated by the operating logic 508 of processing device 502, such as, for example, data representative of signals received from and/or sent to the input/output device 504 in addition to or in lieu of storing programming instructions defining operating logic 508. As shown in FIG. 15, the memory 506 may be included with the processing device 502 and/or coupled to the processing device 502 depending on the particular embodiment. For example, in some embodiments, the processing device 502, the memory 506, and/or other components of the computing device 500 may form a portion of a system-on-a-chip (SoC) and be incorporated on a single integrated circuit chip.

In some embodiments, various components of the computing device 500 (e.g., the processing device 502 and the memory 506) may be communicatively coupled via an input/output subsystem, which may be embodied as circuitry and/or components to facilitate input/output operations with the processing device 502, the memory 506, and other components of the computing device 500. For example, the input/output subsystem may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

The computing device 500 may include other or additional components, such as those commonly found in a typical computing device (e.g., various input/output devices and/or other components), in other embodiments. It should be further appreciated that one or more of the components of the computing device 500 described herein may be distributed across multiple computing devices. In other words, the techniques described herein may be employed by a computing system that includes one or more computing devices. Additionally, although only a single processing device 502, I/O device 504, and memory 506 are illustratively shown in FIG. 15, it should be appreciated that a particular computing device 500 may include multiple processing devices 502, IO devices 504, and/or memories 506 in other embodiments. Further, in some embodiments, more than one external device 510 may be in communication with the computing device 500.

Figure 16:
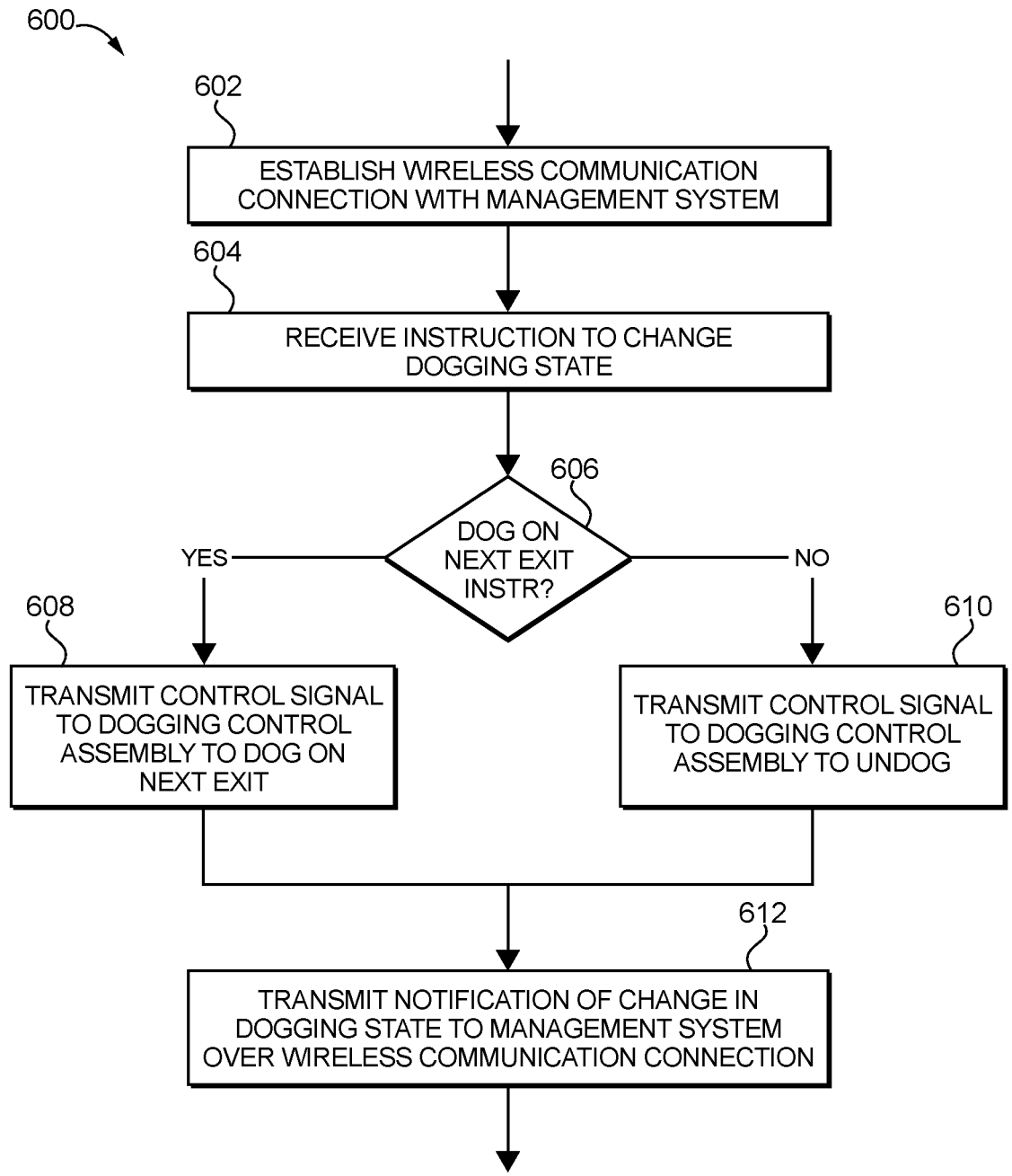
FIG. 16 is a simplified flow diagram of at least one embodiment of a method for wireless control of the exit device of FIGS. 1-2.

Referring now to FIG. 16, in use, the exit device 20 or, more particularly, the control system 400 may execute a method 600 for wireless control of the exit device 20 by the management system 30. It should be appreciated that the particular blocks of the method 600 are illustrated by way of example, and such blocks may be combined or divided, added or removed, and/or reordered in whole or in part depending on the particular embodiment, unless stated to the contrary. The illustrative method 600 begins with block 602 in which the exit device 20 establishes a wireless communication connection with the management system 30. As described above, in some embodiments, a Bluetooth or Wi-Fi communication link, for example, may be established between the exit device 20 and the management system 30. Further, in some embodiments, the wireless communication connection may be established directly between the exit device 20 and the management system 30, whereas in other embodiments, the wireless communication connection may be established by virtue of one or more intervening. In particular, in some embodiments, the exit device 20 may establish a wireless communication connection with the management server 32 (e.g., directly or indirectly via the gateway device 34).

In block 604, the exit device 20 receives an instruction from the management system 30 via the wireless communication connection to change the dogging state of the dogging mechanism 200 (e.g., from a dogged or dog-on-next-exit state to an undogged state or from an undogged state to a dog-on-next-exit state). In some embodiments, if the exit device 20 receives an instruction to change the dogging state to a state to which the dogging mechanism 200 is currently set, the exit device 20 may ignore the instruction.

If the exit device 20 or, more specifically, the processor 402 determines in block 606 that the instruction is to change the dogging mechanism 200 to the dog-on-next exit state, the processor 402 transmits an electrical control signal to the dogging control assembly 410 to move the dogging mechanism 200 to the dog-on-next-exit state in block 608. If the exit device 20, or more specifically, the processor 402 determines in block 606 that the instruction is to change the dogging mechanism 200 to the undogged state, the processor 402 transmits an electrical control signal to the dogging control assembly 410 to move the dogging mechanism 200 to the undogged state in block 610. Due to the configuration of the dogging mechanism 200 and associated components, the dogging mechanism 200 may be capable of being set to the undogged state without physical interaction by the user, even in the event that the dogging mechanism 200 has been manually placed in the dogged state (e.g., with the manual dogging actuator 152).

In response to the received electrical control signal, the dogging control assembly 410 moves the dogging mechanism 200 to the appropriate state. As such, the management system 30 may remotely and wirelessly control the dogging state of the exit device 20. It should be appreciated that the management system 30 may utilize the techniques described in the method 600 to perform a "lockdown function" to immediately undog/lock each of the exit devices in a particular facility without touring the exit devices themselves. In some embodiments, to do so, the control system 400 establishes the wireless communication connection via Bluetooth with the gateway 34, which may maintain a persistent real-time communication connection with the management server 32 (e.g., serial communication via RS 485, via IP, etc.).

In some embodiments, in block 612, the exit device 20 may transmit a notification of the change in the dogging state of the exit device 20 to the management system 30 over the wireless communication connection and/or via one or more visual indicators 412. In other embodiments, the exit device 20 does not perform such reporting. Regardless of whether the change in state is transmitted wirelessly, the change may be recorded in the audit trail.

Figure 17:
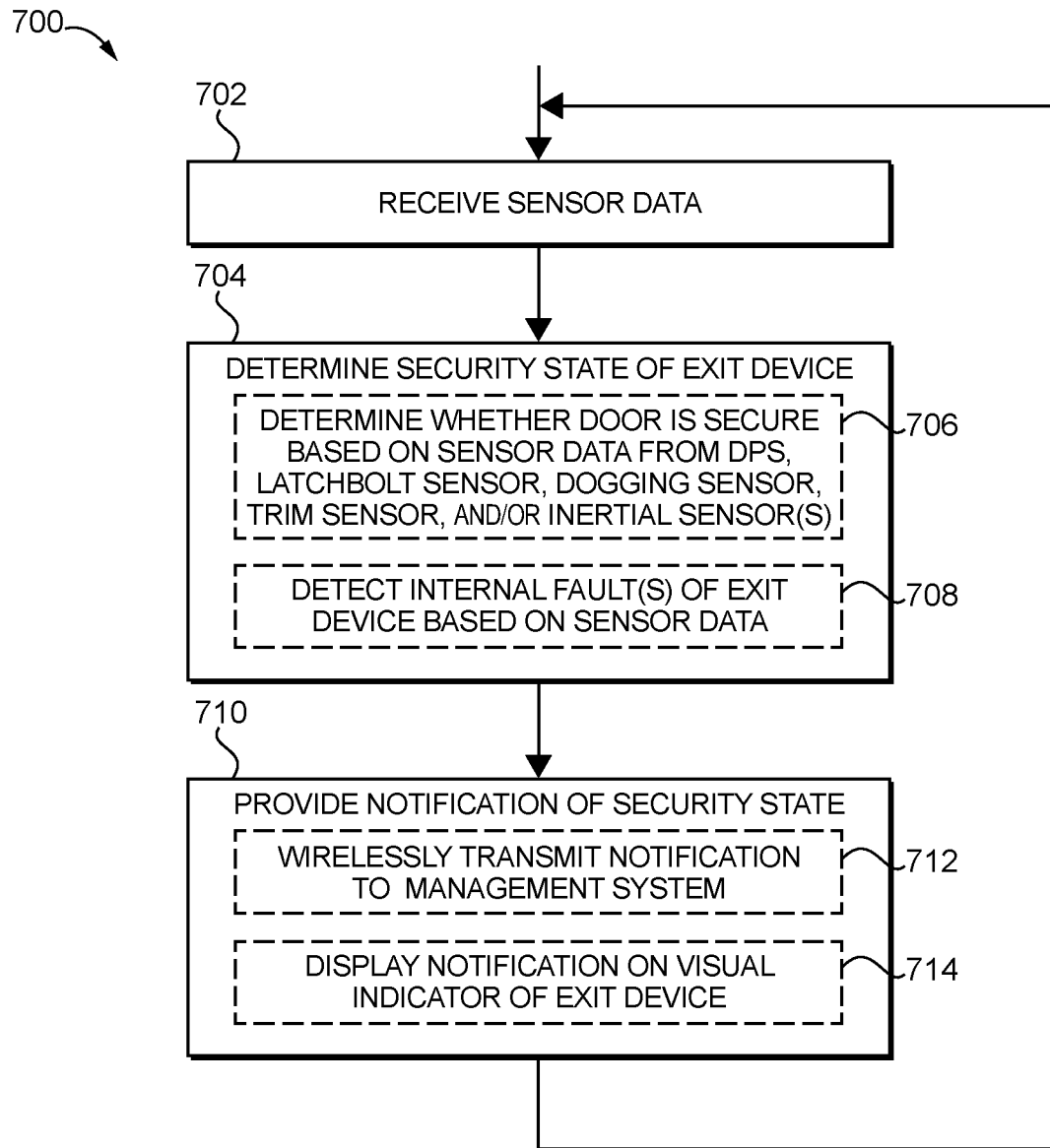
FIG. 17 is a simplified flow diagram of at least one embodiment of a method for management of a security state of the exit device of FIGS. 1-2.

Referring now to FIG. 17, in use, the exit device 20 or, more particularly, the control system 400 may execute a method 700 for management of a security state of the exit device 20. It should be appreciated that the particular blocks of the method 700 are illustrated by way of example, and such blocks may be combined or divided, added or removed, and/or reordered in whole or in part depending on the particular embodiment, unless stated to the contrary. The illustrative method 700 begins with block 702 in which the exit device 20 or, more specifically, the processor 402 receives sensor data from one or more of the sensors 408 of the exit device 20.

In block 704, the exit device 20 determines the security state of the exit device 20 based on the received sensor data. As described above, in the illustrative embodiment, the exit device 20 or, more specifically, the processor 402 determines the security state based on a holistic analysis of the sensor data. In some embodiments, in block 706, the exit device 20 may determine whether the door is secure based on sensor data received from the door position sensor 420, the latchbolt sensor 424, and the dogging status sensor 422. For example, in doing so, the exit device 20 may determine the door position status from sensor data generated by the door position sensor 420, which indicates whether the door is in the open or closed position, the latchbolt status from sensor data generated by the latchbolt sensor 424, which indicates whether the latchbolt 142 is in the extended or retracted position, and the dogging status based on sensor data generated by the dogging status sensor 422, which indicates whether the dogging mechanism 200 is positioned to hold the pushbar 132 in the retracted position. Further, the exit device 20 may determine the door to be secure in response to the door position status indicating that the door is in the closed position, the latchbolt status indicating that the latchbolt 142 is in the extended position, and the dogging status indicating that the dogging mechanism 200 is not positioned to hold the pushbar 132 in the retracted position. In such embodiments, the exit device 20 may otherwise determine the door to be unsecure.

In some embodiments, the exit device 20 may further base the determination regarding the security state of the exit device 20 based on sensor data received from the trim sensor 432 indicating whether the trim of the door has been tampered. In such embodiments, the exit device 20 may determine the door to be secure in response to the door position status indicating that the door is in the closed position, the latchbolt status indicating that the latchbolt 142 is in the extended position, the dogging status indicating that the dogging mechanism 200 is not positioned to hold the pushbar 132 in the retracted position, and that the trim of the door has not been tampered. In such embodiments, the exit device 20 may otherwise determine the door to be unsecure. It should be appreciated that, in other embodiments, the exit device 20 may employ another holistic analysis of the sensor data to determine whether the door is secure. For example, in other embodiments, the exit device 20 may utilize sensor data from additional or alternative sensors in order to determine whether the door is secure.

In some embodiments, it should be appreciated that in determining its security state, the exit device 20 may analyze the sensor data to determine whether a door prop condition (see, for example, FIG. 19) or a forced door condition has occurred. For example, in some embodiments, the exit device 20 may analyze sensor data generated by the door position sensor 420 and the REX sensor 426 to determine whether a forced door condition has occurred (i.e., whether the door has been pushed/forced open without authorization). In particular, the sensor data generated by the REX sensor 429 may be indicative of whether the pushbar 132 has been depressed by a user, and the sensor data generated by the door position sensor 420 may be indicative of whether the door has been displaced from the door frame (i.e., displaced from a closed position). If the exit device 20 determines that the door has been displaced from the door frame (e.g., based on the door position sensor 420 data) and that the pushbar 132 has not been depressed by a user (e.g., based on the REX sensor 429 data), the exit device 20 may determine that a forced door condition has occurred. Otherwise, in some embodiments, the exit device 20 may determine that a forced door condition has not occurred.

It should be appreciated that various conditions may cause false forced door events and, therefore, the exit device 20 may perform further analysis and/or include other mechanisms to remedy the false events in some embodiments. For example, a double-door entryway without a mullion may impede the ability of the exit device 20 to properly detect a forced door condition based on sensor data generated by the door position sensor 420 and the REX sensor 426. That is, whenever a user operates one leaf/door, the other leaf/door may signal a forced door condition when utilizing the door position sensor 420. As such, in some embodiments, the exit device 20 may further analyze the motion of the door in order to eliminate and/or reduce false positives associated with the detection of forced door conditions. In particular, in some embodiments, if the analysis of sensor data generated by the door position sensor 420 (or the door position sensor 420 and the REX sensor 426) is indicative of a forced door condition, the exit device 20 may further analyze sensor data generated by a gyrometer, accelerometer, and/or one or more other inertial sensors 430 to determine whether the leaf/door has moved (e.g., by virtue of a determination that the exit device 20 or, more specifically, the inertial sensor 430 has moved) over a predefined period of time (e.g., the same or similar time period as the door prop timeout described below). If the exit device 20 determines that the door has moved within that time period, the exit device 20 may determine that a forced door condition has occurred. Otherwise, in some embodiments, the exit device 20 may determine that a forced door condition has not occurred. As such, it should be appreciated that, in some embodiments, the exit device 20 may further base the determination regarding the security on sensor data generated by a gyrometer, accelerometer, and/or one or more other inertial sensors 430. Further, in some embodiments, the inertial sensor(s) 430 may be awaken from a sleep state in response to the determination that the sensor data generated by the door position sensor 420 is indicative of a forced door condition.

In some embodiments, in block 708, the exit device 20 may detect any internal faults of the exit device 20 based on the received and analyzed sensor data. Further, the exit device 20 may generate a diagnostics warning or maintenance message.

In block 710, the exit device 20 provides a notification of the security state of the exit device 20. In particular, in block 712, the exit device 20 may wirelessly transmit a notification of the security state to the management system 30 over a wireless communication connection between (directly or indirectly) the exit device 20 and the management system 30. As such, it should be appreciated that, in some embodiments, the exit device 20 may transmit a message to the management system 30 indicative of the overall security state of the exit device 20 or the door without transmittal of the raw sensor data, which may reduce bandwidth consumption and reduce the computational load on the management system 30. Additionally or alternatively, in block 714, the exit device 20 may display a notification of the security state of the exit device 20 on the visual indicator 412. It should be appreciated that the notification displayed on the visual indicator 412 may be the same or different from the notification wirelessly transmitted to the management system 30. It should further be appreciated that, in some embodiments, the exit device 20 may transmit and/or display other information in addition to the security state (e.g., data indicative of various door conditions or parameters). Further, in some embodiments, the notification may be provided via another feedback mechanism (e.g., audible feedback emanating from a speaker on the exit device 20). The method 700 returns to block 702 as the exit device 20 continues to monitor the security state of the exit device 20.

Figure 18:
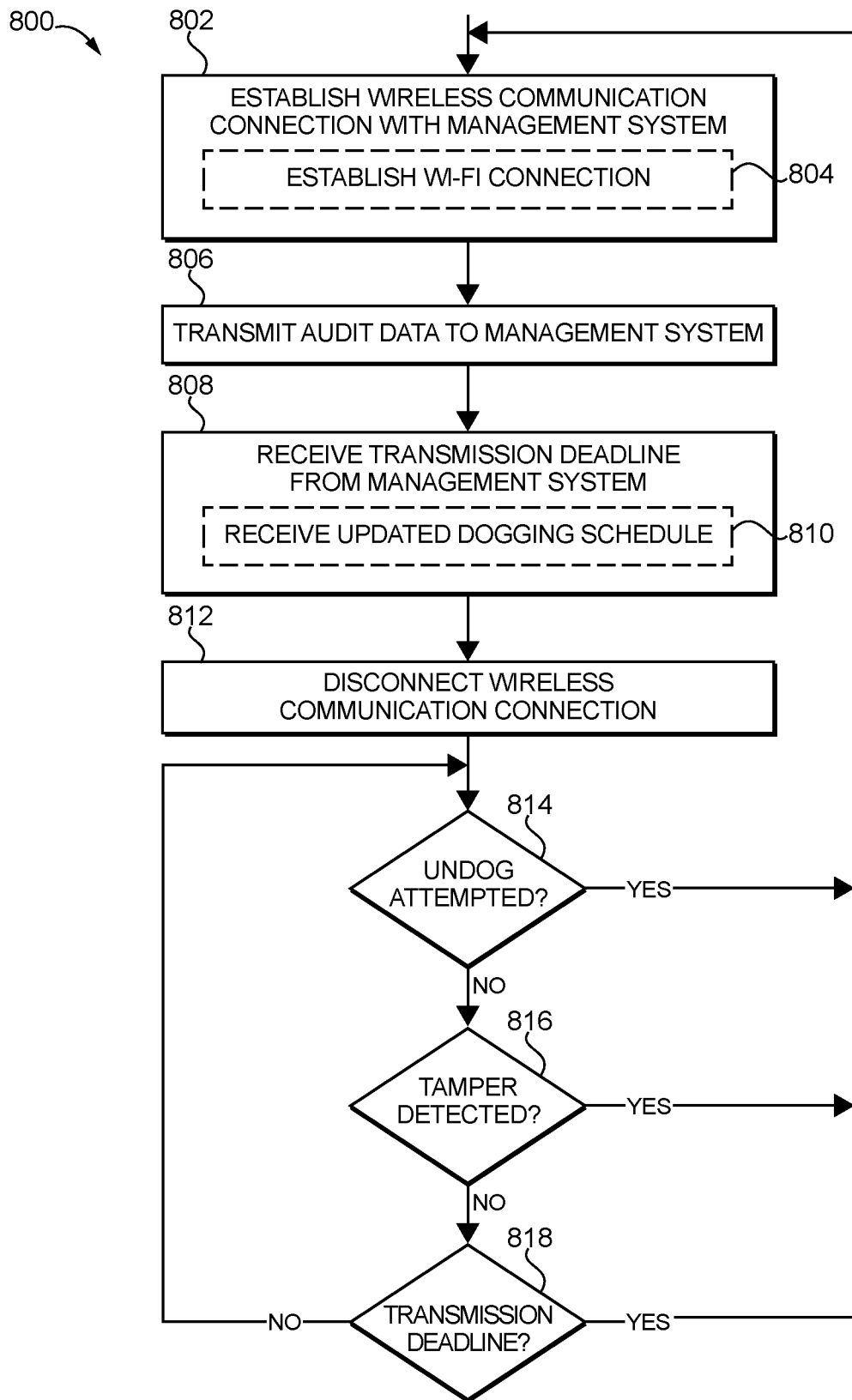
FIG. 18 is a simplified flow diagram of at least one embodiment of a method for reporting audit data of the exit device of FIGS. 1-2.

Referring now to FIG. 18, in use, the exit device 20 or, more particularly, the control system 400 may execute a method 800 for reporting audit data. It should be appreciated that the particular blocks of the method 800 are illustrated by way of example, and such blocks may be combined or divided, added or removed, and/or reordered in whole or in part depending on the particular embodiment, unless stated to the contrary. The illustrative method 800 begins with block 802 in which the exit device 20 establishes a wireless communication connection with the management system 30 (e.g., directly or indirectly). For example, in block 804, a Wi-Fi communication connection may be established between the exit device 20 and the management system 30. In other embodiments, it should be appreciated that another suitable wireless communication connection may be established. More specifically, in some embodiments, the exit device 20 may establish a wireless communication connection with the management server 32.

In block 806, the exit device 20 transmits audit data to the management system 30. The audit data may include sensor data generated by one or more of the sensors 408 or a processed version thereof, door prop and/or other conditions, internal fault data, dogging schedule data, access data/logs, diagnostic data, and/or other audit data that may be useful to the management system 30. The access data/logs may include, for example, data that identifies the day/time of successful and/or unsuccessful access attempts through the door to which the exit device 20 is coupled, the day/time of transitions of the dogging mechanism 200 between dogging states, and/or other relevant data.

In block 808, the exit device 20 receives a transmission deadline from the management system 30. In the illustrative embodiment, the transmission deadline identifies a maximum time that may elapse following disconnection of the wireless communication connection between the exit device 20 and the management system 30 prior to re-establishing the wireless communication connection. In other words, if the exit device 20 has not contacted the management system 30 and received an updated transmission deadline, the exit device 20 "phones home" when the time associated with the transmission deadline has passed. Depending on the particular embodiment, the transmission deadline may be represented as an amount of time to elapse from the point in time at which the transmission deadline is received (e.g., twelve hours), as a specific time in the future (e.g., next Saturday at 01:00:00), or in another suitable way.

In some embodiments, in block 810, the exit device 20 may receive an updated dogging schedule from the management system 30. The dogging schedule may identify the schedule (e.g., time/day) at which various dogging transitions should occur automatically by the exit device 20 without receiving a real-time instruction from the management system 30. For example, the dogging schedule may indicate that the dogging mechanism 200 should be transitioned to the dog-on-next-exit state at the start of business each day and transitioned to the undogged state at the close of business each day. In some embodiments, it should be appreciated that the exit device 20 may communicate with the management system 30 to ensure that the dogging schedule stored in the memory 406 of the exit device 20 is still accurate prior to transitioning to or from a particular dogging state (e.g., prior to transitioning to the dog-on-next-exit state).

In block 812, the exit device 20 disconnects the wireless communication connection with the management system 30. In block 814, the exit device 20 determines whether an undog attempt has occurred in the exit device 20. If not, in block 816, the exit device 20 determines whether a tamper has been detected (e.g., a door prop or forced door condition). If not, in block 818, the exit device 20 determines whether the transmission deadline has been met. If not, the method 800 returns to block 814 in which the exit device 20 continues to monitor for the occurrence of an undog attempt, a tamper detection, or the passing of the transmission deadline. However, if the exit device 20 determines that an undog has been attempted in block 814, a tamper has been detected in block 816, or the transmission deadline has passed in block 818, then the method 800 returns to block 802 in which the exit device 20 re-establishes the wireless communication connection with the management system 30 to transmit the audit data, receive an updated transmission deadline, and/or receive an updated dogging schedule. In other words, in the illustrative embodiment, the exit device 20 "phones home" at the earliest of a scheduled relocking (undogging) attempt, a door prop or other tamper condition, and the passing of the transmission deadline. In some embodiments, each time the exit device 20 communicates with the management system 30, a new transmission deadline is provided to the exit device 20.

Figure 19:
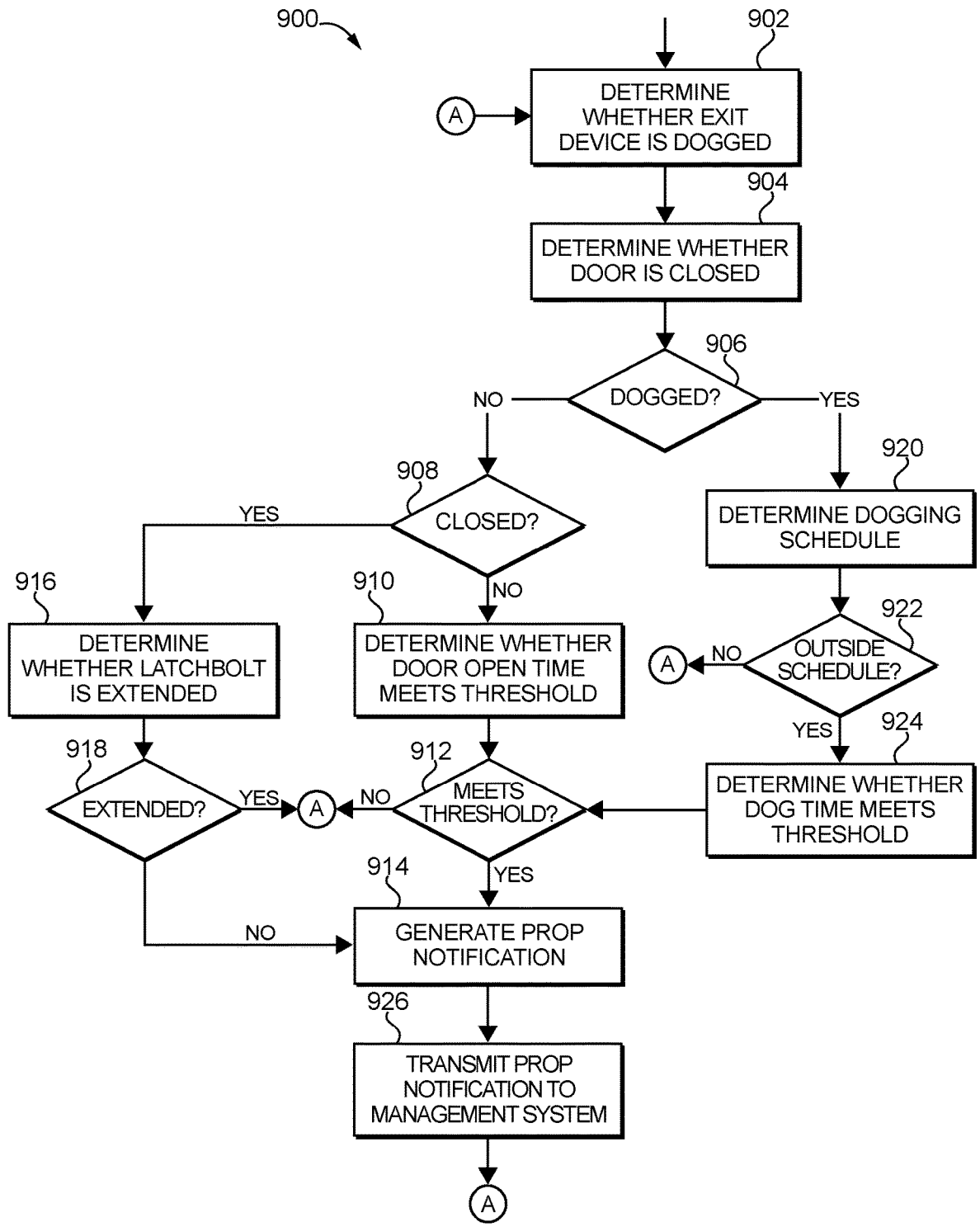
FIG. 19 is a simplified flow diagram of at least one embodiment of a method for wireless door prop notification.

Referring now to FIG. 19, in use, the exit device 20 or, more particularly, the control system 400 may execute a method 900 for wireless door prop notification. It should be appreciated that the particular blocks of the method 900 are illustrated by way of example, and such blocks may be combined or divided, added or removed, and/or reordered in whole or in part depending on the particular embodiment, unless stated to the contrary. The illustrative method 900 begins with block 902 in which the exit device 20 or, more particularly, the processor 402 determines whether the exit device 20 is dogged. In particular, in the illustrative embodiment, the exit device 20 determines whether the dogging mechanism is in the dogged state or the "dog-on-next-exit" state based on the sensor data of the dogging status sensor 514. As indicated above, if the dogging mechanism is in the dogged state or the "dog-on-next-exit" state, the dogging mechanism is positioned to hold the pushbar 132 in a retracted state (e.g., either presently or upon the next depression of the pushbar 132). However, if the dogging mechanism is in the undogged state, the dogging mechanism is not positioned to hold the pushbar 132 in the retracted state. As described above, in some embodiments, the dogging mechanism may not have a "dog-on-next-exit" position and, therefore, is only capable of being positioned in a dogged state and an undogged state.

In block 904, the exit device 20 determines an opened/closed state or position of the door to which the exit device 20 is mounted. For example, in some embodiments, the exit device 20 may determine whether the door is closed based on sensor data generated by the door position sensor 512. For example, in some embodiments, the door position sensor 512 may include a magnetometer used in conjunction with a frame-side magnet.

If the exit device 20 determines that the dogging mechanism is undogged (i.e., in the undogged state) in block 906 and determines that the door is opened in block 908, then the method 900 advances to block 910 in which the exit device 20 determines whether the door open time meets a predetermined threshold time (i.e., whether the door has been open for at least a threshold amount of time). It should be appreciated that the predetermined threshold time may be a predetermined static or administrator-defined time limit depending on the particular embodiment. If the exit device 20 determines, in block 912, that the threshold time has not been met, the method 900 returns to block 902 in which the exit device 20 reassesses the sensor data and various conditions described herein. However, if the exit device 20 determines that the dogging mechanism is undogged and the door has been opened for at least the threshold amount of time, the method 900 advances to block 914 in which the exit device 20 generates a prop notification for transmittal to the management system 30. It should be appreciated that the prop notification may be in any format suitable for informing the management system 30 of the occurrence of a door prop condition.

Returning to block 908, if the exit device 20 determines that the dogging mechanism is undogged and the door is closed, the method 900 advances to block 916 in which the exit device 20 determines whether the latchbolt 142 is extended. As described above, the exit device 20 may make such a determination based on the sensor data generated by the latchbolt sensor 516. If the exit device 20 determines, in block 918, that the latchbolt is extended, the method 900 returns to block 902 in which the exit device 20 reassesses the sensor data and various conditions described herein. However, if the exit device 20 determines that the dogging mechanism is undogged, the door is closed, and the latchbolt 142 is not extended, the method 900 advances to block 914 in which the exit device 20 generates a prop notification for transmittal to the management system 30. The presence of a retracted latchbolt 142 on a closed and undogged door may be indicative of, for example, a taped latch.

Returning to block 906, if the exit device 20 determines that the dogging mechanism is dogged or in a "ready to dog" position such that the dogging mechanism is positioned to hold the pushbar 132 in a retracted position, the method 900 advances to block 920 in which the exit device 20 determines the dogging schedule for the exit device 20. The dogging schedule may indicate, for example, days/times at which dogging of the exit device 20 is permitted and/or days/times at which dogging of the exit device 20 is not permitted (i.e., times outside the permitted schedule). In some embodiments, the dogging schedule is stored on the memory 506 of the exit device 20 and may be updated from time to time (e.g., periodically) by the management system 30. If the exit device 20 determines, in block 922, that the dogging mechanism is dogged but that it is not outside of the dogging schedule, the method 900 returns to block 902 in which the exit device 20 reassesses the sensor data and various conditions described herein (e.g., continuing to monitor the sensor data for a door prop condition). However, if the exit device 20 determines that the dogging mechanism is dogged at a time outside the times permitted under the dogging schedule, the method 900 advances to block 924 in which the exit device 20 determines whether the exit device 20 has been dogged outside of the dogging schedule for at least a threshold amount of time. It should be appreciated that the predetermined threshold time may be a predetermined static or administrator-defined time limit depending on the particular embodiment. Further, the threshold time may be the same or different from the threshold described in reference to block 910.

If the exit device 20 determines, in block 912, that the threshold time has not been met, the method 900 returns to block 902 in which the exit device 20 reassesses the sensor data and various conditions described herein. However, if the exit device 20 determines that the dogging mechanism has been dogged outside of times permitted by the dogging schedule for at least the threshold amount of time, the method 900 advances to block 914 in which the exit device 20 generates a prop notification for transmittal to the management system 30. When a dogging schedule is running on the exit device 20, it should be appreciated that the exit device 20 may, in some embodiments, transmit a prop notification if the door is propped through a hex key, cylinder key, or depression of the pushbar 132.

Regardless of the door prop condition associated with the prop notification, in block 914, the exit device 20 transmits the door prop notification to the management system 30. It should be appreciated that the exit device 20 may utilize any suitable communication protocol and technology to do so depending on, for example, the target device of the management system 30 as described above. For example, in the illustrative embodiment, the exit device 20 transmits the prop notification over a wireless communication channel (e.g., Wi-Fi or BLE). It should be appreciated that abstracting the prop event as the only required communication to the management system 30 may reduce the number of events that must be communicated over the wireless communication channel. Additionally, the abstraction of the prop event (e.g., using a predefined API) may reduce or eliminate the need for the management system 30 to understand the detailed workings of the exit device 20 and/or multiple different exit devices. In some embodiments, it should be appreciated that the exit device 20 may, additionally or alternatively, convey a door prop notification via the visual indicator 412 (or audible indicator) on the door. The method 900 returns to block 902 in which the exit device 20 reassesses the sensor data and various conditions described herein. Although the blocks 902-926 are described in a relatively serial manner, it should be appreciated that various blocks of the method 900 may be performed in parallel in some embodiments.

It should be appreciated that the illustrative exit device 20 monitors for the occurrence of three different door prop conditions. A first door prop condition occurs when the door is out of position (opened) for a defined amount of time and the door 84 is undogged. A second door prop condition occurs when the door 84 is dogged (or in a "ready to dog" state) for a defined amount of time outside of scheduled times during which dogging is permitted. A third door prop condition occurs when the door 84 is in position (closed), undogged, and the latchbolt 142 is retracted (not extended). It should be appreciated that, in other embodiments, the exit device 20 may, additionally or alternatively, monitor for the occurrence of otherwise defined door prop conditions.

Figure 20:
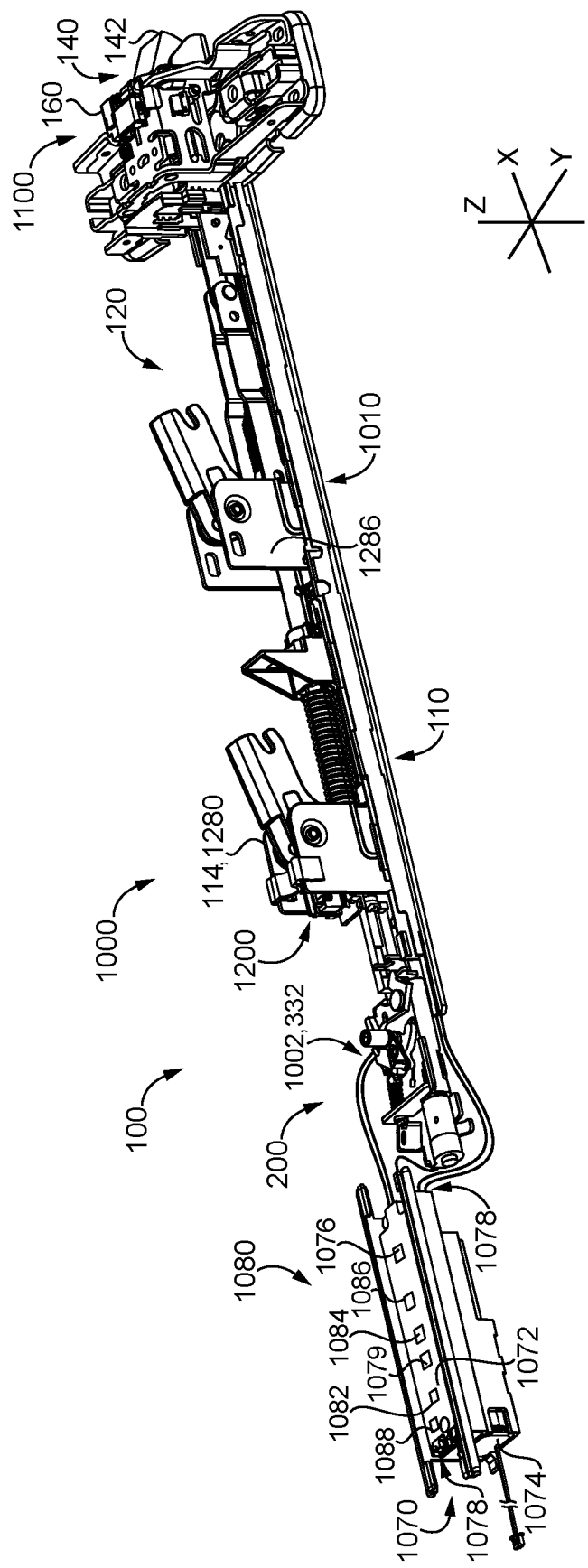
FIG. 20 is a perspective view of a sensor assembly according to one embodiment and a portion of the exit device illustrated in FIG. 3.

FIG. 20 illustrates a sensor assembly 1000, a wire management assembly 1010, and a control module 1070 installed to the above-described exit device 100, certain components of which are omitted from the illustration in the interest of clarity. The sensor assembly 1000 is one embodiment of the above-described sensor system 409 and includes a plurality of sensors, each of which may correspond to one or more of the sensors 408. The sensor assembly 1000 includes an environmental sensor assembly 1080, a header sensor assembly 1100, and a request-to-exit (REX) sensor assembly 1200. The sensor assembly 1000 may further include a dogging status sensor 1002 operable to sense the dogging/undogging state of the dogging mechanism 200. The dogging status sensor 1002 is an embodiment of the dogging status sensor 422, and in the illustrated embodiment is provided in the form of the above-described dogging status switch 332.

The illustrative control module 1070 includes a printed circuit board assembly (PCBA) 1072, which is mounted to a housing 1073 and is connected to a power supply 1074. In certain embodiments, the control module 1070 may include an onboard energy storage device as the power supply 1074. In other embodiments, the control module 1070 may be connected to an external power supply 1074, such as line power. The PCBA 1072 includes a controller 1076 and a plurality of ports or interfaces 1078 through which the PCBA 1072 may be connected with the power supply 1074 and one or more sensors of the sensor assembly 1000. The PCBA 1072 also includes a set of electrical communication paths (e.g., wires and/or traces) connecting the controller 1076, interfaces 1078, and various other components of the PCBA 1072. In the illustrated embodiment, the PCBA 1072 also includes a wireless communication device 1079 and the environmental sensor assembly 1080.

The illustrated environmental sensor assembly 1080 includes a light sensor 1082, a temperature sensor 1084, a gyrometer 1086, power supply sensor 1087, and a tamper sensor 1088. The light sensor 1082 is configured to generate sensor data related to the ambient light in the environment in which the exit device 100 is installed. The light sensor 1082 is an embodiment of an environment sensor 428, and in the illustrated form comprises a photodiode.

The temperature sensor 1084 is configured to generate sensor data related to the ambient temperature in the environment in which the exit device 100 is installed. The temperature sensor 1084 is another embodiment of the environment sensor 428, and in the illustrated form comprises a temperature-dependent resistor. The gyrometer 1086 is an embodiment of an inertial sensor 430, and is configured to generate sensor data related to the acceleration of the exit device 100, for example during door opening and/or closing operations.

The power supply sensor 1087 is configured to sense a power state of a power supply from which the control module 1070 receives electrical power. The power sensor 1087 may be configured to sense a power failure condition, for example in embodiments in which the control module 1070 is connected to line power. The power supply sensor 1087 may additionally or alternatively be configured to sense a charge level of an energy storage device such as a battery or a supercapacitor, for example in embodiments in which the exit device 100 includes the power supply 1074 as an onboard power supply for the control module 1070.

The tamper sensor 1088 is configured to generate sensor data related to the presence or absence of a cover plate, which may indicate that a person is attempting to access the control module 1070. The tamper sensor 1088 is an embodiment of a tamper sensor 434, and in the illustrated form comprises a reed switch that is operatively associated with the cover plate via a magnet mounted to the cover plate. When the cover plate is installed, the magnet is aligned with the tamper sensor 1088, thereby setting the reed switch to a first state in which the tamper sensor 1088 provides a first signal indicative of the presence of the cover plate. When the cover plate is removed, the magnet moves away from the tamper sensor 1088, thereby setting the reed switch to a second state in which the tamper sensor 1088 provides a second signal indicative of the absence of the cover plate. Thus, the tamper sensor 1088 is configured to sense the installed/removed position of the cover plate, and may alternatively be referred to as a cover plate position sensor.

As described herein, a position sensor may be operatively associated with a sensed component such that the position sensor generates sensor data (e.g., signals) corresponding to the position of the associated or sensed component. For example, a position sensor may provide a first signal related to a first position of the associated component, to provide a second signal related to a second position of the associated component, and to transition between the first signal and the second signal in response to movement of the associated component through a transitional position. A position sensor may, for example, sense the position of the associated component by detecting the presence or absence of an actuating component within a sensed region, where the actuating component is operatively connected with the associated component.

Figure 21:
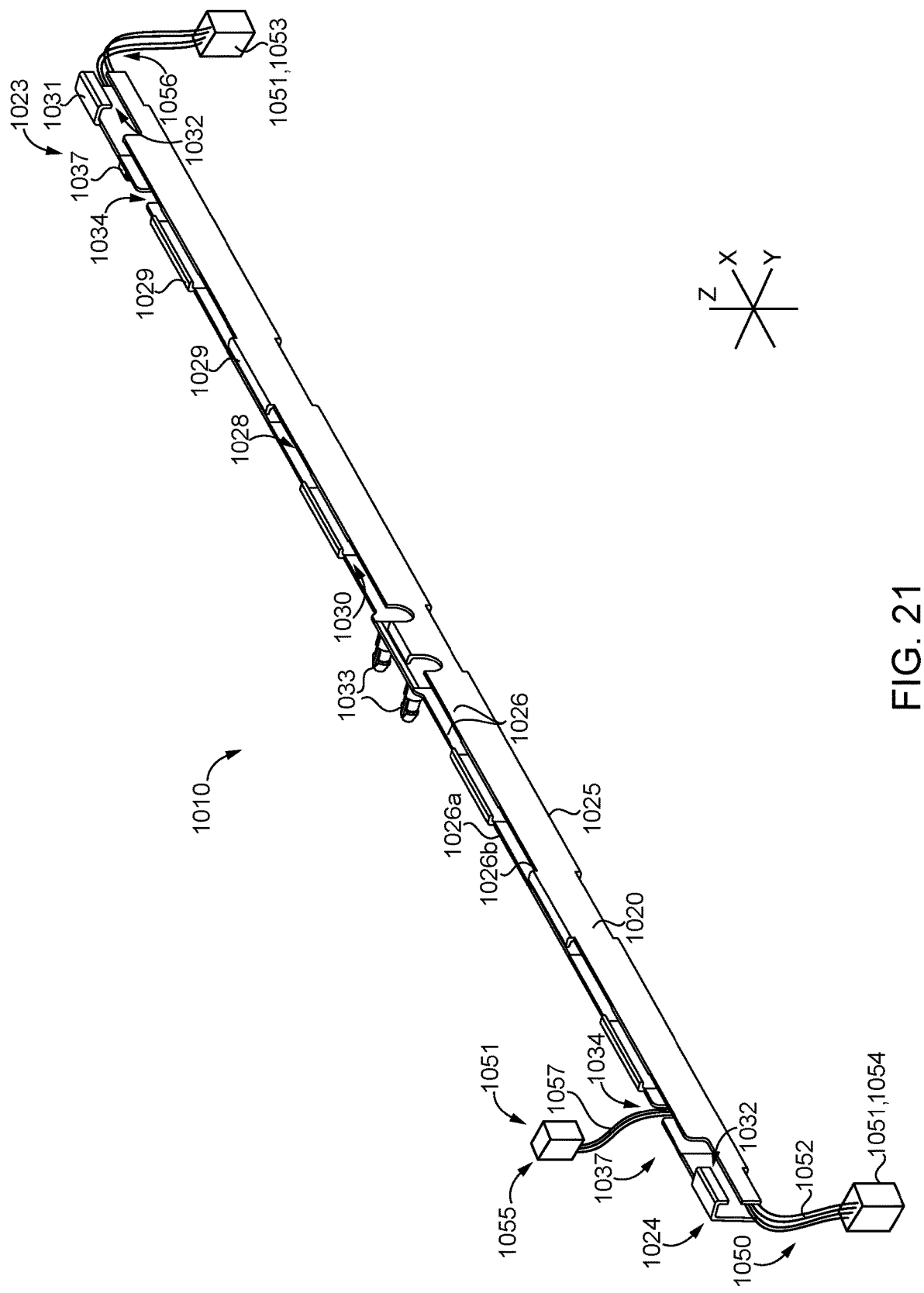
FIG. 21 is a perspective view of a wire management assembly according to one embodiment.

With additional reference to FIG. 21, the wire management assembly 1010 includes a longitudinally-extending conduit 1020 and a main wire harness 1050 received in the conduit 1020. The conduit 1020 has a proximal end 1023 and a distal end 1024. The conduit 1020 includes a base portion 1025 and a pair of transversely-spaced sidewalls 1026, including an inner first sidewall 1026a and an outer second sidewall 1026b. The sidewalls 1026 extend laterally outward from the base portion 1025 such that a channel 1028 is formed therebetween. The sidewalls 1026 include a series of alternating flanges 1029, each of which extends across a portion of the transverse width of the gap 1030 separating the laterally-outward edges of the sidewalls 1026.

The illustrated conduit 1020 also includes a pair of wire-receiving recesses 1034, each of which extends laterally from the edge of the inner wall 1026a toward the base portion 1025. The conduit 1020 may further include a pair of hooks 1031 formed near the proximal and distal ends 1023, 1024 thereof. In the illustrated form, each hook 1031 extends transversely from the inner sidewall 1026a and laterally covers an end portion of the channel 1028. The illustrated conduit 1020 also includes a pair of end slots 1032, each of which connects the gap 1030 to a corresponding open end of the channel 1028.

When installed to the exit device 100, the conduit 1020 is mounted to the mounting assembly 110 with the inner wall 1026a facing the mounting brackets 114 and the outer wall 1026b facing a sidewall of the channel member 111. To facilitate such installation, the conduit 1020 may include features that engage one or more fixed components of the mounting assembly 110. For example, the conduit 1020 may include a pair of clips 1037 extending from the inner wall 1026a near opposite ends of the conduit 1020, and the clips 1037 may engage openings in the base plate 112 to aid in retaining the position of the conduit 1020. In the illustrated form, the conduit 1020 also includes a pair of posts 1033 extending transversely from the inner wall 1026a, and one of the posts 1033 extends into an opening in one of the mounting brackets 114 to engage the mounting bracket 114. In other embodiments, the posts 1033 may be omitted, for example to facilitate insertion of the conduit 1020 into the channel member 111 from one end thereof.

When the wire management assembly 1010 is installed to the exit device 100, the conduit 1020 shields the wire harness 1050 from the moving components of the drive assembly 120. More specifically, the conduit 1020 discourages the wire harness 1050 from interfering with operation of the exit device 100, thereby reducing the risk of damage to the wire harness 1050. In other embodiments, the conduit 1020 may be omitted, and the wire harness 1050 may be discouraged from interfering with the drive assembly 120 in another manner. For example, the wire harness 1050 may extend through a passage formed between the base plate 112 and the base wall of the channel member 111.

The main wire harness 1050 is received in the conduit 1020 and extends through the channel 1028. The wire harness 1050 includes a plurality of connectors or interfaces 1051 that are connected with one another via a plurality of wires 1052. Each of the wires 1052 extends between and is connected to a corresponding pair of interfaces 1051 to transmit electrical signals between the interfaces 1051. In the illustrated embodiment, the plurality of interfaces 1051 includes a proximal interface 1053, a distal interface 1054, and an intermediate interface 1055. The distal interface 1054 is connected to the proximal interface 1053 via a first subset 1056 of the wires 1052, and is connected to the intermediate interface 1055 via a second subset 1057 of the wires 1052.

As will be appreciated, each of the interfaces 1051 may be configured to engage a mating interface to place the wires 1052 in electrical communication with wires and/or circuitry connected to the mating interface. Engagement between two mating interfaces may be provided at least in part by one or more sets of mating male-female connections, such as plug-socket connections.

When installed, the wire harness 1050 may simplify or otherwise facilitate the installation of electronic components to the exit device 100. For example, two components installed on longitudinally opposite sides of the pushbar 130 may be placed in communication with one another by simply engaging an interface of each component with a corresponding one of the interfaces 1053, 1054. Thus, the wire management assembly 1010 may eliminate one or more actions that would otherwise be needed to connect the components, such as running wires through the channel member 111 and/or soldering the wires to the installed components.

The wire management assembly 1010 may facilitate installation of the sensor assembly 1000 by providing the proximal and intermediate interfaces 1053, 1055 near the locations at which the header sensor assembly 1100 and REX sensor assembly 1200 are to be installed, and by providing the distal interface 1054 near the location at which the control module 1070 is or will be installed. As a result, the control module 1070 may be easily placed in communication with the sensor assemblies 1100, 1200 by engaging the interfaces 1051 with mating interfaces of the control module 1070 and sensor assemblies 1100, 1200.

In the illustrated form, the wire management assembly 1010 includes a single conduit 1020 and a single wire harness 1050. In other embodiments, the wire management assembly 1010 may further include a second conduit 1020 and/or one or more additional wire harnesses 1050. In such forms, the conduits 1020 may be installed to opposite sides of the exit device 100. In certain forms, each interface 1051 of each of the wire harnesses 1050 may be in use (i.e., connected to a corresponding electronic component), such that each wire transmits signals between a first electronic component connected to one of the interfaces 1051 and a second electronic component connected to another of the interfaces 1051. In other embodiments, one or more of the interfaces 1051 may be at least partially unused such that one or more of the wires 1052 is not used to transmit signals between two electronic components. In such forms, the originally-unused wires can later be connected with a previously-absent electronic component via the at least partially unused interface 1051, which may facilitate upgrading or otherwise retrofitting the exit device 100.

In the illustrated form, the conduit 1020 is substantially symmetrical such that the proximal half is a mirror image of the distal half. While other embodiments of the wire management assembly 1010 may include asymmetrical conduits, the symmetry of the illustrated conduit 1020 may facilitate installation of the conduit 1020 on opposite sides of the exit device 100. For example, one of the mounting posts 1033 may engage the proximal mounting bracket 114 when the conduit 1020 is installed to one side of the exit device 100, and the other of the mounting posts 1033 may engage the proximal mounting bracket 114 when the conduit 1020 is installed to the other side of the exit device 100. In some embodiments, the conduit 1020 may be at least symmetric with respect to the functional structures of the conduit 1020.

In certain embodiments, the wire management assembly 1010 may be provided in a kit configured for use with an exit device 20. An example of a kit 1300' configured for use with the exit device 100 is described below with reference to FIGS. 29 and 30. In other embodiments, an exit device 20 may include the wire management assembly 1010 at the time of sale. As one example, an electric version of the exit device 100 may be sold with one or more sensors (e.g., the sensors of the sensor assembly 1000) connected to the control module 1070 via the wire harness 1050.

In certain embodiments, the wire management assembly 1010 may be included in a "retrofit-ready" version of the exit device 100 in which one or more of the interfaces 1051 are at least partially unused. As one example, an "upgrade-ready" version of the exit device 100 may be sold with the control module 1070 and wire management assembly 1010 installed, and one or more wires of the wire harness 1050 may be unused by the control module 1070. As another example, an "electric-ready" version of the exit device 100 may be sold as a purely mechanical exit device that includes the wire management assembly 1010 but does not include electronic components. In these and other embodiments, the wire management assembly 1010 may enable a consumer to more readily retrofit the exit device 100 by facilitating the installation of one or more electronic components that were absent at the time of sale. The electronic components may, for example, be provided in a retrofit kit including modular subassemblies. An example of a kit 1300 including modular subassemblies and a process 1400 for installing such a kit 1300 are described below with reference to FIGS. 28-31.

Figure 23:
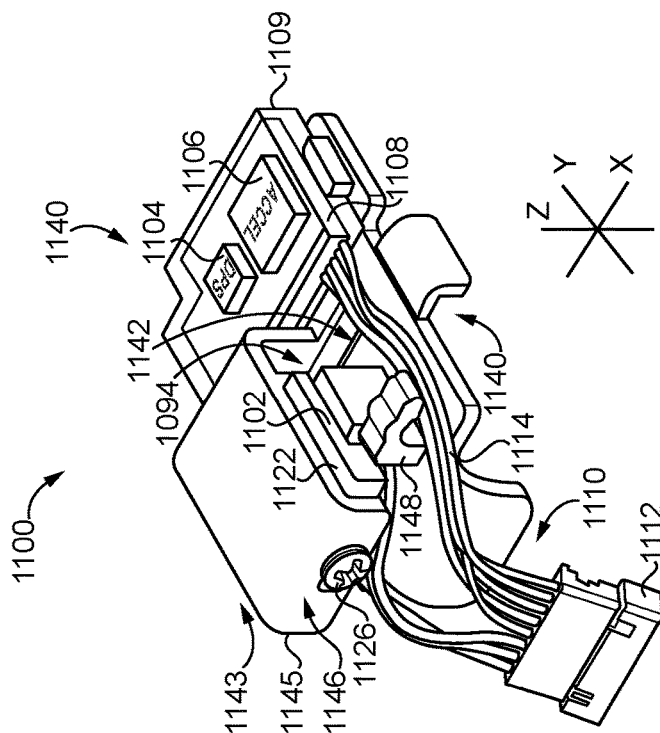
FIG. 23 is a perspective view of the header sensor assembly illustrated in FIG. 22.
Figure 22:
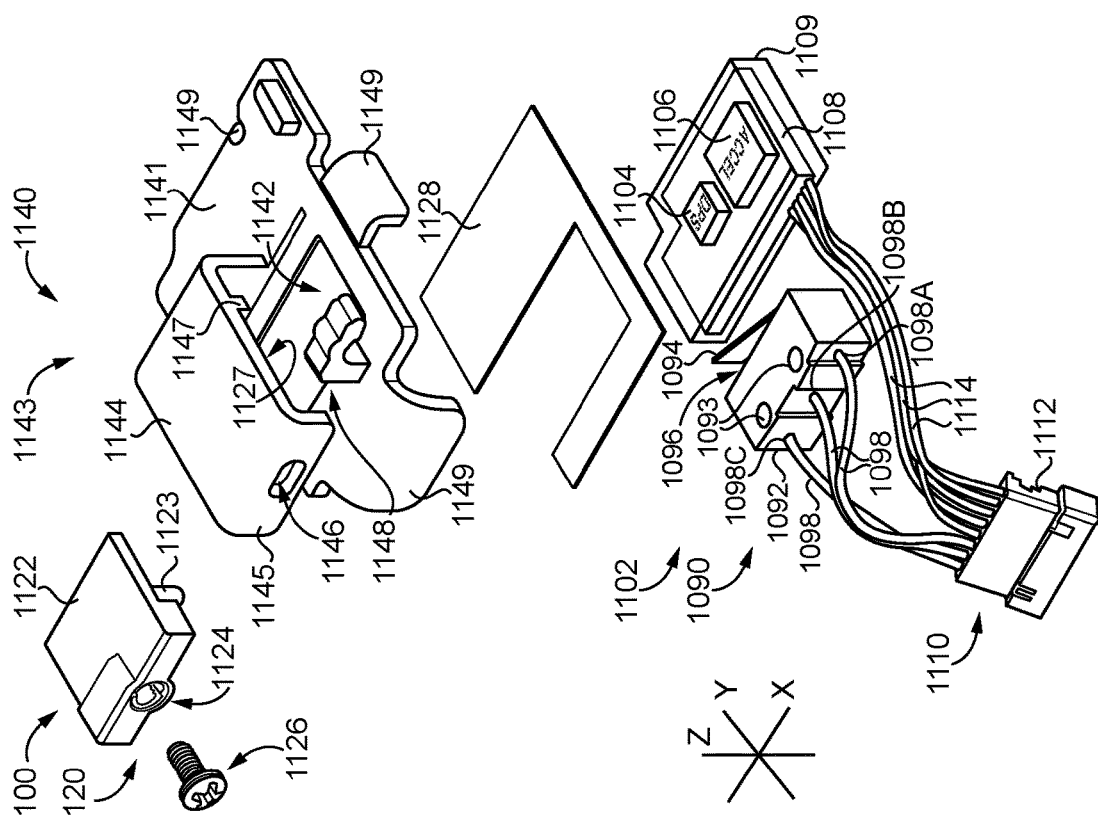
FIG. 22 is an exploded assembly view of a header sensor assembly according to one embodiment.

With additional reference to FIGS. 22 and 23, the illustrative header sensor assembly 1100 includes a latchbolt monitor (LBM) 1102, a door position sensor (DPS) 1104, and an accelerometer 1106. The header sensor assembly 1100 also includes a wire harness 1110 including an interface 1112 and a plurality of wires 1114. The interface 1112 is connected to the sensors 1102, 1104, 1106 via the wires 1114, and is configured to matingly engage the proximal interface 1053 of the main wire harness 1050. In certain embodiments, the header sensor assembly 1100 may be provided as a modular subassembly in a kit. Further, in some embodiments, the header sensor assembly 1100 may include one or more additional and/or alternative inertial sensors 430.

The header sensor assembly 1100 also includes a mounting device 1120, which includes a slider 1122, a screw 1126, and a bracket 1140. The slider 1122 includes a pair of lugs 1123 and a threaded opening 1124 operable to receive and engage the screw 1126. The mounting device 1120 may further include an adhesive member 1128 for mounting the header sensor assembly 1100 to the exit device 100. In the illustrated form, the adhesive member is provided in the form of a double-sided adhesive tape 1128. One side of the tape 1128 is adhered to a bottom of the bracket 1140, and the opposite side of the tape 1128 is covered by a protective film that is removed during the installation process.

The LBM 1102 is one embodiment of the latchbolt sensor 424, and in the illustrated form includes a snap action switch 1090. The switch 1090 includes a body portion 1092, a leaf spring or actuating arm 1094, an actuating button 1096, and a plurality of terminals 1098. The body portion 1092 includes a pair of openings 1193, and the switch 1090 may be mounted to the slider 1122 by inserting the lugs 1123 into the openings 1193. In certain embodiments, the LBM 1102 may be considered to include the slider 1122, for example when the switch 1090 is mounted to the slider 1122. The actuating arm 1094 has an extended position and a depressed position, and is biased to the extended position by the resiliency of the leaf spring of which it is formed. Similarly, the actuating button 1096 has an extended position and a depressed position, and is biased to the extended position. The plurality of terminals 1098 includes a ground or common terminal 1098A, a normally-open terminal 1098B, and a normally-closed terminal 1098C. The common terminal 1098A is selectively connected to and disconnected from the terminals 1098B, 1098C by movement of the actuating button 1096 between the extended and depressed positions.

The LBM 1102 is configured to be operatively associated with the latchbolt 142 such that the output of the LBM 1102 varies in response to movement of the latchbolt 142. As described in further detail below with reference to FIG. 24, the illustrated LBM 1102 is configured to be operatively associated with the latchbolt 142 via an intermediate associated component in the form of a retractor 144 including an extension 165. The associated component has a first position, a second position, and an intermediate transitional position, each of which corresponds to a respective position of the latchbolt 142. Movement of the associated component between the first and second positions causes the LBM 1102 to transition between first and second states as the associated component moves through the transitional position. Further details regarding the operation of the LBM 1102 and an associated component in the form of an extension 165 are provided below with reference to FIG. 24.

When the associated component is in the first position, the actuating arm 1094 and the actuating button 1096 are in the extended positions thereof, and the switch 1090 is in a default state. As the associated component moves toward the transitional position in a first direction, the associated component moves the actuating arm 1094 toward the depressed position thereof. As the associated component passes through the transitional position in the first direction, the actuating arm 1094 moves the actuating button 1096 to the depressed position thereof, thereby transitioning the switch 1090 from the default state to a non-default state.

When the associated component is in the second position, the actuating arm 1094 and the actuating button 1096 are retained in the depressed positions thereof, thereby maintaining the non-default state of the switch 1090. As the associated component moves toward the transitional position in a second direction opposite the first direction, the actuating arm 1094 flexes outward toward the extended position thereof. As the associated component passes through the transitional position in the second direction, the actuating arm 1094 allows the actuating button 1096 to return to the extended position thereof, thereby transitioning the switch 1090 from the non-default state to the default state.

The LBM 1102 may be considered to provide a first signal when the switch 1090 is in the default state. With the switch 1090 in the default state, the common terminal 1098A is connected to the normally closed terminal 1098C and is disconnected from the normally open terminal 1098B. As a result, the switch 1090 is operable to transmit current between the common terminal 1098A and the normally closed terminal 1098C, and is not operable to transmit current between the common terminal 1098A and the normally open terminal 1098B. Thus, the first signal provided by the LBM 1102 may include the transmission of current via the normally closed terminal 1098C and/or the non-transmission of current via the normally open terminal 1098B.

The LBM 1102 may be considered to provide a second signal when the switch 1090 is in the non-default state. With the switch 1090 in the non-default state, the common terminal 1098A is connected with the normally open terminal 1098B and is disconnected from the normally closed terminal 1098C. As a result, the switch 1090 is operable to transmit current between the common terminal 1098A and the normally open terminal 1098B, and is not operable to transmit current between the common terminal 1098A and the normally closed terminal 1098C. Thus, the second signal provided by the LBM 1102 may include the transmission of current via the normally open terminal 1098B and/or the non-transmission of current via the normally closed terminal 1098C.

One of the default state and the non-default state may be considered an actuated state, and the other of the default state and the non-default state may be considered a deactuated state. As a corollary, one of depressing and extending the actuating arm 1094 may be considered to actuate the switch 1090, and the other of depressing and extending the actuating arm 1094 may be considered to deactuate the switch 1090. Thus, the transitional position of the associated component may also be considered to define an actuation point. In certain descriptions herein, the default and non-default states may respectively be referred to as the actuated and deactuated states, while in other descriptions the references may be reversed. It is to be understood, however, that such correlations between the default and non-default states and the actuated and deactuated states may be specific to a particular context, and do not necessarily apply to other contexts.

The illustrated DPS 1104 is an embodiment of a door position sensor 420, and the accelerometer 1106 is one embodiment of an inertial sensor 430. In the illustrated embodiment, the DPS 1104 comprises a magnetometer configured to be operatively associated with a magnet. The DPS 1104 and accelerometer 1106 may be mounted to a shared printed circuit board (PCB) 1108 connected to the wire harness 1110. The PCB 1108 is mounted to the bracket 1140, and a cover 1109 may be mounted to the PCB 1108 to provide protection for the DPS 1104 and the accelerometer 1106.

The bracket 1140 includes a base plate 1141, a longitudinal slot 1142 formed in the base plate 1141, and a mounting hook 1143 extending from the base plate 1141. The mounting hook 1143 includes a body portion 1144 that is laterally offset from the base plate 1141 and extends transversely across the slot 1142. One end of the body portion 1144 is bent toward the base plate 1141 and forms a flange 1145, which includes a longitudinally-elongated opening 1146 operable to receive the shaft of the screw 1126. The mounting hook 1143 also includes a ridge 1147, which protrudes from the body portion 1144 and extends longitudinally in a direction substantially parallel to the flange 1145. The laterally offset base plate 1141 and body portion 1144 cooperate with the transversely offset flange 1145 and ridge 1147 to define a receiving space 1127. The receiving space 1127 is connected with the longitudinal slot 1142 and is structured to receive the slider 1122 and the switch 1090 mounted thereon. The illustrated bracket 1140 also includes a guide finger 1148 and/or one or more positioning flanges 1149, the function of which are described in further detail below.

With the switch 1090 mounted to the slider 1122, the LBM 1102 may be considered to be in an assembled state in which it includes the switch 1090 and the slider 1122, and the assembled LBM 1102 may be inserted into the receiving space 1127. The transverse width of the receiving space 1127 may correspond to the width of the slider 1122 such that the flange 1145 and the ridge 1147 act as guides during insertion or other longitudinal movement of the slider 1122. When received in the receiving space 1127, the slider 1122 may be joined to the mounting hook 1143 by inserting the screw 1126 into the threaded opening 1124 of the slider 1122 through the elongated opening 1146 in the flange 1145. The LBM 1102 may then be secured to the bracket 1140 by tightening the screw 1126, thereby clamping the flange 1145 between the slider 1122 and the head of the screw 1126.

With the LBM 1102 coupled to the bracket 1140, the switch 1090 is positioned between the slider 1122 and the base plate 1141, and the actuating arm 1094 is located above the longitudinal slot 1142. Additionally, the longitudinal position of the LBM 1102 may be selectively adjusted by loosening the screw 1126. With the screw 1126 loosened, the LBM 1102 is free to move longitudinally within the limited range provided by the elongated opening 1146. Once a desired longitudinal position has been obtained, the position of the LBM 1102 may be fixed by once again tightening the screw 1126. It is also contemplated that the header sensor assembly 1100 may include additional or alternative provisions for adjusting the position of the LBM 1102, such as a worm.

When installed to the exit device 100, the header sensor assembly 1100 is mounted to the header bracket 160, and is in communication with the controller 1076 via the main wire harness 1050. More specifically, the proximal interface 1053 is connected to the interface 1112 of the header sensor assembly wire harness 1110, and the distal interface 1054 is connected to an interface 1078 of the PCBA 1072. In the illustrated form, each of the wire harness interfaces 1053, 1054 is matingly engaged with a corresponding one of the electronic component interfaces 1078, 1112. It is also contemplated that one or more of the wire harness interfaces 1053, 1054 may be connected to the corresponding electronic component interface 1078, 1112 in another manner, such as via one or more intermediate interfaces and/or other paths of electrical communication.

Figure 24:
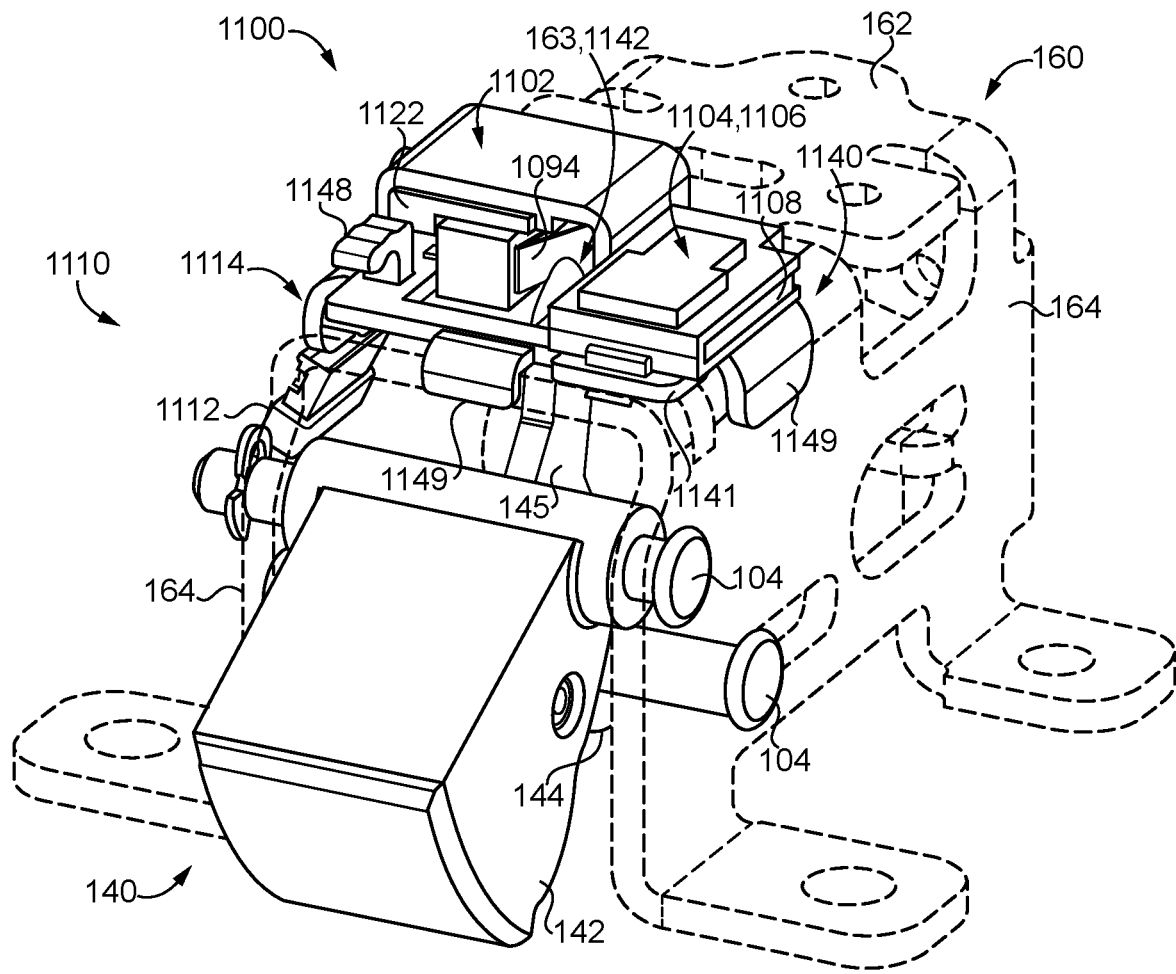
FIG. 24 is a perspective view of the header sensor assembly illustrated in FIG. 22 and a portion of the exit device illustrated in FIG. 3.

With additional reference to FIG. 24, the header bracket 160 includes a base wall 162 and a pair of transversely-spaced side walls 164 that extend laterally from the base wall 162. In the illustrated embodiment, the header sensor assembly 1100 is mounted to the header bracket 160 by the double-sided adhesive tape 1128, which adheres the base plate 1141 to the base wall 162. In other embodiments, the bracket 1140 may be joined to the base wall 162 using one or more additional or alternative fasteners, such as a screw, rivet, and/or clip. With the bracket 1140 mounted to the header bracket 160, the slot 1142 in the base plate 1141 is generally aligned with a longitudinally-extending slot 163 formed in the base wall 162. The positioning flanges 1149 may engage the proximal edge of the base plate 162 and/or one or both of the side walls 164 to facilitate proper positioning of the base plate 1141 relative to the bracket 160 during installation of the header sensor assembly 1100. In other embodiments, the base wall 1141 and/or the header bracket 160 may include additional and/or alternative alignment features, or alignment features may be omitted.

As noted above, each of the latchbolt 142 and the retractor 144 is movably mounted to the header bracket 160, and the latchbolt 142 and retractor 144 are connected to one another such that movement of either of the components causes movement of the other component. The retractor 144 includes an extension 145, which extends through the aligned slots 163, 1142 and moves in opposite directions during extension and retraction of the latchbolt 142. In the illustrated embodiment, the extension 145 moves in the proximal direction as the latchbolt 142 moves in the retracting direction, and moves in the distal direction as the latchbolt 142 moves in the extending direction. The wires 1114 connected with the DPS 1104 and the accelerometer 1106 may be passed under the finger 1148 such that the finger 1148 discourages the wires 1114 from interfering with movement of the extension 145. In the illustrated embodiment, the latchbolt 142 and retractor 144 are connected to one another such that movement of the latchbolt 142 causes movement of the retractor 144 with substantially no lost motion. As a result, there is a substantially one-to-one correlation between the position of the extension 145 and the position of the latchbolt 142.

With the header sensor assembly 1100 installed, the LBM 1102 is operable to sense the extended/retracted position of the latchbolt 142. In the illustrated embodiment, the LBM 1102 is operatively associated with the latchbolt 142 via the retractor 144, the position of which corresponds to that of the latchbolt 142. Additionally, the actuating arm 1044 of the switch 1090 extends into the path along which the extension 145 travels such that the extension is operable to selectively actuate the LBM 1102 by moving the actuating arm 1094 between the extended and depressed positions thereof. As noted above, the extension 145 is configured to travel between a proximal first position and a distal second position as the latchbolt 142 extends and retracts. When in the proximal first position, the extension 145 permits the actuating arm 1094 to remain in the extended position thereof, thereby setting the switch 1090 to the default state. When in the distal second position, the extension 145 depresses the actuating arm 1094, thereby setting the switch 1090 to the non-default state.

As is evident from the foregoing, the state of the switch 1090 may correspond to the position of the extension 145, which is the moving component that actuates the LBM 1102. As a result, the output of the LBM 1102 is indicative of the extended/retracted position of the latchbolt 142. In the illustrated form, the proximal first position of the extension 145 corresponds to the fully retracted position of the latchbolt 142, and the distal second position of the extension 145 corresponds to the fully extended position of the latchbolt 142. Thus, the output of the LBM 1102 when the switch 1090 is in the default state may be interpreted as a signal indicating that the latchbolt 142 is in the retracted position, and the output of the LBM 1102 when the switch 1090 is in the non-default state may be interpreted as a signal indicating that the latchbolt 142 is in the extended position. It is also contemplated that the correlations may be reversed, such that the default and non-default states of the switch 1090 respectively correspond to the extended and retracted positions of the latchbolt 142. As one example, the switch 1090 of the LBM 1102 may be positioned such that the extension 145 depresses the actuating arm 1044 when the latchbolt 142 is in the retracted position. As another example, the latchbolt assembly 140 may be configured such that the extension 145 is in the proximal first position when the latchbolt 142 is in the extended position, and is in the distal second position when the latchbolt 142 is in the retracted position.

Additionally, while the illustrated LBM 1102 includes a snap action switch 1090 that is selectively actuated by physical contact of the extension 145 with the actuating arm 1094, it is also contemplated that the LBM 1102 may be operatively associated with the latchbolt 142 in another manner. As one example, the LBM 1102 may include an optical sensor that detects the presence or absence of the extension 145 within a sensed region. As another example, the extension 145 may be formed of or otherwise include a magnetized material, and the LBM 1102 may include a magnetic sensor such as a Hall effect sensor or a reed switch.

As noted above, the output of the LBM 1102 varies with the position of the extension 145 such that the LBM 1102 is operable to provide signals related to the extended/retracted position of the latchbolt 142. In the illustrated embodiment, the LBM 1102 is provided as a snap action switch 1090 having discrete outputs corresponding to the extended and retracted positions of the latchbolt 142. Additionally, the LBM 1102 is configured to transition between a first signal indicative of the latchbolt retracted position and a second signal indicative of the latchbolt extended position in response to movement of the latchbolt 142 through a defined actuation point or transitional position. Thus, the LBM 1102 provides the latchbolt retracted signal when the latchbolt 142 is retracted beyond the defined transitional position, and provides the latchbolt extended signal when the latchbolt 142 is extended beyond the defined transitional position. As described hereinafter, the adjustment provisions of the header sensor assembly 1100 may enable a user to set the defined transitional position according to a desired transitional position.

As will be appreciated, the actuation point or transitional position for the LBM 1102 (i.e., the position of the latchbolt 142 that causes the switch 1090 to transition between the default state and the non-default state) depends upon a number of factors, including the relative positions of the LBM 1102 and the extension 145. If the LBM 1102 is not installed in the appropriate position relative to the extension 145, the switch 1090 may transition states at an incorrect time, which may cause the output of the LBM 1102 to diverge from the actual extended/retracted position of the latchbolt 142. For example, if the header sensor assembly 1100 is installed with the switch 1090 at an improper distal location, the extension 145 may be unable to fully depress the actuating arm 1094, thereby causing the LBM 1102 to provide the latchbolt retracted signal when the latchbolt 142 is in the fully extended position. As another example, if the header sensor assembly 1100 is installed with the switch 1090 at an improper proximal location, the LBM 1102 may provide the latchbolt extended signal when the latchbolt 142 is retracted beyond the desired transitional position. Divergence between the output of the LBM 1102 and the actual position of the latchbolt 142 relative to the desired transitional position may also occur as various components experience wear resulting from use of the exit device 100.

Regardless of the source of the divergence between the output of the LBM 1102 and the actual position of the latchbolt 142 relative to the desired transitional position, the adjustment provisions of the header sensor assembly 1100 may mitigate the risks associated with such divergence. As noted above, the header sensor assembly 1100 may enable the position of the LBM 1102 to be adjusted after the bracket 1140 has been mounted to the header bracket 160. Thus, the installation or maintenance personnel may selectively adjust the defined transitional position to the desired transitional position by adjusting the position of the LBM 1102. In the illustrated embodiment, adjustment of the defined transitional position may be accomplished by loosening the screw 1126, moving the LBM 1102 to a selected position, and subsequently tightening the screw 1126 to retain the LBM 1102 in the selected position. In other embodiments, adjustment of the defined transitional position may be accomplished in another manner. For example, the LBM 1102 may be engaged with the bracket 1140 via worm or set screw such that rotation of the worm or set screw causes movement of the LBM 1102 relative to the bracket 1140.

As noted above, the adjustment provisions of the LBM 1102 may enable adjustment of the defined transitional position according to a desired transitional position. The desired transitional position may depend upon one or more factors, such as user preferences, the type of information that is to be provided to an access control system, and the position of the exit device 100 relative to the strike 90.

In certain situations, it may be advantageous for the LBM 1102 to provide the latchbolt retracted signal only when the latchbolt 142 has been retracted sufficiently to clear the strike 90. In such situations, the desired transitional position may correspond to a strike-clearing position. As will be appreciated, the strike-clearing position for a given latchbolt 142 depends in part upon the relative position of the exit device 100 and the strike 90 when the door 84 is in the closed position. As a result, the strike-clearing position (and thus the desired transitional position) may vary from one exit device to the next, for example due to variations in the installation of the exit devices, strikes, and doors. However, the adjustment provisions of the header sensor assembly 1100 may mitigate the effects of such variations by facilitating the adjustment of the defined transitional position according to the strike-clearing position for a particular exit device 100. With the defined transitional position corresponding to the strike-clearing position, the latchbolt extended signal may indicate that the exit device 100 is capable of retaining the door 84 in the closed position, and the latchbolt retracted signal may indicate that the door 84 is capable of moving between the open and closed positions thereof. In certain embodiments, the secured/unsecured state of the door 84 may be determined based at least in part upon such signals from the LBM 1102. For example, the information generated by the LBM 1102 may be utilized in a process such as the above-described method 700.

In other situations, it may be preferable to for the LBM 1102 to provide the latchbolt extended signal only when the latchbolt 142 is in the fully extended position. For example, it may be desirable for the latchbolt retracted signal to indicate that the latchbolt 142 has moved from the fully extended position, which may indicate that a user is attempting to retract the latchbolt 142. In such situations, the transitional position may be defined at or adjacent to the fully extended position, such as a position between the fully extended position and the strike-clearing position. In the event of a change in circumstances or user preferences, the transitional position of the latchbolt 142 may be adjusted by adjusting the position of the LBM 1102 in the manner described above. As such, the adjustment provisions of the header sensor assembly 1100 may facilitate adjustment of the defined transitional position to a desired transitional position.

In the illustrated embodiment, the DPS 1104 is provided as a magnetometer that is operatively associated with a magnet 94 installed to the strike 90 such that the output of the DPS 1104 varies in response to relative movement of the DPS 1104 and the magnet 94. With the door 84 in the closed position, the relative distance between the DPS 1104 and the magnet 94 is at a minimum, and the output of the DPS 1104 provides a first signal indicative of the door closed position. Thus, the DPS 1104 may be considered to have a first state in response to the door closed position, and may be considered to provide the first or door closed signal when in the first state. As the door 84 moves toward the open position, the distance between the DPS 1104 and the magnet 94 increases. As a result, the magnetic field sensed by the DPS 1104 decreases, thereby causing a change in the output of the DPS 1104. The varying output of the DPS 1104 may be considered to provide a second signal indicative of the door open position when the output thereof crosses a threshold value corresponding to a desired transitional position or actuation point. Thus, the DPS 1104 may be considered to have a second state in response to the door open position, and may be considered to provide the second or door open signal when in the second state. The location of the DPS 1104 within the header assembly of the exit device 100 may facilitate in distinguishing between the door closed position and the door open position by increasing the difference between the magnetic fields sensed when the door 84 is in the open and closed positions.

The accelerometer 1106 is configured to generate signals in response to movement of the door 84. The accelerometer 1106 may, for example, be a multi-axis accelerometer that generates signals related to acceleration in each of a plurality of axes. For example, the accelerometer 1106 may have a first axis aligned with the longitudinal X-axis and a second axis aligned with the lateral Z-axis. Signals related to acceleration along the first axis may be indicative of centripetal acceleration of the door 84, and signals related to acceleration along the second axis may be indicative of angular acceleration of the door 84. The location of the accelerometer 1106 within the header assembly of the exit device 100 may facilitate in the generation of such signals by providing an increased distance between the accelerometer 1106 and the swinging axis of the door 84, thereby increasing the amount of acceleration experienced by the accelerometer 1106.

Figure 25:
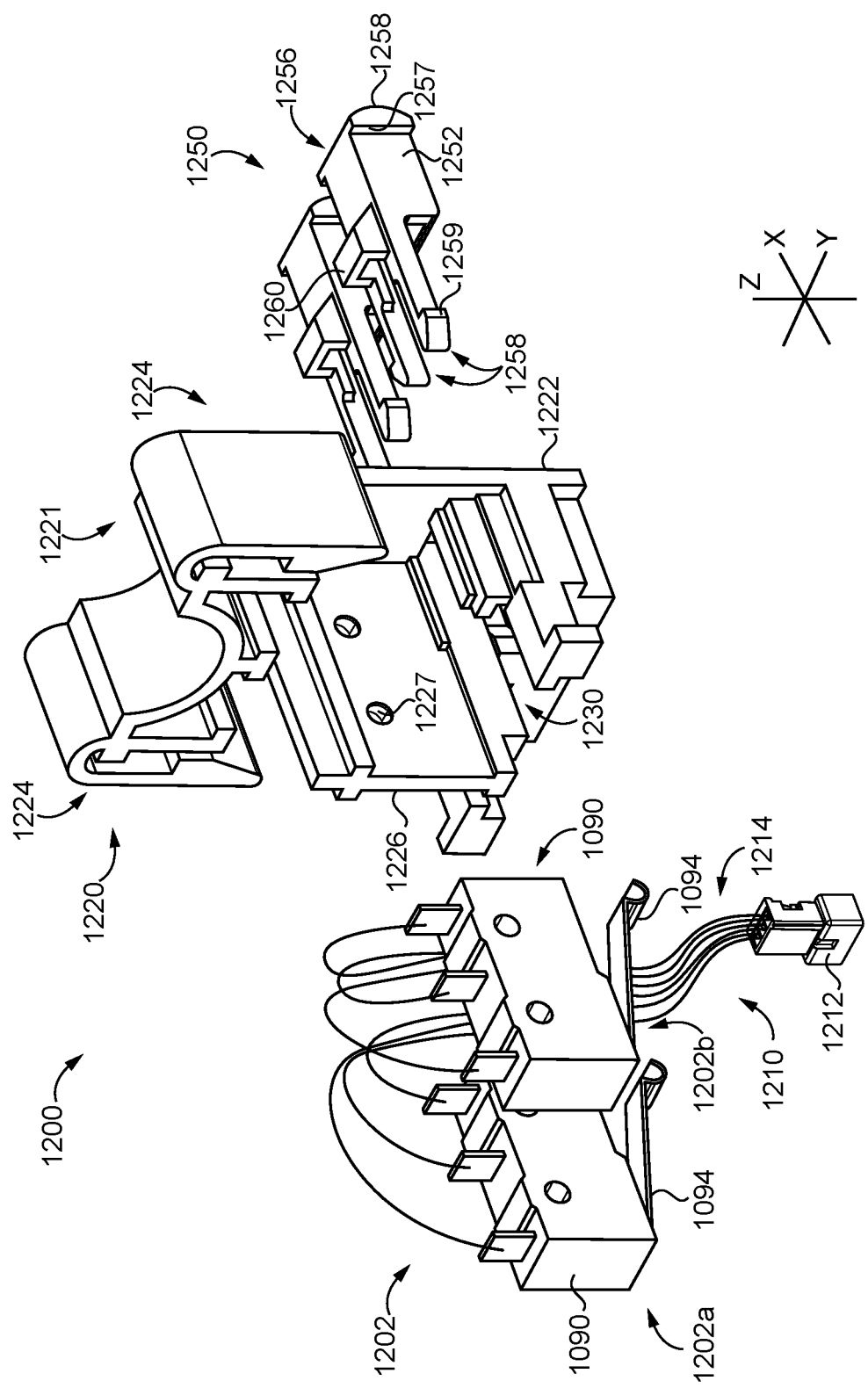
FIG. 25 is an exploded assembly view of a request to exit (REX) sensor assembly according to one embodiment.
Figure 26:
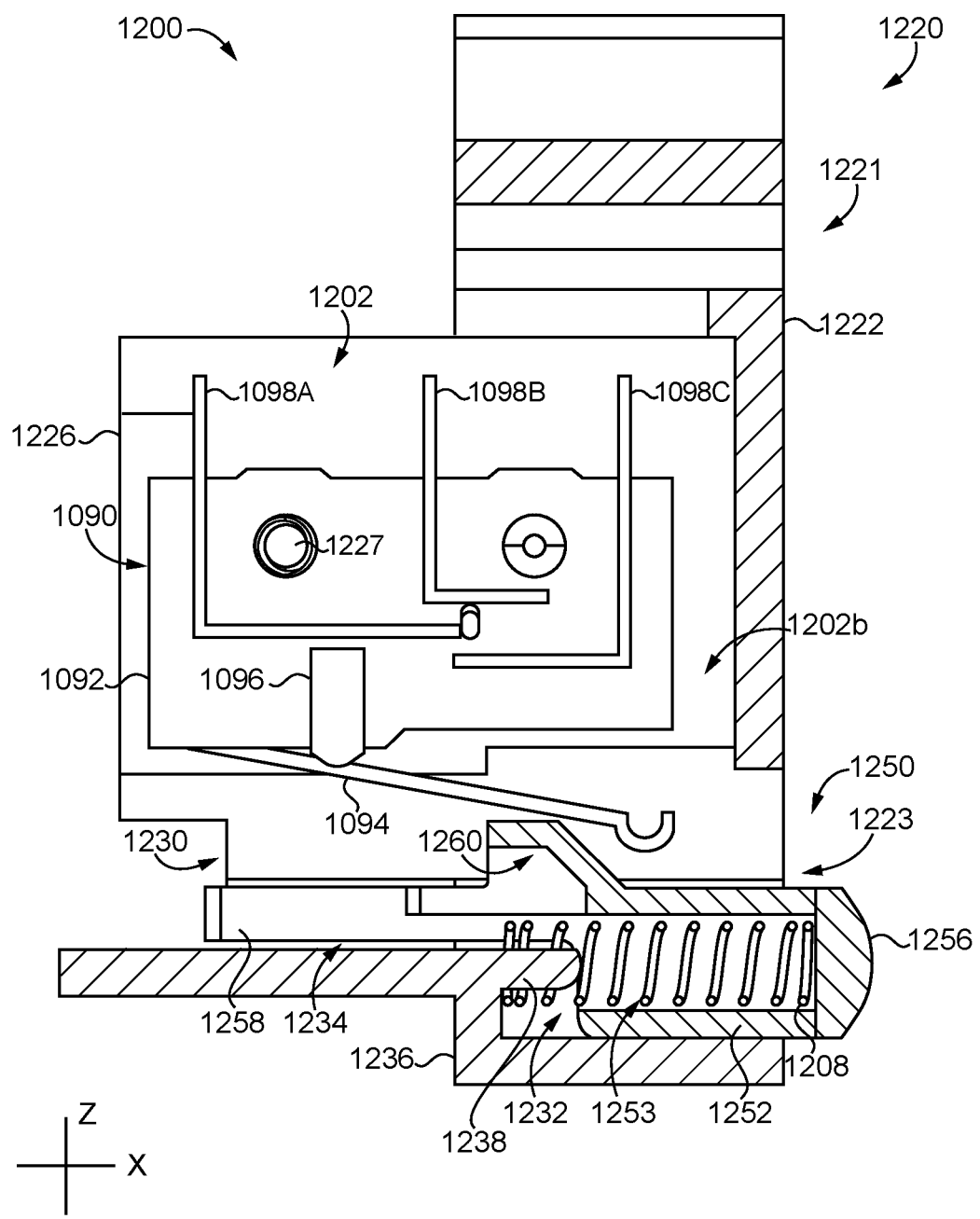
FIG. 26 is a partial cutaway view of the REX sensor assembly illustrated in FIG. 25.

With reference to FIGS. 25 and 26, the REX sensor assembly 1200 includes at least one REX sensor 1202 connected to a wire harness 1210, and a bracket 1220 on which the REX sensor 1202 is mounted. The REX sensor 1202 is one embodiment of the above-described request-to-exit sensor 426, and in the illustrated form includes a snap action switch 1090 and a sliding cam 1250 operable to actuate the switch 1090. Each sliding cam 1250 is movably mounted to the bracket 1220 and is biased toward an extended position by a corresponding biasing member such as a spring 1208. In the illustrated form, the REX sensor assembly 1200 includes two individual REX sensors 1202*a*, 1202*b*. In certain embodiments, the individual REX sensors 1202*a*, 1202*b* may be considered to form a single REX sensor, for example in embodiments in which a request-to-exit signal is determined based on the output of both switches 1090. In other embodiments, the REX sensor assembly 1200 may include a single individual REX sensor 1202*a*, 1202*b*, and the switch 1090 and/or the sliding cam of the other individual REX sensor 1202*a*, 1202*b* may be omitted.

The bracket 1220 includes a body portion 1221 sized to be received between the sidewalls 115 of the mounting bracket 114, and a pair of transversely-spaced hinge clips 1224 configured to engage the sidewalls 115. The body portion 1221 includes a base plate 1222 defining a proximal face of the bracket 1220, and a central wall 1226 extending distally from the base plate 1222. The bracket 1220 also includes a pair of channels 1230, each of which extends distally from a corresponding opening 1223 in the base plate 1222. Each channel 1230 includes a trough 1232 connected to the opening 1223 and a slot 1234 extending distally from the trough 1232. Each trough 1232 is defined in part by a distal wall 1236 having a post 1238 extending proximally therefrom.

The sliding cam 1250 includes a body portion 1252, a pair of clip arms 1254 extending distally from the body portion 1252, and a nose 1256 formed on a proximal side of the body portion 1252. The sliding cam 1250 is slidably received in one of the channels 1230 with the body portion 1252 seated in the trough 1232 and the clip arms 1254 extending through the slot 1234. The sliding cam 1250 is longitudinally movable between a proximal or projected position and a distal or retracted position, and is biased toward the projected position by a spring 1208. In the illustrated embodiment, the spring 1208 is mounted on the posts 1238 and extends into a cavity 1253 formed in the body portion 1252 of the sliding cam 1250. The sliding cam 1250 may be restricted to longitudinal movement between the projected position and the retracted position. In the illustrated form, distal movement is restricted by a shoulder 1257, which is defined by the nose 1256 and engages the face of the base plate 1222 when the sliding cam 1250 is in the retracted position. Additionally, proximal movement is restricted by the clip arms 1254, the shoulders 1255 of which engage the bracket 1220 when the sliding cam 1250 is in the projected position.

Each of the REX sensors 1202 is mounted to the central wall 1226 such that the actuating arm 1094 thereof extends into a corresponding one of the channels 1230. Each actuating arm 1094 is operable to engage a corresponding sliding cam 1250 such that the actuating arm 1094 moves between the extended and depressed positions thereof in response to movement of the sliding cam. In the illustrated embodiment, each ramp 1260 is configured to engage and depress the corresponding actuating arm 1094 as the sliding cam 1250 moves from the retracted position to the projected position.

In FIG. 26, the switch 1090 of the REX sensor 1202*b* is illustrated along with the corresponding sliding cam 1250 in the projected position. In this state, the ramp 1260 is engaged with the actuating arm 1094 and retains the actuating arm 1094 in the depressed position. As a result, the actuating button 1096 is depressed, and the switch 1090 is in the non-default state. As the sliding cam 1250 moves toward the retracted position, the ramp 1260 enables the actuating arm 1094 to move toward the extended position thereof. When the sliding cam 1250 is in the retracted position, the actuating arm 1094 and actuating button 1096 are in the extended positions thereof, and the switch 1090 is in the default state. As described in further detail below, the REX sensor 1202 is operatively associated with a movable component of the drive assembly 120 that causes the switch 1090 to transition between the default and non-default states as the component moves through a transitional position.

When installed to the exit device 100, the REX sensor assembly 1200 is mounted to the distal mounting bracket 114, and is in communication with the controller 1076 via the main wire harness 1050. More specifically, the intermediate interface 1055 is connected to the interface 1212 of the REX sensor assembly wire harness 1210, and the distal interface 1054 is connected to an interface 1078 of the PCBA 1072. In the illustrated form, each of the wire harness interfaces 1054, 1055 is matingly engaged with a corresponding one of the electronic component interfaces 1078, 1212. It is also contemplated that one or more of the wire harness interfaces 1054, 1055 may be connected to the corresponding electronic component interface 1078, 1212 in another manner, such as via one or more intermediate interfaces and/or other paths of electrical communication.

Figure 27:
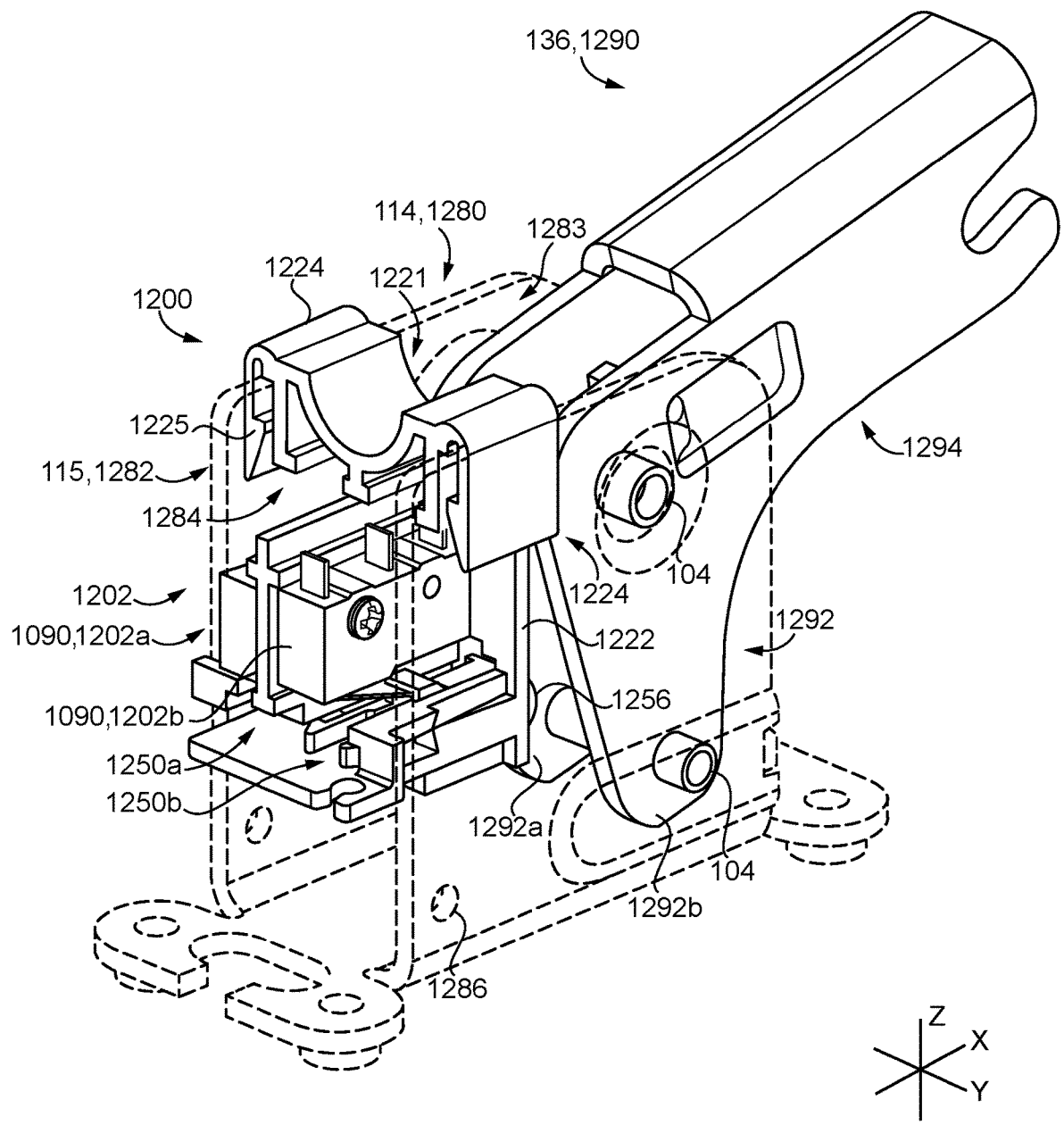
FIG. 27 is a perspective view of the REX sensor illustrated in FIG. 25 and a portion of the exit device illustrated in FIG. 3.

FIG. 27 illustrates a portion of the exit device 100 with the REX sensor assembly 1200 installed to the exit device 100. When installed, the REX sensor assembly 1200 is mounted to one of the mounting brackets 114 adjacent one of the bell cranks 136, which are respectively designated in FIG. 27 as the mounting bracket 1280 and bell crank 1290. The bracket 1220 is dimensioned such that the body 1221 thereof fits in the receiving space 1283 between the transversely-offset walls 1282 of the mounting bracket 1280. With the bracket 1220 so positioned, each hinge clip 1224 engages a corresponding one of the walls 1282. Each wall 1282 may include a slot 1284 that receives the protruding lip 1225 of the engaged hinge clip 1224 to provide for appropriate longitudinal positioning of the REX sensor assembly 1200 relative to the mounting bracket 114. Each wall 1282 may further include an aperture 1286 sized to receive the mounting post 1033 of the conduit 1020.

The bell crank 1290 is pivotably mounted to the mounting bracket 114 by a pivot pin 104, which defines a pivot axis 1291 for the bell crank 1290. The bell crank 1290 includes a first arm 1292 that is pivotably connected to the drive bar 122 by another pivot pin 104, and a second arm 1294 that is pivotably connected to a pushbar bracket 134 by a further pivot pin 104 (FIG. 3). Additionally, the first arm 1292 includes first and second legs 1292a, 1292b that are transversely spaced from one another. As noted above with respect to the bell crank 136, the bell crank 1290 is configured to pivot about the pivot pin 104 as the drive assembly 120 moves between the actuated and deactuated positions thereof. The bell crank 1290 has a first position corresponding to the fully actuated state of the drive assembly 120, and a second position corresponding to the fully deactuated state of the drive assembly 120.

With the REX sensor assembly 1200 installed, the REX sensor 1202 is operatively associated with the bell crank 1290. More specifically, each of the slider cams 1250 is aligned with a corresponding one of the legs 1292a, 1292b such that the slider cams 1250 extend into the path along which the first arm 1292 travels as the bell crank 1290 pivots between the first and second positions thereof. With the bell crank 1290 in the first position, the first arm 1292 is engaged with the slider cam 1250 and retains the slider cam 1250 in the retracted position against the force of the spring 1208. With the slider cam 1250 in the retracted position, the actuating arm 1094 and actuating button 1096 are in the extended positions thereof, thereby setting the switch 1090 in the default state. With the bell crank 1290 in the second position, the first arm 1292 is disengaged from the slider cam 1250, and the spring 1208 urges the slider cam 1250 to the projected position. With the slider cam 1250 in the projected position, the ramp 1260 retains the actuating arm 1094 and actuating button 1096 in the depressed positions thereof, thereby setting the switch 1090 to the non-default state.

As is evident from the foregoing, the output of the REX sensor 1202 may correspond to the actuated/deactuated state of the drive assembly 120. With the drive assembly 120 in the actuated state, the switch 1090 is in the default state, and the REX sensor 1202 provides a first signal. The first signal may indicate that a user has depressed the pushbar 132 in an attempt to exit through the door 84, and accordingly may be referred to as a positive REX signal indicative of the presence of a request to exit. With the drive assembly 120 in the deactuated state, the switch 1090 is in the non-default state, and the REX sensor 1202 provides a second signal. The second signal may indicate that the pushbar has not been depressed by a user attempting to exit through the door 84, and accordingly may be referred to as a negative REX signal indicative of the absence of a request to exit.

The REX sensor 1202 is configured to transition between the positive REX signal and the negative REX signal in response to movement of the bell crank 1290 through at least one transitional position, which may correspond to a transitional position of the pushbar 132. During actuation of the drive assembly 120, the bell crank 1290 passes through the transitional position in a first direction, thereby moving the slider cam 1250 toward the retracted position and transitioning the output of the REX sensor 1202 from the negative REX signal to the positive REX signal. During deactuation of the drive assembly 120, the bell crank 1290 passes through the transitional position in a second direction opposite the first direction, thereby permitting the slider cam 1250 to move toward the projected position under the biasing force of the spring 1208 and transitioning the output of the REX sensor 1202 from the positive REX signal to the negative REX signal.

As will be appreciated, the transitional position for the REX sensor 1202 (i.e., the position of the bell crank 1290 at which the switch 1090 transitions between the default and non-default states thereof) depends upon a number of factors, including the relative positions of the switch 1090 and the ramp 1260 when the sliding cam 1250 is in the projected position. For example, if a switch 1090 were moved in the proximal direction (to the right in FIG. 26) and/or the laterally outward direction (upward in FIG. 26), the REX sensor 1202 may transition to the positive REX signal at an earlier point during actuation of the drive assembly 120, thereby providing the REX sensor 1202 and bell crank 1290 with an earlier transitional position. Conversely, if a switch 1090 were moved in the distal direction (to the left in FIG. 26) and/or the laterally inward direction (downward in FIG. 26), the REX sensor 1202 may transition to the positive REX signal at a later point during actuation of the drive assembly 120, thereby providing the REX sensor 1202 and bell crank 1290 with a later transitional position.

As described in further detail below, the illustrated REX sensor assembly 1200 is configured to provide the REX sensor 1202 with multiple transitional positions. More specifically, the switches 1090 of the individual REX sensors 1202a, 1202b are mounted at different longitudinal and/or lateral positions such that the transitional position for the first individual REX sensor 1202a is later than the transitional position for the second individual REX sensor 1202b. As a result, the sensor 1202a transitions from the negative REX state to the positive REX state at a later point in the actuation of the drive assembly than the sensor 1202b.

The REX sensor assembly 1200 may additionally or alternatively be configured to provide the REX sensor 1202 with a selectable and/or adjustable transitional position. For example, the bracket 1220 may include features to assist in mounting the switches 1090 at different lateral and/or longitudinal positions relative to the bracket 1220. In the illustrated embodiment, each side of the central wall 1226 includes a mounting feature 1227 (e.g., one or more openings and/or posts) that facilitates mounting of the switch 1090 to the corresponding side of the wall 1226, and the mounting features 1227 on opposite sides of the wall 1226 have different lateral and/or longitudinal positions. Thus, the REX sensor 1202 may be provided with the later transitional position of the first sensor 1202a and/or the earlier transitional position of the second sensor 1202b by mounting a switch 1090 to the wall 1226 using the mounting feature 1227 corresponding to the desired transitional position. As another example, the REX sensor assembly 1200 may include adjustment provisions that facilitate positional adjustment of a mounted switch 1090. For example, a switch 1090 may be mounted to the bracket 1220 via a slider such that the transitional distance for the REX sensor 1202 is selectively adjustable. An example of a slider that provides a selectively adjustable position for a switch 1090 is described above with reference to FIGS. 22 and 23.

As noted above, the switches 1090 of the illustrated REX sensor assembly 1200 are mounted such that the first individual REX sensor 1202*a* has a later transitional position than the second individual REX sensor 1202*b*. As a result, individual the REX sensors 1202*a*, 1202*b* will transition between the negative first REX signal and the positive second REX signal at different times during the actuation and deactuation of the drive assembly 120. More specifically, as the drive assembly 120 moves from the deactuated state to the actuated state, the REX sensor 1202*a* having the later transitional position will transition from the negative REX signal to the positive REX signal at a later time than the REX sensor 1202*b* having the earlier transitional position. Thus, the first REX sensor 1202*a* may also be referred to as a "later" REX sensor that provides the positive REX signal at a later point in the actuating movement of the pushbar 132, and the second REX sensor 1202*b* may also be referred to as an "earlier" REX sensor that provides the positive REX signal at an earlier point in the actuating movement of the pushbar 132.

As such, the REX sensors 1202*a*, 1202*b* of the illustrated REX sensor assembly 1200 transition between the positive REX signal and the negative REX signal at different times during the actuation and deactuation of the drive assembly 120. This feature may provide the controller 1076 with an increased range of options for monitoring the REX state of the exit device 100, which may facilitate customization of the process by which the exit device 100 is monitored and/or controlled. For example, in the event that it is desired to provide the positive REX signal when the pushbar 132 at a relatively early point during actuation of the drive assembly, the state of the earlier REX sensor 1202*b* may be used in determining the actuated/deactuated state of the drive assembly 120. Conversely, should it be preferable to provide the positive REX signal at a later point during actuation of the drive assembly, the state of the later REX sensor 1202*a* may be used in determining the actuated/deactuated state of the drive assembly 120.

In certain embodiments, the signal provided by the REX sensor 1202 may be based upon the states of the two individual REX sensors 1202*a*, 1202*b*. For example, the initiation of a request to exit condition (i.e., a transition from the negative REX signal to the positive REX signal) may be based upon the state of one of the sensors 1202*a*, 1202*b*, and the termination of the request to exit condition (i.e., a transition from the positive REX signal to the negative REX signal) may be based upon the state of the other sensor 1202*a*, 1202*b*. As one example, the REX sensor 1202 may transition from the negative REX signal to the positive REX signal when the earlier REX sensor 1202*b* transitions from the negative REX state to the positive REX state, and may transition from the positive REX signal to the negative REX signal when the later REX sensor 1202*a* transitions from the positive REX state to the negative REX state. Such a configuration may provide greater accuracy in the sensed state of the drive assembly 120 by initiating the request to exit condition at an early point in the actuating movement of the pushbar 132 (e.g., shortly after the user starts to depress the pushbar 132) and by terminating the request to exit condition at an early point in the deactuating movement of the pushbar 132 (e.g., shortly after the user releases the pushbar 132).

While the REX sensor assembly 1200 is illustrated with two REX sensors 1202 installed, it is also contemplated that the switch 1090 and/or slider cam 1250 of one of the REX sensors 1202*a*, 1202*b* may be omitted, for example in the event that a single set point for the REX signal is desired. As one example, in the event that late initiation and early termination of the request-to-exit condition are desired, a switch 1090 and slider cam 1250 may be installed to define the later REX sensor 1202*a*, and the switch 1090 and/or slider cam 1250*b* corresponding to the earlier REX sensor 1202*b* may be omitted. As another example, in the event that early initiation and late termination of the request-to-exit condition are desired, a switch 1090 and slider cam 1250 may be installed to define the earlier REX sensor 1202*b*, and the switch 1090 and/or slider cam 1250 corresponding to the later REX sensor 1202*a* may be omitted.

Additionally, although the illustrated REX sensor 1202 includes a snap action switch 1090 that is selectively actuated by physical contact of the ramp 1260 with the actuating arm 1094, it is also contemplated that the REX sensor 1202 may be operatively associated with the bell crank 1290 in another manner. As one example, the REX sensor 1202 may include an optical sensor that detects the presence or absence of the slider cam 1250 within a sensed region. As another example, the slider cam 1250 may be formed of or otherwise include a magnetized material, and the REX sensor 1202 may include a magnetic sensor such as a Hall effect sensor or a reed switch.

Figure 28:
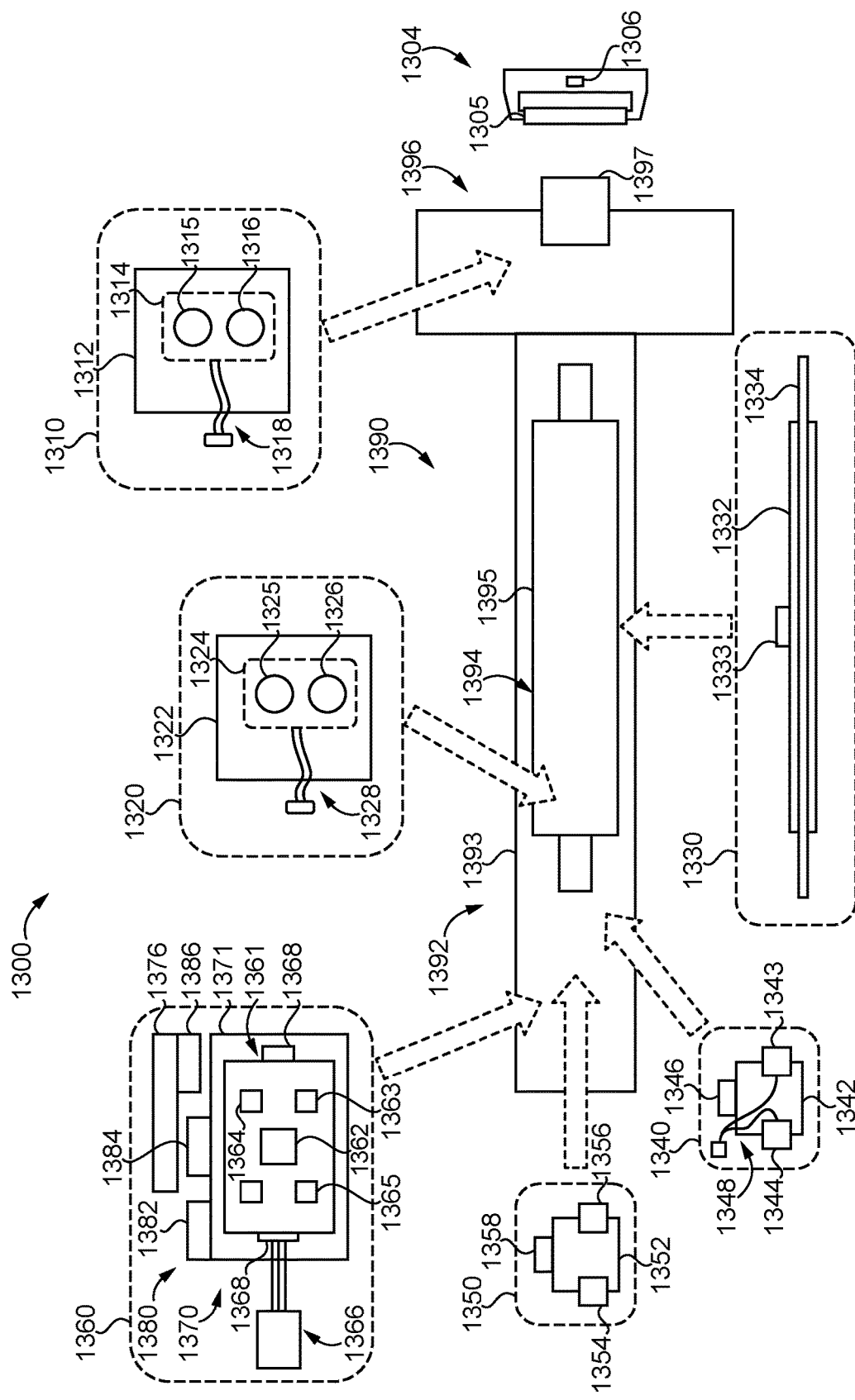
FIG. 28 is a schematic block diagram of an exit device and a kit.

FIG. 28 is a schematic block diagram of a kit 1300 configured for use with an exit device 1390. The exit device 1390 includes a mounting assembly 1392, a drive assembly 1394 movably mounted to the mounting assembly 1392, and a header assembly 1396 coupled to a proximal end of the mounting assembly 1392. The mounting assembly 1392 includes a longitudinally extending channel member 1393 that receives at least a portion of the drive assembly 1394. The drive assembly 1394 includes a pushbar 1395 operable to transition the drive assembly 1394 between actuated and deactuated states. The header assembly 1396 includes a latchbolt 1397 that is driven from an extended position to a retracted position in response to actuation of the drive assembly 1394. The exit device 1390 may, for example, be embodied as the exit device 100 described above, and may additionally or alternatively be provided as the above-described exit device 20.

The kit 1300 includes a plurality of modular subassemblies or modules 1302, each of which is configured to be installed to the exit device 1390. In certain embodiments, one or more of the modules 1302 may be provided as a retrofit module, for example in embodiments in which the kit 1300 is provided as a retrofit kit. It is also contemplated that one or more of the modules 1302 may already be installed to the exit device 1390 at the time of sale. In the illustrated embodiment, the plurality of modules 1302 includes a header module 1310, a REX module 1320, a wire management module 1330, a dogging module 1340, a cover plate module 1350, and a control module 1360 including a housing 1370. In certain embodiments, the kit 1300 may further include a strike 1304 and/or a magnet 1306.

While each of the above-described modules 1302 is illustrated as being included in the kit 1300, it should be appreciated that one or more of the modules 1302 may be omitted, and that additional or alternative modules may be included in one or more embodiments of the kit 1300. Additionally, each of the illustrated modules 1302 corresponds to a module class that includes one or more module types. One or more module classes may include a plurality of interchangeable module types. Assembly of the kit 1300 may involve selecting one or more of the module classes to be included in the kit 1300, and may further involve selecting a module type from one or more of the selected module classes.

In certain embodiments, the kit 1300 may be provided as a retrofit kit for retrofitting an existing exit device 1390. For example, the kit 1300 may be sold to an end user to enable the user to upgrade a previously-purchased exit device 1390. In other embodiments, the kit 1300 may be assembled with or installed to the exit device 1390 prior to the time of sale.

Figure 29:
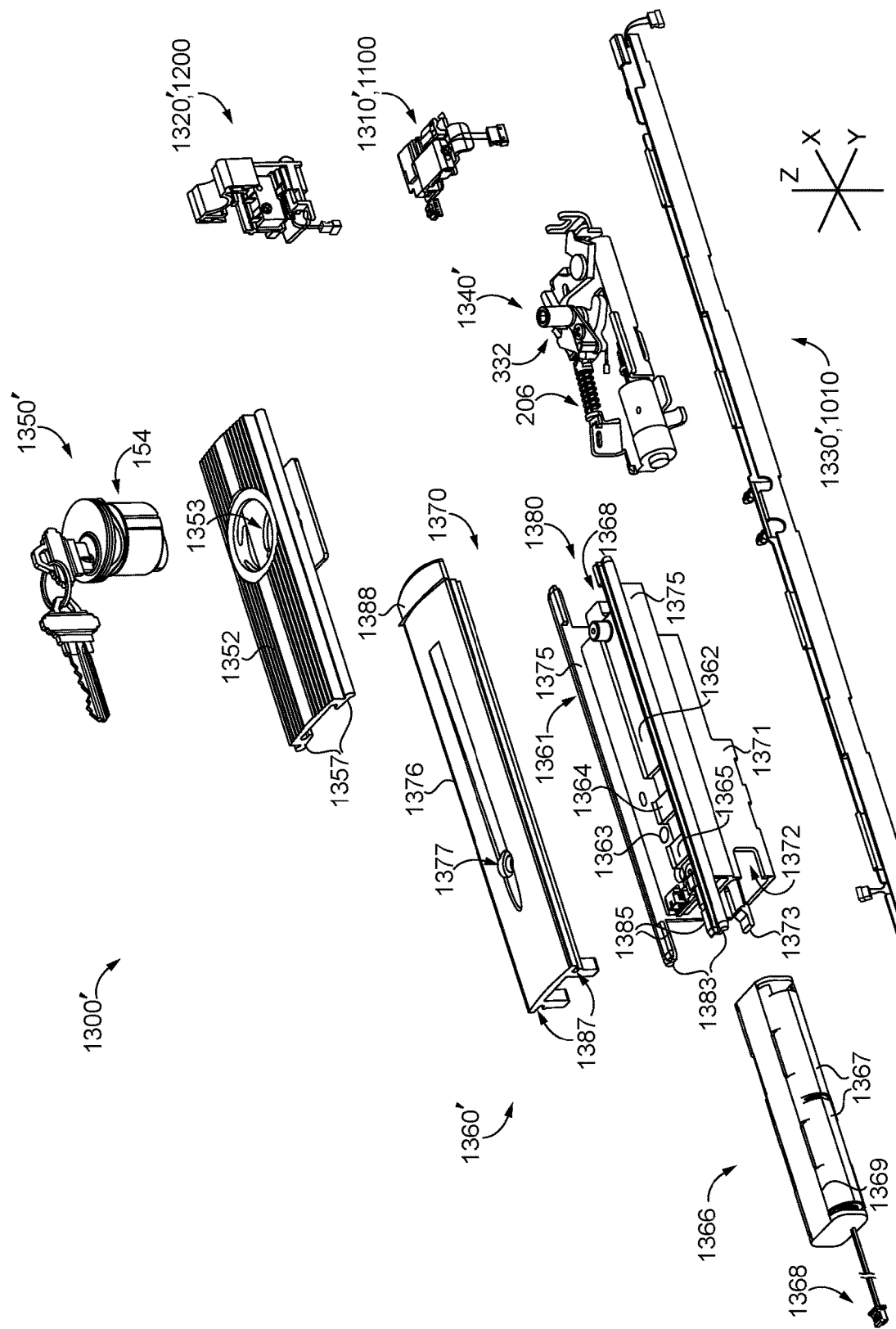
FIG. 29 is an exploded assembly view of a kit according to one embodiment.

With additional reference to FIG. 29, illustrated therein is an embodiment of the kit 1300 including plurality of modules 1302. More specifically, the illustrated embodiment of the kit 1300 is an example kit 1300' that is configured for use with the above-described exit device 100, and each of the illustrated modules is an example type of a corresponding one of the above-described modules 1302. Additionally, while the example kit 1300' is illustrated as being configured for use with the above-described exit device 100, it is also contemplated that a kit 1300 may be configured for use with other forms of exit devices 1390. For example, two or more module types within the same module class may have different configurations of mounting devices, each configured for use with a corresponding form of exit device 1390.

The header module 1310 is configured for mounting in the header assembly 1396. One or more types of the header module 1310 may include a mounting device 1312, one or more sensors 1314 mounted to the mounting device 1312, and a wire harness 1318 connected with the one or more sensors 1314. The sensors 1314 may include a latchbolt sensor 1315 and/or one or more other sensors 1316. In the illustrated form, the selected header module type 1310' is embodied as the header sensor assembly 1100. In additional or alternative types, the latchbolt sensor 1315 and/or one or more of the other sensors 1316 may be omitted, and/or additional or alternative sensors may be included. For example, the latchbolt sensor 1315 may be provided in another of the above-described forms for the latchbolt sensor 424, and/or one or more of the other sensors 1315 may be provided in another of the above-described forms for the door position sensor 420 and inertial sensor 430.

As noted above, certain embodiments of the kit 1300 may include a strike 1304. The illustrated strike 1304 is substantially similar to the above-described strike 90, and includes a roller 1305 configured to engage the latchbolt 1397 to assist in retaining the door in the closed position. A magnet 1306 is mounted to the strike 1304, and is configured to be operatively associated with the magnetometer of the DPS 1104 in the header sensor assembly 1100. In certain embodiments, the strike 1304 may be omitted, and the magnet 1306 may be configured to be installed to an existing strike. Additionally or in the alternative, the magnet 1306 may be omitted from the kit 1300, for example in embodiments in which the header module 1310 does not include a door position sensor, or includes a door position sensor that senses the door position based on criteria other than those described with reference to the DPS 1104.

The REX module 1320 is configured for mounting to a fixed component of the mounting assembly 1392 adjacent a moving component of the drive assembly 1394. One or more type of the REX module 1320 may include a mounting device 1322, one or more sensors 1324 mounted to the mounting device 1322, and a wire harness 1328 connected with the one or more sensors 1324. The sensors 1324 include a REX sensor 1325, and may further include one or more additional sensors 1326. In the illustrated form, the selected REX module type 1320' is embodied as the REX sensor assembly 1200. In certain embodiments, the REX sensor 1325 may include two or more individual sensors, such as the individual sensors 1202a, 1202b. In other embodiments and/or types, the second individual sensor may be omitted. In such forms, one of the additional sensors 1326 may be mounted to the mounting device 1322 at the location the omitted sensor would otherwise be mounted. In certain embodiments and/or types, the REX sensor 1325 may include sensors other than a switch. For example, the REX sensor may be embodied as or otherwise include one or more of the above-described forms for the request-to-exit sensor 426. Additionally or in the alternative, one or more additional sensors 1326 may be provided as another form of sensor 408, such as an inertial sensor 430.

The wire management module 1330 is configured for installation in the channel member 1393. One or more types of the wire management module 1330 may include a conduit 1332 and a main wire harness 1334 operable to transmit signals between the control module 1360 and the header module 1310 and/or the REX module 1320. In the illustrated form, the selected wire management module type 1330' is embodied as the wire management assembly 1010. Other types of the wire management module 1330 may include additional or alternative forms of the conduit 1332 and wire harness 1334. For example, one or more types may include two conduits 1332 and two wire harness 1334 to be mounted in the channel member 1393 on opposite sides of the drive assembly 1394. As another example, the length of the conduit 1332 and wire harness 1334 may vary between two or more types, for example when the types are configured for use with different forms of exit device 1390.

The dogging module 1340 is configured for mounting in the channel member 1393 adjacent a moving component of the drive assembly 1394. One or more types of the dogging module 1340 may include a dogging mechanism 1342 and a dogging status sensor 1344. When installed, the dogging mechanism 1342 is configured to selectively retain the drive assembly 1394 in an actuated state, and the dogging status sensor 1344 is configured to generate sensor data related to the state of the dogging mechanism 1342. In certain forms, the dogging module 1340 may include an electromechanical driver 1343 operable to transition the dogging mechanism 1342 between dogging and undogging states. In the illustrated type 1340' of the dogging module 1340, the dogging mechanism 1342 is embodied as the dogging mechanism 200. Certain types of the dogging module 1340 may include a manual dogging actuator and/or a different form of dogging mechanism 1342. One example of such a dogging module 1600 is described below with reference to FIGS. 32 and 33.

In the illustrated dogging module type 1340', the driver 1343 is embodied as the driver 240 of the dogging mechanism 200, and the dogging status sensor 1344 is embodied as the dogging status switch 332. In certain embodiments and/or types of the dogging module 1340, one or both of these components may take another form. As one example, the driver 1343 may be provided as a solenoid, for example in embodiments in which the control module 1360 is configured for connection to line power. As another example, the dogging status sensor 1344 may be provided in another of the above-described forms for the dogging status sensor 422.

The cover plate module 1350 is configured for mounting in the channel member 1393 to at least partially enclose the channel defined by the channel member 1393. One or more types of the cover plate module 1350 may include a cover plate 1352, and may further include a manual dogging actuator 1354. The cover plate 1352 may include an opening 1353 that facilitates mounting of and/or access to the manual dogging actuator 1354. The cover plate 1352 may additionally or alternatively include a mounting device 1356 configured to facilitate installation of the cover plate module 1350 to the exit device 1390. In the illustrated embodiment, the mounting device 1356 includes a pair of rails 1357 that extend longitudinally along opposite sides of the cover plate 1352. The cover plate 1352 may also be referred to as a proximal cover plate 1352.

In certain embodiments, the cover plate module 1350 may further include a dogging request sensor operatively associated with a manual dogging actuator 1354. The dogging request sensor may be configured to generate sensor information related to the position of the manual dogging actuator 1354, and the control module 1360 may determine dogging request events (e.g., request-to-dog events and/or request-to-undog events) based upon such information. In certain embodiments, the control module 1360 may further issue one or more commands based at least in part upon a determined dogging request event. For example, the manual dogging actuator 1354 may be decoupled from the trigger of the dogging mechanism 1342, and the issued commands may cause the driver 1343 to move the dogging mechanism 1342 to the dogging or undogging state corresponding to the determined dogging request event. In such embodiments, the lost motion connection between the link the trigger and link plate may be omitted from the dogging mechanism 1342.

In the illustrated type 1350' of the cover plate module 1350, the manual dogging actuator 1354 is provided in the form of the lock cylinder 154, and the opening 1353 is sized to receive the mounted lock cylinder 154. It is also contemplated that the manual dogging actuator 1354 may be operated by a hex key, and that the opening 1353 may be sized and positioned to receive the hex key during use of such a dogging actuator. It is also contemplated that the manual dogging actuator 1354 may be omitted, for example in types configured to reuse an existing lock cylinder 154 of the exit device 1390, or in embodiments in which the dogging module 1340 includes a manual dogging actuator. Certain types of the cover plate module 1350 may further include a visual indicator, and the cover plate 1352 may include a window through which displayed indicia of the visual indicator can be viewed by a user. Exemplary embodiments of such visual indicators are provided below with reference to FIGS. 34-37.

The control module 1360 includes the housing 1370, which is configured for installation in the channel member 1393. The control module 1360 may, for example, be configured to perform one or more of the functions described above with reference to the dogging control assembly 300 and/or the control system 400. The control module 1360 includes a controller 1362, which may, for example, be provided in a printed circuit board assembly (PCBA) 1361. Certain types of the control module 1360 may further include one or more of a visual indicator 1363, a wireless communication device 1364, one or more sensors 1365, an onboard power supply 1366, and one or more electrical communication interfaces 1368. In the illustrated control module type 1360', the PCBA 1361 includes the controller 1362, visual indicator 1363, a wireless communication device 1364, and one or more of the interfaces 1368. The PCBA 1361 also includes a set of electrical communication paths (e.g., wires and/or traces) connecting the various electronic components. In certain embodiments, the PCBA 1361 may be embodied as the above-described PCBA 1072.

The illustrated control module type 1360' includes an onboard power supply 1366 in the form of a power pack. The power pack 1366 may include one or more energy storage devices 1367, such as batteries and/or supercapacitors, and an electrical interface in electrical communication with the energy storage devices 1367. For example, the energy storage devices 1367 may be provided as disposable or rechargeable batteries, which may be removably mounted in a housing 1369. In certain embodiments, the power pack 1366 may include the energy storage devices 1367 at the time of sale, while in other embodiments, the energy storage devices 1367 may be provided by a user during installation of the kit 1300. It is also contemplated that the onboard power supply 1366 may take another form, and may, for example, include an energy harvesting device. In certain forms, the onboard power supply 1366 may be omitted, for example in embodiments and/or types in which the control module 1360 is configured for connection to line power.

The housing 1370 is configured for mounting the control module 1360 in the channel member 1393, and includes mounting features 1380 that facilitate assembly and/or installation of the control module 1360 to the channel member 1393. The main body 1371 of the housing 1370 includes a cavity 1372 in which the power pack 1366 is slidingly received, and a longitudinally-extending trough 1374 in which the PCBA 1361 is seated. The housing 1370 may include a spring clip 1373 operable to selectively retain the power pack 1366 within the cavity 1372. The trough 1374 is defined in part by a pair of transversely offset sidewalls 1375, which extend laterally outward from a base of the trough 1374 to the mounting features 1380. The trough 1374 is at least partially covered by a cover plate 1376, which is mounted to the main body 1371 via the mounting features 1380. The cover plate 1376 may be formed of plastic or another material selected to provide little interference to wireless communications, for example in types of the control module 1360 that include the wireless communication device 1364. The cover plate 1376 may also be referred to as a distal cover plate 1376.

In the illustrated form, the mounting features 1380 include first, second, and third mounting features 1382, 1384, 1386, each of which may facilitate installation of the control module 1360 to the exit device 1390. Additionally, the second and third mounting features 1384, 1386 cooperate with one another and may facilitate assembly of the control module 1360. The first mounting feature 1382 includes a pair of longitudinally-extending rails 1383, each of which projects from the upper edge of a corresponding one of the sidewalls 1375 in a transversely outward direction (i.e., away from the other of the sidewalls 1375). The second mounting feature 1384 includes two pairs of longitudinally-offset lips 1385, and each pair of lips 1385 projects from the upper edge of a corresponding one of the sidewalls 1375 in a transversely inward direction (i.e., toward the other of the sidewalls). The third mounting feature 1386 includes two pairs of recesses 1387 formed at or near opposite longitudinal ends of the cover plate 1376. The mounting features 1380 may further include an end lip 1388 projecting from the proximal end of the cover plate 1376.

Figure 30:
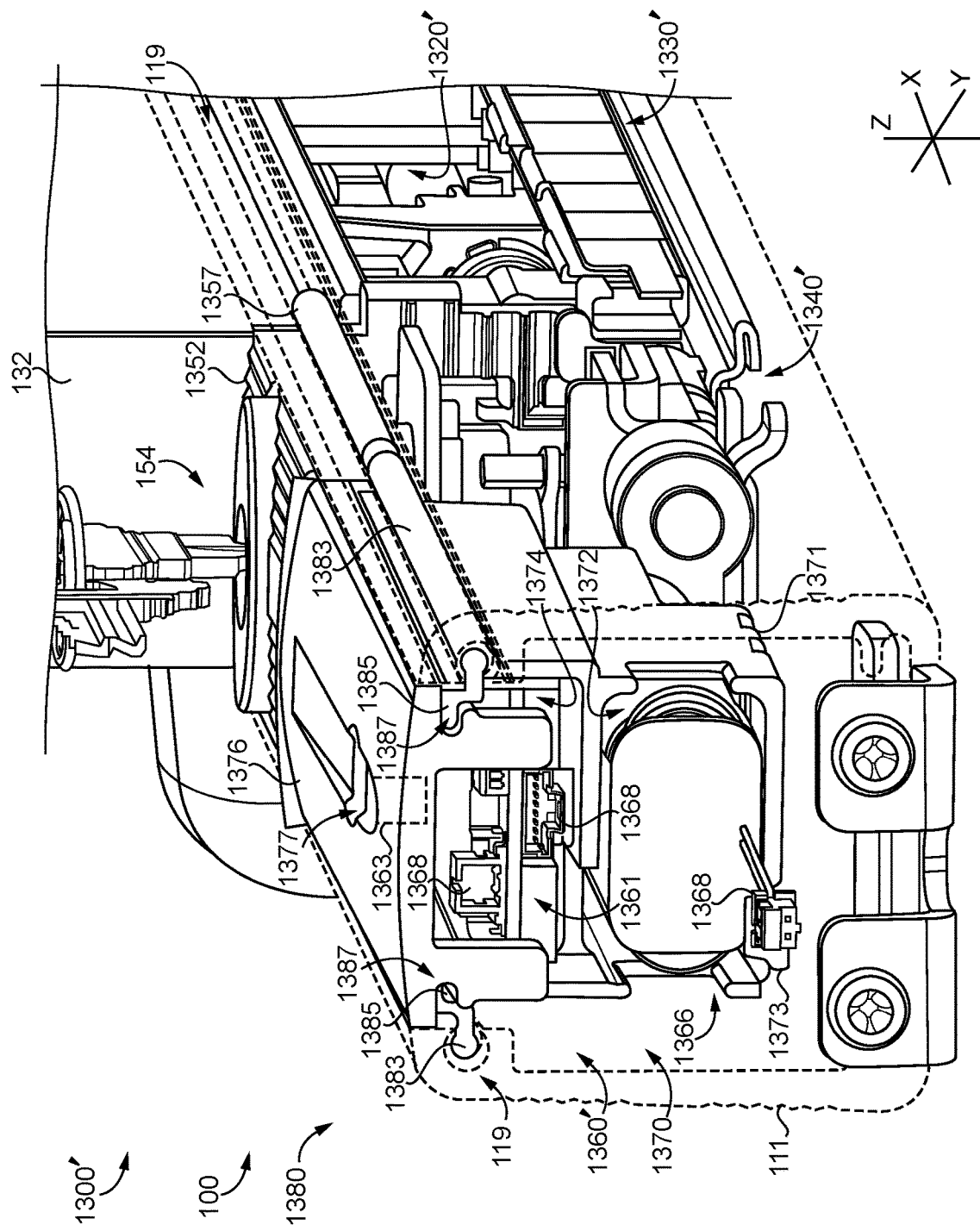
FIG. 30 is a perspective view of a portion of the kit illustrated in FIG. 28 with the kit installed to the exit device illustrated in FIG. 3.

FIG. 30 illustrates a portion of the exit device 100 with the example kit 1300' installed thereto. The channel member 111 includes a pair of longitudinally-extending passages 119 that face one another. The rails 1357 of the proximal cover plate 1352 are configured to be received in the passages 119 such that the mounting device 1356 facilitates a sliding engagement between the cover plate module 1350 and the channel member 111. Similarly, the rails 1383 of the housing 1370 are configured to be received in the passages 119 such that the first mounting feature 1382 facilitates a sliding engagement between the control module 1360 and the channel member 111. Additionally, the recesses 1387 are configured to receive the lips 1385 such that the second and third mounting features 1384, 1386 cooperate to facilitate assembly of the distal cover plate 1376 to the main body 1371 of the housing 1370.

When the illustrated kit 1300' is installed to the exit device 100, the proximal end of the proximal cover plate 1352 abuts a fixed component of the mounting assembly 110 at or near the distal end of the pushbar 132, and the distal end of the proximal plate 1352 abuts the proximal end of the distal cover plate 1376. When installed, the end cap 113 engages the distal ends of the distal plate 1376 and housing 1370, thereby restricting movement of the plate 1376 relative to the housing 1370, and restricting movement of the housing 1370 relative to the channel member 111. Additionally, the proximal cover plate 1352 at least partially covers the end lip 1388 of the distal cover plate 1376, which may facilitate in retaining the position of the plate 1376 against prying attacks and/or other forms of tampering.

In the illustrated embodiment, the visual indicator 1363 is aligned with an opening or a window 1377 in the distal plate 1376 such that the indicator 1363 is visible to persons viewing the exit device 100. The distal plate 1376 may include features that facilitate operation of one or more of the sensors 1365, such as the sensors of the environmental sensor assembly 1080. For example, in embodiments in which the sensors 1365 include the light sensor 1082, the plate 1376 may include a window aligned with the light sensor 1082. As another example, in embodiments in which the sensors 1365 include a tamper sensor 1088 in the form of a reed switch, a magnet may be mounted to the distal plate. In such forms, the magnet may be aligned with the reed switch of the tamper sensor 1088 when the control module 1060 is assembled such that removal of the cover plate 1376 causes the reed switch to transition states, thereby causing the tamper sensor 1088 to provide a signal indicating the removal of the plate 1376.

Figure 31A:
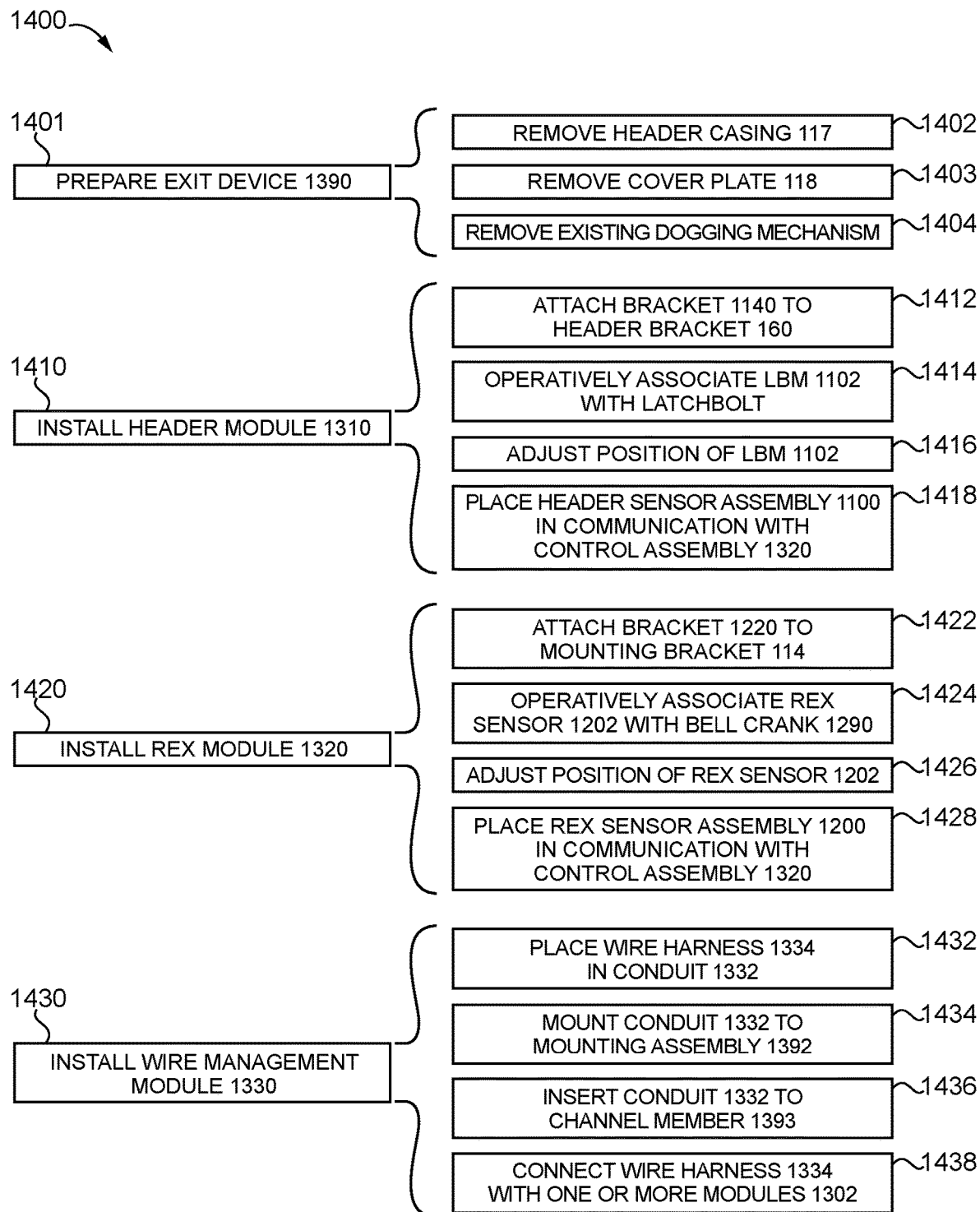
FIGS. 31A-B are a schematic flow diagram of an installation method according to one embodiment.
Figure 31B:
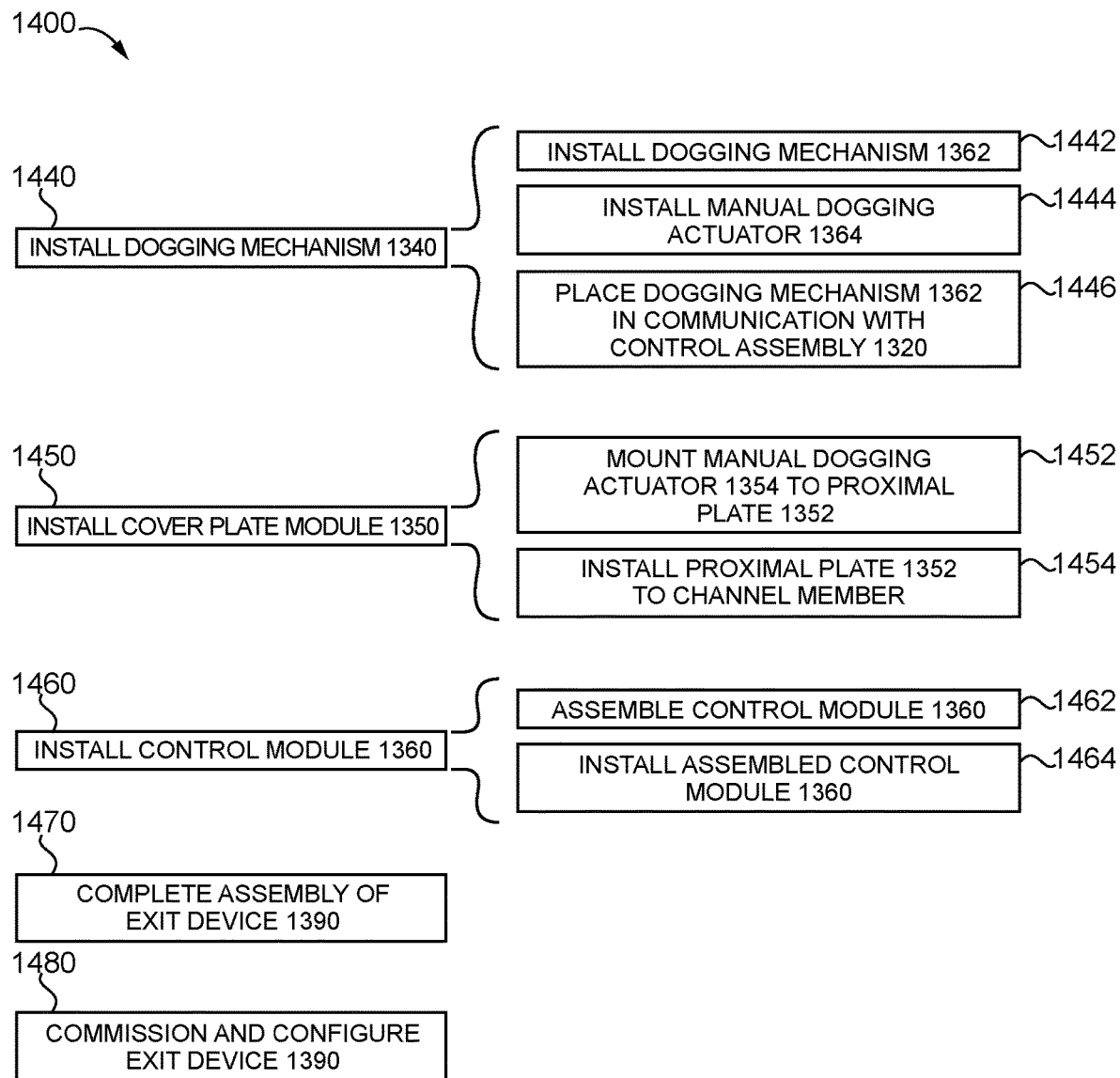

FIGS. 31A-B are a schematic flow diagram of an example process 1400 for installing the illustrative kit 1300' to the exit device 100. It should be appreciated that the particular procedures and operations of the process 1400 are illustrated by way of example, and such procedures and operations may be combined or divided, added or removed, and/or reordered in whole or in part depending on the particular embodiment, unless stated to the contrary. Additionally, while certain operations of the illustrated process 1400 are described herein with specific reference to the illustrated kit 1300' and the above-described exit device 100, it should be appreciated that the installation process for a kit 1300 may vary based upon a number of factors, such as the modules 1302 included in the kit 1300, the type selected for the included modules 1302, and the structural feature of the exit device 1390 in which the kit 1300 is to be installed. For example, a procedure for installing a particular module may be omitted from the process of installing a kit 1300 in which the module is not present.

The process 1400 may include a procedure 1401, which generally involves partially disassembling a previously-assembled exit device 1390 in preparation for installation of the retrofit kit 1300. An operation 1402 may involve removing the header casing 117 to expose the header bracket 160, for example in embodiments in which the kit 1300 includes the header module 1310. An operation 1403 may involve removing the existing cover plate 118, for example by sliding the cover plate 118 in the distal direction after removing the end cap 113. In the event that the exit device 100 includes an existing dogging mechanism, such as a conventional dogging mechanism, an operation 1404 may involve removing the existing dogging mechanism. The operation 1404 may, for example, be performed in embodiments in which the kit 1300 includes the dogging module 1340. As will be appreciated, one or more of the actions described above with reference to the procedure 1401 may be omitted in certain embodiments, for example in embodiments in which the kit 1300 is installed during the manufacture or initial assembly of the exit device 100. Additionally or alternatively, the procedure 1401 may involve the removal of one or more existing components not specifically described with reference to the operations 1402-1404.

The process 1400 includes a procedure 1410, which generally involves installing the header module 1310 to the exit device 1390. More particularly, the procedure 1410 involves installing the header module 1310 to the header assembly 1396. In the illustrated embodiment, the procedure 1410 involves installing the header sensor assembly 1100 to the exit device 100 at the header bracket 160. The procedure 1410 involves an operation 1412, which involves mounting the mounting bracket 1140 to the header bracket 160 such that the slots 163, 1142 are aligned with one another. The operation 1412 may involve engaging one or more of the positioning flanges 1149 with a corresponding edge of the header bracket to facilitate such alignment of the slots 163, 1142. In the illustrated form, the operation 1412 includes adhering the base plate 1141 to the base wall 162 using the double sided adhesive tape 1128, for example after removing the protective film from the exposed side of the tape 1128. It is to be appreciated that the operation 1412 may involve mounting the base plate 1141 to the base wall 162 using additional or alternative coupling devices, such as one or more clips, screws, bolts, or rivets.

The procedure 1410 also includes an operation 1414, which generally involves operatively associating the LBM 1102 with the latchbolt 142 via the retractor 144. More specifically, the operation 1414 includes positioning the LBM 1102 such that the actuating arm 1094 of the switch 1090 extends into the path along which the extension 145 travels as the latchbolt 142 moves between the extended and retracted positions thereof. In certain embodiments, the operation 1414 may be accomplished as a result of the operation 1412, for example in embodiments in which the assembled LBM 1102 is coupled to the mounting hook 1143 in the proper position at the time that the mounting bracket 1140 is coupled to the header bracket 160. In other embodiments, the operation 1414 may involve coupling assembled LBM 1102 to the mounting hook 1143 after attaching the bracket 1140 to the header bracket 160.

The procedure 1410 may further include an operation 1416, which involves adjusting the position of the assembled LBM 1102. In certain embodiments, the operation 1416 may be performed after the LBM 1102 has been operatively associated with the latchbolt 142 in the operation 1414. For example, the operation 1416 may involve adjusting the position of the assembled LBM 1102 after the header sensor assembly 1100 has been installed, and retaining the LBM 1102 in a desired position by tightening the screw 1126.

The procedure 1410 also includes an operation 1418, which involves placing the header sensor assembly 1100 in communication with the control module 1360, for example via the main wire harness 1050. The operation 1418 may, for example, involve coupling the interface 1112 of the wire harness 1110 with the proximal interface 1053 of the main wire harness 1050. The operation 1418 may further include coupling the distal interface 1054 of the main wire harness 1050 with an interface connected to the controller 1362.

The process 1400 also includes a procedure 1420, which generally involves installing the REX module 1320 to the exit device 1390. More particularly, the procedure 1420 involves installing the REX module 1320 to a fixed component of the mounting assembly 1392 adjacent a moving component of the drive assembly 1394. In the illustrated embodiment, the procedure 1420 involves installing the REX sensor assembly 1200 to the exit device 100 at the distal mounting bracket 114. The procedure 1420 includes an operation 1422, which involves attaching the mounting bracket 1220 of the REX sensor assembly 1200 to one of the mounting brackets 114 of the mounting assembly 110. More specifically, the operation 1422 involves inserting the body portion 1221 into the gap between the sidewalls 115 of the distal mounting bracket 114, and engaging the spring clips 1224 with the slots formed in the sidewalls 115. With the bracket 1220 attached to the mounting bracket 114, engagement between the spring clips 1224 and the edges of the slots retains the position of the bracket 1220.

The procedure 1420 also includes an operation 1424, which generally involves operatively associating the REX sensor 1202 with the bell crank 136, 1290 pivotally mounted to the mounting bracket 114. More specifically, the operation 1424 includes positioning the REX sensor 1202 such that the slider cam 1250 thereof extends into the path along which the first pivot arm 1292 travels as the bell crank 1290 pivots between the actuated and deactuated position thereof. The operation 1424 also involves positioning the REX sensor 1202 such that the that the actuating arm 1094 extends into the path along which the ramp 1260 travels as the slider cam 1250 slides between the extended and retracted positions thereof.

In certain embodiments, the operation 1424 may be accomplished as a result of the operation 1422, such as in embodiments in which the REX sensor 1202 is mounted to the bracket 1220 in the proper position at the time that the bracket 1220 is attached to the mounting bracket 114. For example, if the switch 1090 and slider cam 1250 of each REX sensor 1202 is mounted to the bracket 1220 prior to the operation 1422, attaching the assembled REX sensor assembly 1200 to the mounting bracket 114 in the operation 1422 may also result in each of the REX sensors 1202a, 1202b becoming operatively associated with the bell crank 1290. In other embodiments, the operation 1424 may involve mounting the switch 1090 and/or sliding cam 1250 of the REX sensor 1202 to the bracket 1220 after performing the operation 1422.

The procedure 1420 may further include an operation 1426, which involves adjusting the position of a REX sensor 1202. In certain embodiments, the operation 1426 may be performed prior to the operation 1422 and/or the operation 1424, for example in embodiments in which the REX sensor 1202 is mounted to the bracket 1220 with an adjustable position. In other embodiments, the operation 1416 may be performed prior to or concurrently with one or both of the operations 1422, 1424. For example, in embodiments in which one of the REX sensors 1202 is omitted, the operation 1426 may include selecting the installation position for the remaining REX sensor 1202 based upon a desired transitional position. In the event that it is desired to provide the positive REX signal at a relatively later point in the actuation of the drive assembly 120, the switch 1090 and slider cam 1250 may be installed to form the later REX sensor 1202a. In the event that it is desired to provide the positive REX signal at a relatively earlier point in the actuation of the drive assembly 120, the switch 1090 and slider cam 1250 may be installed to form the earlier REX sensor 1202b.

The procedure 1420 also includes an operation 1428, which involves placing the REX sensor assembly 1200 in communication with the control module 1360, for example via the main wire harness 1050. The operation 1428 may, for example, involve coupling the interface 1212 of the wire harness 1210 with the intermediate interface 1055 of the main wire harness 1050. With the interfaces 1212, 1055 coupled with one another, the wires may extend through the receiving slot 1034. The operation 1428 may further include coupling the distal interface 1054 of the main wire harness 1050 with an interface connected to the controller 1362.

The process 1400 also includes a procedure 1430, which generally involves installing the wire management module 1330, 1010. The procedure 1430 may include an operation 1432, which involves assembling the wire management module by placing the wire harness 1334, 1050 in the channel formed by the conduit 1332, 1020.

The procedure 1430 an operation 1434, which involves mounting the conduit 1020 to the mounting assembly 110. The operation 1434 may include coupling the opposite end portions of the conduit 1020 with a fixed component of the mounting assembly 110, for example engaging the clips 1037 with openings in the base plate 112 to discourage movement of the opposite ends of the conduit 1020. The operation 1432 may additionally or alternatively include inserting one of the posts 1033 into an opening 1286 formed in one of the mounting brackets 114 to discourage movement of the central portion of the conduit 1020. While the illustrated conduit 1020 is attached to the mounting assembly 110 by engagement of the post 1033 and clips 1037 with the mounting bracket 114 and the base plate 112, it is to be appreciated that additional or alternative attachment devices may be utilized.

The procedure also includes an operation 1436, which involves inserting the conduit 1020 into the channel member 111. In certain embodiments, the mounting operation 1434 may be performed prior to the inserting operation 1436, for example in embodiments in which the wire management module 1330 is installed during initial assembly of the exit device 1390. In such forms, the operation 1436 may include sliding the partially assembled mounting assembly 110 and conduit 1020 into the channel formed by the channel member 111. In certain embodiments, the inserting operation 1436 may be performed prior to the mounting operation, for example in embodiments in which the wire management module 1330 is installed to a previously-assembled exit device 1390. In such forms, the operation 1434 may, for example, involve inserting the conduit 1332 into the channel 1393 near one end of the pushbar 1395 and urging the conduit longitudinally toward the other end of the pushbar 1395. The operation 1436 may be performed with the wire harness 1334 seated in the conduit 1332 such that the conduit 1332 carries the wire harness 1334 therewith.

The procedure 1430 includes an operation 1438, which involves connecting the wire harness 1334 with one or more of the modules 1302. The operation 1436 may include engaging one or more interface 1051 of the main wire harness 1050 with a corresponding interface of another of the modules 1302. In the illustrated form, the operation 1434 involves coupling the proximal interface 1053 with the interface 1112 of the header sensor assembly 1100, coupling the distal interface 1054 with an interface 1068 of the control module 1060, and coupling the intermediate interface 1055 with the interface 1212 of the REX sensor assembly 1200. In certain embodiments, one or more of the actions described with reference to the operation 1438 may be omitted, for example in embodiments in which the exit device 1390 is to be assembled as a retrofit-ready exit device 1390.

The process 1400 also includes a procedure 1440, which generally involves installing the dogging module 1340, which in the illustrated embodiment includes the dogging mechanism 200 and the dogging status sensor 332. The procedure 1440 includes an operation 1442, which involves installing the dogging mechanism 1342. The operation 1442 may, for example, involve coupling a proximal end portion of the dogging mechanism mounting plate 210 with a distal end portion of the exit device mounting plate 112 using one or more fasteners, such as screws.

The procedure 1440 may also include an operation 1444, which involves placing the dogging module 1340 in communication with the control module 1360. More specifically, the operation 1446 involves placing each of the driver 240, 1346 and the dogging status sensor 332, 1344 in communication with the controller module 1362. By way of example, the dogging module 1340 may include a wire harness connected to the driver 240, 1346 and the dogging status sensor 332, 1344, and the operation 1446 may involve engaging the interface of the wire harness with an interface 1368 of the PCBA 1361.

The process 1400 also includes a procedure 1450, which generally involves installing the cover plate module 1350 to the exit device 1390. The procedure 1450 includes an operation 1452, which involves mounting the proximal plate 1352 to the channel member 111 using the mounting device 1356. In the illustrated embodiment, the operation 1452 includes inserting the rails 1357 into the passages 119 from the distal end of the channel member 111 and sliding the plate 1352 in the proximal direction until the plate 1352 covers the dogging module 1340.

The process 1400 also includes a procedure 1460, which generally involves installing the control module 1360 to the exit device 1390. The procedure 1460 may include an operation 1462, which involves assembling the control module 1360. The operation 1462 may include mounting the distal plate 1376 to the body portion of the housing 1370 such that the plate 1376 at least partially covers the PCBA 1361. For example, the operation 1462 may involve engaging the lips 1385 with the recesses 1387 such that the plate 1376 is mounted to the main body of the housing 1370 via the mounting features 1384, 1386. The operation 1462 may further include installing the energy storage devices 1367 and/or connecting the power pack 1366 with the PCBA 1361.

The procedure 1460 includes an operation 1464, which involves installing the assembled control module 1360 to the exit device. The operation 1464 includes placing the control module 1360 in communication with the header module 1310, REX module 1320, and dogging module 1340. The operation 1464 may, for example, include attaching the sensor assembly 1310 and the dogging mechanism 1342, for example by engaging interfaces connected to the controller 1362 with interfaces connected to the sensor assembly 1310 and dogging mechanism 1342. In the illustrated embodiment, the operation 1454 includes inserting the rails 1383 into the passages 119 from the distal end of the channel member 111 such that the housing 1370 is mounted to the channel member 111 via the first mounting device 1312. The operation 1454 may further include sliding the housing 1370 in the proximal direction until the housing 1370 engages the proximal plate 1352.

The process 1400 also includes a procedure 1470, which generally involves completing assembly of the exit device 1390. The procedure 1470 may, for example, include installing or reinstalling one or more components that have not been rendered unnecessary and/or redundant by the installation of the kit 1300. In the illustrated embodiment, the procedure 1470 includes installing or reinstalling the end cap 113, the header casing 117, and the pushbar 132. In the event that one or more components have been rendered unnecessary and/or redundant, such components may be set aside for future use or may be discarded. Such redundant components may, for example, include the cover plate 118 and/or any conventional dogging mechanism that may have been removed during the operation 1402. The procedure 1470 may further include installing the replacement strike 1304 to the frame 82 in which the door 84 is mounted. The procedure 1470 may include connecting the control module 1360 to line power, for example in embodiments in which the onboard power supply 1366 is omitted. The procedure 1470 may include connecting the control module 1360 to a wired communication interface, for example in embodiments in which the wireless communication device 1364 is omitted.

The process 1400 may further include a procedure 1480, which generally involves commissioning and configuring the exit device 1390. The procedure 1470 may include connecting the exit device 1390 to the management system 30, for example via the wireless communication device 1364. The procedure 1480 may further include providing the control module 1360 with one or more dogging schedules setting the times at which the dogging mechanism 1342 is to be transitioned between the dogging and undogging states.

Figure 32:
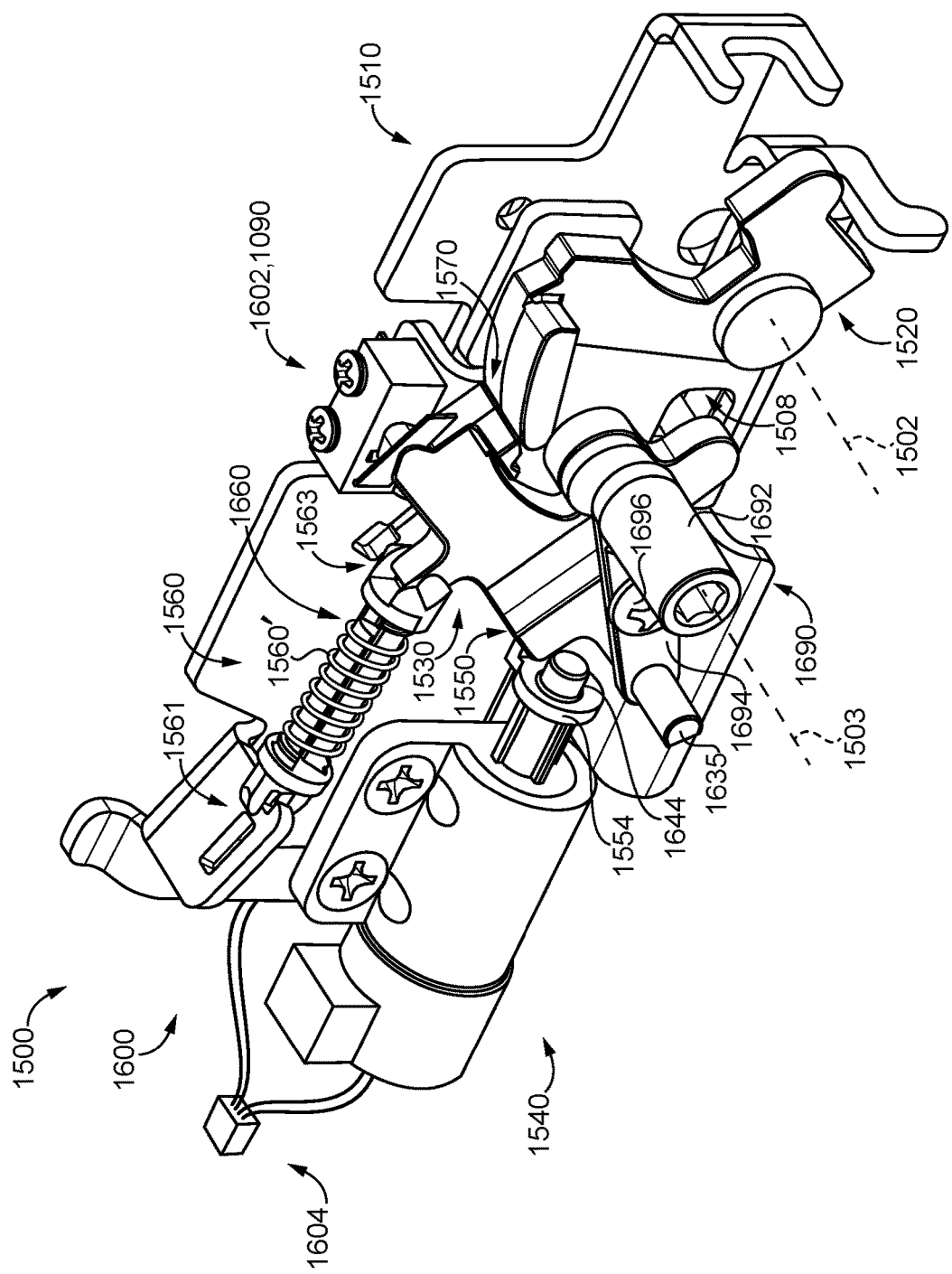
FIG. 32 is a perspective view of an electromechanical dogging mechanism according to one embodiment and a dogging module including the same.
Figure 33:
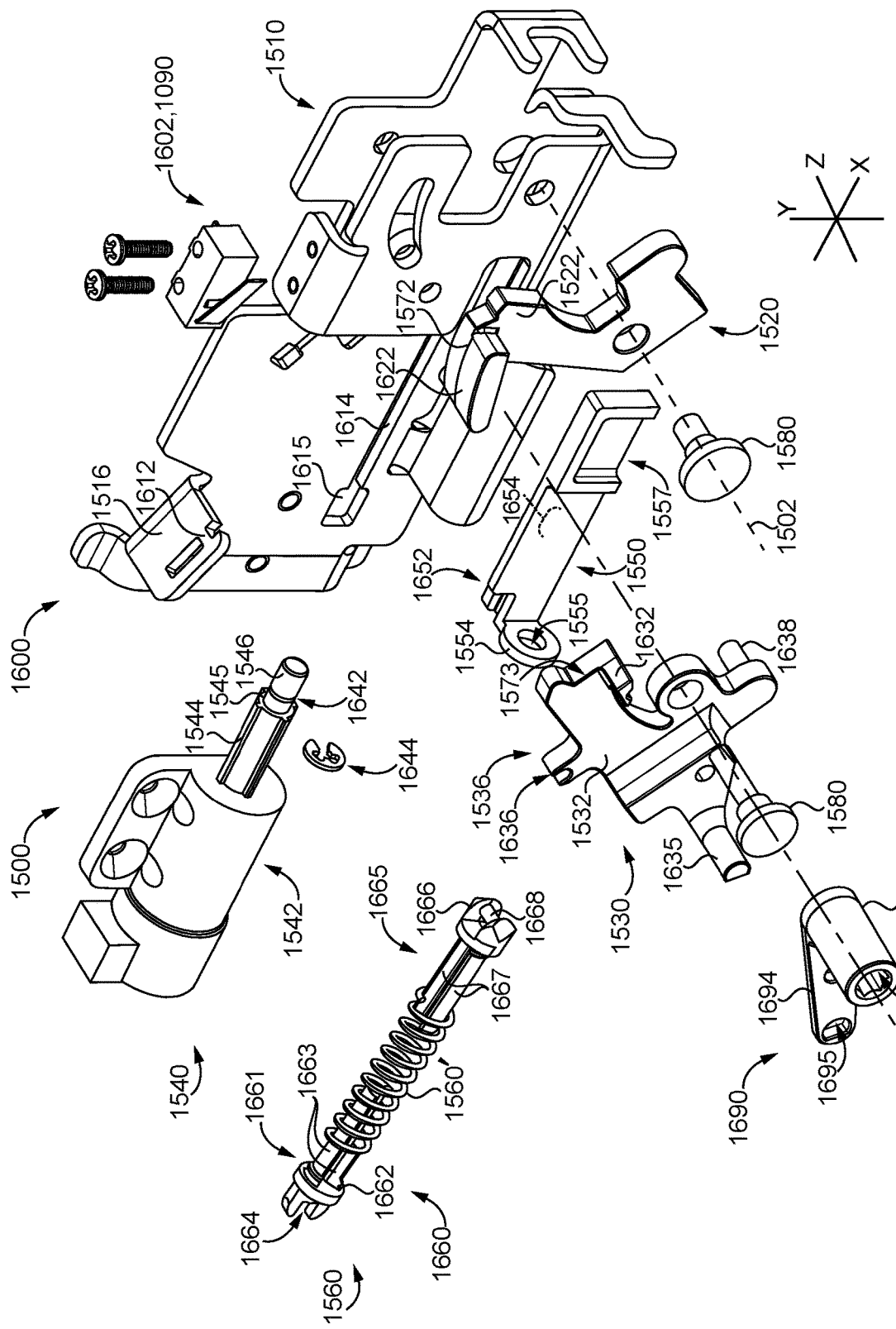
FIG. 33 is an exploded assembly view of the dogging mechanism illustrated in FIG. 32.

With reference to FIGS. 32 and 33, illustrated therein is a dogging mechanism 1500 according to another embodiment, and a dogging module 1600 including the same. The dogging mechanism 1500 is substantially similar to the dogging mechanism 200 described above, and similar reference characters are used to indicate similar elements and features. For example, the dogging mechanism 1500 includes a mounting plate 1510, a hook 1520, a trigger 1530, a driver 1540, a link plate 1550, an over-center spring 1560, and an engagement mechanism 1570, which respectively correspond to the above-described mounting plate 210, hook 220, trigger 230, driver 240, link plate 250, over-center spring 260, and engagement mechanism 270. In the interest of conciseness, the following description focuses primarily on features of the dogging mechanism 1500 that are different from or were not specifically described with respect to the dogging mechanism 200.

In the illustrated embodiment, the hook 1520 and the trigger 1530 are pivotably mounted to the mounting plate 1510 with pivot rivets 1580 which enable rotation of the hook 1520 and trigger 1530 about the rotational axes 1502, 1503 thereof. Additionally, the hook 1520 includes an extension 1622 that extends laterally outward from the arm 1522 and which partially defines the hook contact surface 1572. Similarly, the trigger 1530 includes an extension 1632 that extends laterally outward from the arm 1532 and which partially defines the trigger contact surface 1573. With the trigger 1530 in the ready position, the extensions 1622, 1632 provide an increased area of contact between the surfaces 1572, 1573 as the hook 1520 pivots from the unactuated position to the actuated position. The increased contact area provided by the extensions 1622, 1632 may facilitate in maintaining engagement between the surfaces 1572, 1573 to mitigate the negative effects of misalignment, such as misalignment resulting from manufacturing tolerances.

The trigger 1530 also includes a mounting post 1635 extending in the same lateral direction as the extension 1632, and a coupling post 1638 extending in the opposite lateral direction. The mounting post 1635 defines an attachment point through which a manual dogging actuator can be attached to the trigger 1530. The coupling post 1638 extends into the coupling slot 1557 of the link plate 1550, thereby forming a lost motion connection 1508 between the trigger 1530 and the link plate 1550.

Like the above-described driver 240, the driver 1540 includes a motor 1542 that extends and retracts a shaft 1544 when the driver 1540 is operated in first and second modes. The end portion 1546 of the shaft 1544 extends through the opening 1555 in the tab 1554 of the link plate 1550, and includes an annular groove 1642 sized to receive an E-clip 1644. The tab 1554 is captured between the E-clip 1644 and the shoulder 1545, thereby coupling the link plate 1550 to the shaft 1544 for longitudinal movement therewith.

The link plate 1550 also includes a T-shaped extension 1652 and a protrusion 1654, each of which extends from the side of the link plate 1550 that faces the mounting plate 1510. The extension 1652 and protrusion 1654 cooperate with a longitudinally-extending guide slot 1614 in the mounting plate 1510 to restrict the link plate 1550 to longitudinal movement. During assembly, the T-shaped extension 1652 may be inserted into an aperture 1615 connected to the guide slot 1614. When the narrow section of the extension 1652 enters the slot 1614, the T-shaped extension 1652 cooperates with the mounting plate 1510 to retain the lateral position of the link plate 1550.

In the illustrated embodiment, the over-center spring mechanism 1560 includes a compression spring 1560', and further includes an expandable guide mechanism 1660 on which the spring 1560' is mounted. The guide mechanism 1660 includes a first guide member 1661 that is slidingly engaged with a second guide member 1661. The first guide member 1661 includes a first end portion 1662 and a first pair of arms 1663 extending from the first end portion 1662. Similarly, the second guide member 1665 includes a second end portion 1666 and a second pair of arms 1667 extending from the second end portion 1666. Each pair of arms 1663, 1667 is received in a pair of passages defined by the other pair of arms 1663, 1667, thereby restricting relative movement of the guide members 1661, 1665 to the direction along which the arms 1663, 1667 extend.

The end portion 1662, 1666 of each guide member 1661, 1665 includes a hinge feature through which the guide member 1661, 1665 is connected to a corresponding component to define hinged anchor points 1561, 1563 for the over-center spring mechanism 1560. In the illustrated embodiment, the first guide member 1661 includes a hinge feature in the form of a notch 1664, and the anchor arm 1516 of the mounting plate 1510 includes a mating hinge feature in the form of a post 1612. The notch 1664 is engaged with the post 1612 to define a hinged connection between the first guide member 1661 and the mounting plate 1510, thereby defining the first or fixed anchor point 1561 of the spring mechanism 1560. Similarly, the second guide member 1665 includes a hinge feature in the form of a post 1668, and the attachment point 1536 of the trigger 1530 includes a mating hinge feature in the form of a notch 1636. The post 1668 is engaged with the notch 1636 to define a hinged connection between the second guide member 1665 and the trigger 1530, thereby defining the second or movable anchor point 1563 of the spring mechanism 1560.

During operation of the dogging mechanism 1500, the over-center spring mechanism 1560 functions in a manner substantially similar to that described above with reference to the over-center spring mechanism 260. However, the inclusion of the guide member 1660 may provide the spring mechanism 1560 with a greater degree of stability, for example by inhibiting buckling of the compression spring 1560'.

The dogging module 1600 may further include a dogging status sensor 1602, a wire harness 1604 connected with the sensor 1602 and the driver 1540, and a manual dogging actuator 1690. While other forms are contemplated, the illustrated dogging status sensor 1602 is provided in the form of a snap action switch 1090, and the manual dogging actuator 1690 is provided in the form of a hex key actuator. The hex key actuator 1690 includes a body portion 1692 having an arm 1694 extending therefrom. The body portion 1692 includes an opening 1693 sized and shaped to receive and engage the end of a corresponding hex key. An end portion of the arm 1694 includes an opening 1695 which receives the post 1635 to couple the actuator 1690 with the trigger 1530. The actuator 1690 may further be coupled to the trigger 1530 with a fastener such as a screw 1696, which may extend into an opening in the trigger 1530 through an aligned opening in the arm 1694. With the actuator 1690 coupled to the trigger 1530, the body portion 1692 is substantially aligned with the rotational axis 1503 of the trigger 1530.

When the dogging mechanism 1500 is installed in an exit device, the body portion 1692 may be aligned with an aperture in a cover plate of the exit device (e.g., an aperture in the cover plate 118 or the proximal plate 1336). In such forms, a user may insert a hex key into the opening 1693 through the aperture, and may subsequently rotate the hex key to cause a corresponding rotation of the actuator 1690. Such rotation of the actuator 1690 may cause a corresponding rotation of the trigger 1530, thereby causing the dogging mechanism 1500 to transition between the dogging and undogging states.

Figure 34:
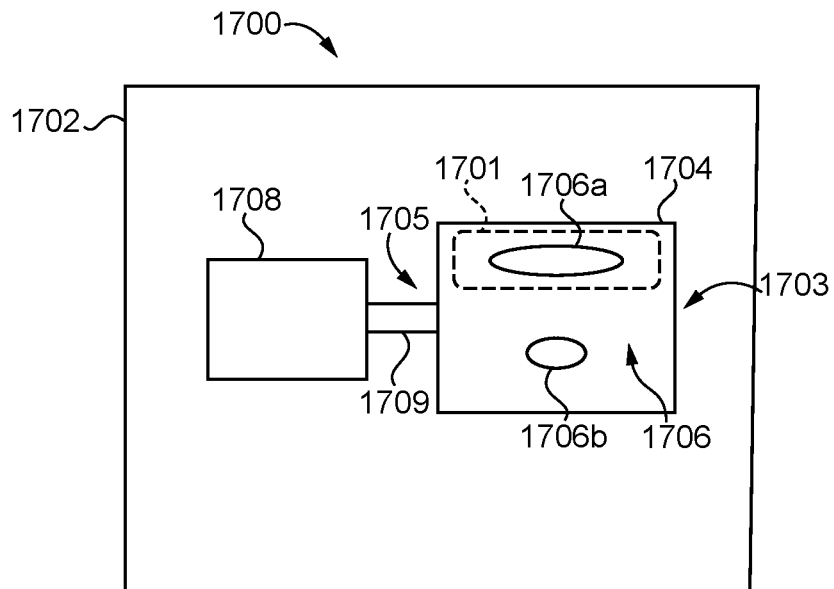
FIGS. 34-37 illustrate visual indicator assemblies according to various embodiments.

FIG. 34 is a schematic illustration of an indicator assembly 1700 according to one embodiment. The indicator assembly 1700 is configured for use with an exit device 20 such as the exit device 100, and may be included in a retrofit kit such as the kit 1300. With the indicator assembly 1700 installed in the exit device 20, a portion of the indicator assembly 1700 is visible through a window 1701 formed in the exit device 20. The window 1701 may, for example, be provided in a cover plate such as one of the above-described cover plates 118, 1352, 1376.

The indicator assembly 1700 includes a mounting bracket 1702, a mechanical indicator 1704 having a plurality of indicia 1706 provided thereon, and a motor 1708 operable to move a shaft 1709. The indicator 1704 is movably mounted to the bracket 1702 via a movable coupling 1703. As a result, indicator 1704 is capable of moving between a plurality of indicia-displaying positions to selectively align the indicia 1706 with the window 1701 such that the aligned indicium is displayed to persons viewing the exit device 20. Each of the indicia 1706 is configured to convey information related to a corresponding state or condition of the exit device 20. For example, each of the indicia 1706 may include one or more words, symbols, or colors that indicate the corresponding state or condition of the exit device 20. Additionally, the indicator 1704 is engaged with the shaft 1709 at an engagement interface 1705 that is configured to move the indicator 1704 between the positions in response to actuation of the motor 1708.

When the assembly 1700 is installed to the exit device 20, the motor 1708 is in communication with the control system 400 such that the control system 400 is capable of actuating the motor 1708. The control system 400 may determine a current state of the exit device 20 based upon information received from the sensors 408, and may control operation of the motor 1708 to align the corresponding indicium 1706 with the window 1701, thereby indicating the determined state to users viewing the exit device 20.

In certain embodiments, a first indicium 1706*a* may relate to a secured state, a second indicium 1706*b* may relate to an unsecured state, and the control system 400 may determine the secured/unsecured state of the exit device 20 based upon information received from the door position sensor 420 and the latchbolt sensor 424. The control system 400 may determine that the exit device 20 is in the secured state when the door position sensor 420 and the latchbolt sensor 424 respectively indicate that the door is closed and the latchbolt is extended, and may control the motor 1708 to align the first indicium 1706*a* with the window 1701 in response to such a determination. When the sensors 420, 424 indicate that the door is open and/or the latchbolt is retracted, the control system 400 may control the motor 1708 to move the indicator 1704 to a position in which the second indicium 1706*b* is aligned with the window 1701, thereby indicating that the exit device 20 is in the unsecured state.

In certain embodiments, the first indicium 1706*a* may relate to a dogged state, the second indicium 1706*b* may relate to an undogged state, and the control system 400 may determine the dogged/undogged state of the exit device 20 based upon information received from the dogging status sensor 422 and the request-to-exit sensor 426. The control system 400 may determine that the exit device 20 is in the dogged state when the dogging status sensor 422 and the request-to-exit sensor 426 respectively indicate that the trigger is in the actuated range and the drive assembly is in the actuated state, and may control the motor 1708 to align the first indicium 1706*a* with the window 1701 in response to such a determination. When the sensors 423, 426 indicate that the trigger is in the deactuated range and/or the drive assembly is in the deactuated state, the control system 400 may control the motor 1708 to move the indicator 1704 to a position in which the second indicium 1706*b* is aligned with the window 1701, thereby indicating that the exit device 20 is in the undogged state.

Figure 35:
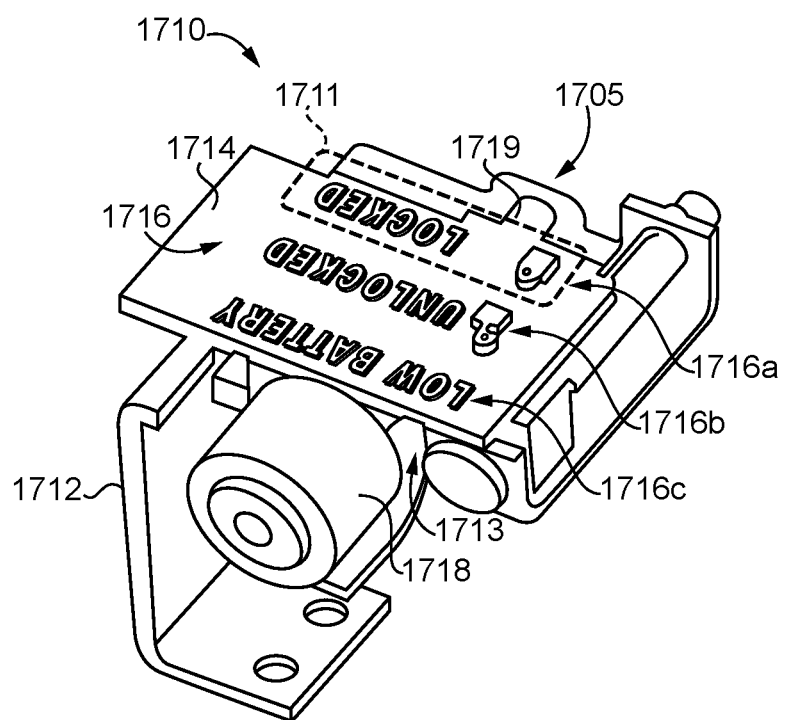
Figure 36:
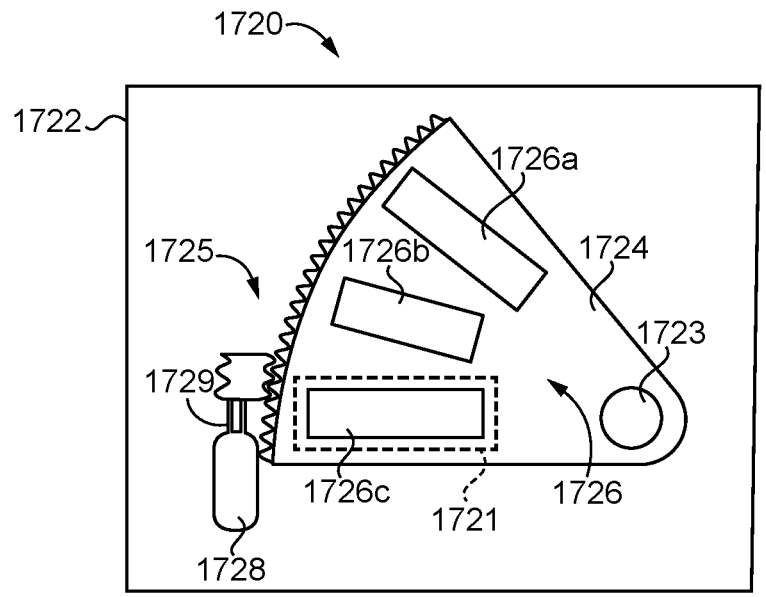
Figure 37:
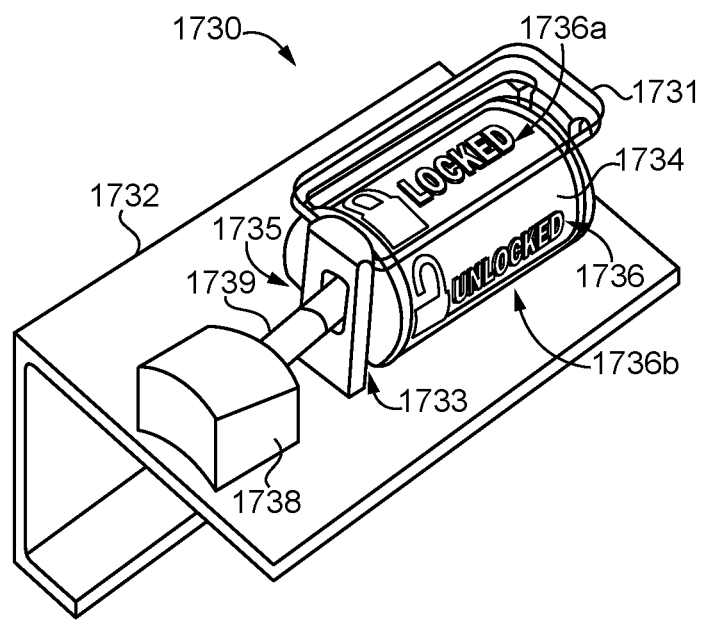

FIGS. 35-37 illustrate mechanical visual indicator assemblies 1710, 1720, 1730 according to certain embodiments. Each of the indicator assemblies 1710, 1720, 1730 is an exemplary implementation of the indicator assembly 1700 illustrated in FIG. 34, and similar reference characters are used to indicate similar elements and features. In the interest of conciseness, the following descriptions focuses primarily on features of the indicator assemblies 1710, 1720, 1730 that are different were not specifically described with respect to the assembly 1700.

With reference to FIG. 35, a visual indicator assembly 1710 according to certain embodiments includes a sliding indicator plate 1714 that is slidably mounted to a bracket 1712 via a sliding coupling 1713. The indicator plate 1714 has a plurality of indicia 1716, including a first indicium 1716*a* related to a locked state, a second indicium 1716*b* related to an unlocked state, and a third indicium 1716*c* related to a low battery state. The motor 1718 is operable to rotate the shaft 1719 in opposite rotational directions, and the engagement interface 1715 is configured to move the indicator plate 1714 linearly in response to rotation of the shaft 1719. The illustrated engagement interface 1715 includes a worm that is coupled to the shaft 1719, and a tab that is coupled to the indicator plate 1714. As the shaft 1719 rotates, the threads of the worm engage the tab and linearly drive the indicator plate 1714, thereby moving one of the indicia 1716 into alignment with the window 1711.

With reference to FIG. 36, a visual indicator assembly 1720 according to another embodiment includes a pivoting indicator plate 1724 that is pivotably mounted to a bracket 1722 via a pivot boss 1723. The indicator plate 1724 has a plurality of indicia 1726, including a first indicium 1726*a* related to a first state, a second indicium 1726*b* related to a second state, and a third indicium 1726*c* related to a third state. The motor 1728 is operable to rotate the shaft 1729 in opposite rotational directions, and the engagement interface 1725 is configured to rotate the indicator plate 1724 about the boss 1723 in response to rotation of the shaft 1729. The illustrated engagement interface 1725 includes a worm that is coupled to the shaft 1729, and a plurality of teeth formed on an arcuate outer edge of the indicator plate 1724. As the shaft 1729 rotates, the threads of the worm engage the teeth and rotate the indicator plate 1724, thereby moving one of the indicia 1726 into alignment with the window 1721.

With reference to FIG. 37, a visual indicator assembly 1730 according to another embodiment includes an indicator drum 1734 that is rotatably mounted to a bracket 1732 via a bearing 1733. The indicator drum 1734 has a plurality of indicia 1736, including a first indicium 1736*a* related to a locked state, and a second indicium 1736*b* related to an unlocked state. The motor 1738 is operable to rotate the shaft 1739 in opposite rotational directions, and the engagement interface 1735 is configured to rotate the indicator plate 1734 about the bearing 1733 in response to rotation of the shaft 1739. The illustrated engagement interface 1735 includes a coupling that rotationally couples the shaft with the indicator drum 1734 such that rotation of the shaft 1739 moves one of the indicia 1736 into alignment with the window 1731.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

There is provided a method comprising establishing a wireless communication connection between an exit device and a management system remote from the exit device; receiving, by the exit device and via the wireless communication connection, an instruction from the management system to change a dogging state of the exit device by moving a dogging mechanism of the exit device to one of an undogged state or a dog-on-next-exit state; and moving the dogging mechanism to the one of the undogged state or the dog-on-next-exit state in response to the instruction, wherein a pushbar of the exit device is in an extended position when the dogging mechanism is in the undogged state, and wherein the pushbar is positioned to be held in a retracted position by the dogging mechanism upon a next depression of the pushbar by a user when the dogging mechanism is in the dog-on-next-exit state.

In some embodiments, moving the dogging mechanism to the one of the undogged state or the dog-on-next-exit state in response to the instruction may comprise transmitting an electrical signal to the dogging mechanism.

In some embodiments, the method may further comprise transmitting, by the exit device and via the wireless communication connection, a notification of a change in the dogging state of the exit device in response to moving the dogging mechanism to the one of the undogged state or the dog-on-next-exit state.

In some embodiments, the method may further comprise determining, by the exit device, a security state of the exit device based on sensor data generated by a plurality of sensors of the exit device; and providing, by the exit device, a notification of the security state in response to determining the security state.

In some embodiments, determining the security state of the exit device may comprise determining a door position status that indicates whether a door is in one of a closed position or an open position; determining a latchbolt status that indicates whether a latchbolt of the exit device is in one of an extended position or a retracted position; and determining a dogging status that indicates whether a dogging mechanism of the exit device is positioned to hold a pushbar of the exit device in a retracted position.

In some embodiments, a determination of the security state may indicate that the door is secure in response to the door position status indicating that the door is in the closed position, the latchbolt status indicating that the latchbolt is in the extended position, and the dogging status indicating that the dogging mechanism is not positioned to hold the pushbar in the retracted position.

In some embodiments, determining the security state of the exit device may further comprise determining whether a trim of the door has been tampered; and the determination of the security state may indicate that the door is secure in response to the door position status indicating that the door is in the closed position, the latchbolt status indicating that the latchbolt is in the extended position, the dogging status indicating that the dogging mechanism is not positioned to hold the pushbar in the retracted position, and that the trim of the door has not been tampered.

In some embodiments, determining the security state of the exit device may further comprise detecting an internal fault of the exit device.

In some embodiments, providing the notification of the security state may comprise wirelessly transmitting the notification to the management system.

In some embodiments, providing the notification of the security state may comprise displaying the notification on a visual indicator of the exit device.

There is also provided an exit device, comprising a dogging mechanism having an undogged state, a dog-on-next-exit state, and a dogged state; a pushbar having an extended position and a retracted position, wherein the pushbar is in the extended position when the dogging mechanism is in the undogged state, and the pushbar is positioned to be held in the retracted position by the dogging mechanism upon a next depression of the pushbar by a user when the dogging mechanism is in the dog-on-next-exit state; a wireless communication circuitry; a processor; and a memory comprising a plurality of instructions stored thereon that, in response to execution by the processor, causes the exit device to receive, via the wireless communication circuitry, an instruction from a management system to change a dogging state of the exit device by moving the dogging mechanism to one of the undogged state or the dog-on-next-exit state; and transmit, in response to the instruction, one or more electrical signals to the dogging mechanism to cause the dogging mechanism to move to the one of the undogged state or the dog-on-next-exit state.

In some embodiments, the exit device may further comprise a plurality of sensors adapted to generate sensor data, wherein the plurality of instructions further causes the exit device to determine a security state of the exit device based on the sensor data; and provide a notification of the security state in response to a determination of the security state.

In some embodiments, the plurality of sensors may comprise a door position sensor, a latchbolt sensor, and a dogging status sensor; and wherein to determine the security state of the exit device may comprise to determine a door position status that indicates whether a door is in one of a closed position or an open position based on sensor data generated by the door position sensor; determine a latchbolt status that indicates whether a latchbolt of the exit device is in one of an extended position or a retracted position based on sensor data generated by the latchbolt sensor; and determine a dogging status that indicates whether the dogging mechanism is positioned to hold the pushbar in the retracted position based on sensor data generated by the dogging status sensor.

In some embodiments, a determination of the security state may indicate that the door is secure in response to the door position status indicating that the door is in the closed position, the latchbolt status indicating that the latchbolt is in the extended position, and the dogging status indicating that the dogging mechanism is not positioned to hold the pushbar in the retracted position.

In some embodiments, to provide the notification of the security state may comprise to wirelessly transmit the notification to the management system via the wireless communication circuitry.

In some embodiments, the exit device may further comprise a visual indicator, wherein to provide the notification of the security state comprises to display the notification on the visual indicator.

In some embodiments, the exit device may further comprise a manual dogging actuator configured to change the dogging state of the exit device by moving the dogging mechanism to the one of the undogged state or the dog-on-next-exit state in response to a manual actuating input; and an electronic dogging actuator configured to change the dogging state of the exit device by moving the dogging mechanism to the one of the undogged state or the dog-on-next-exit state in response to the one or more electrical signals; wherein the manual dogging actuator and the electronic dogging actuator are independently operable to change the dogging state of the exit device such that each of the manual dogging actuator and the electronic dogging actuator is capable of moving the dogging mechanism to the one of the undogged state or the dog-on-next-exit state when the dogging mechanism has been set to the other of the undogged state or the dog-on-next-exit state by the other of the manual dogging actuator and the electronic dogging actuator.

There is also provided a method comprising determining, by an exit device, a door position status that indicates whether a door is in one of a closed position or an open position based on sensor data generated by a door position sensor; determining, by the exit device, a latchbolt status that indicates whether a latchbolt of the exit device is in one of an extended position or a retracted position based on sensor data generated by a latchbolt sensor; determining, by the exit device, a dogging status that indicates whether a dogging mechanism of the exit device is positioned to hold a pushbar of the exit device in a retracted position based on sensor data generated by a dogging status sensor; determining, by the exit device, a security state of the exit device based on the door position status, the latchbolt status, and the dogging status; and transmitting, by the exit device, a notification of the security state to a management system over a wireless communication connection established between the exit device and the management system, wherein a determination of the security state indicates that the door is secure in response to the door position status indicating that the door is in the closed position, the latchbolt status indicating that the latchbolt is in the extended position, and the dogging status indicating that the dogging mechanism is not positioned to hold the pushbar in the retracted position.

In some embodiments, the method may further comprise displaying another notification of the security state on a visual indicator of the exit device.

In some embodiments, the visual indicator may comprise one or more light emitting diodes.

In some embodiments, the exit device may comprise a window through which a portion of the visual indicator is visible; and wherein the visual indicator comprises a mechanical indicator having a plurality of indicia defined thereon, wherein each of the plurality of indicia is indicative of a separate message to be conveyed to a user in a vicinity of the exit device; and a motor configured to move the mechanical indicator to align an indicium of the plurality of indicia with the window, the indicium conveying the another notification of the security state.

There is also provided a method comprising establishing, by an exit device, a wireless communication connection with a management system remote from the exit device; transmitting, by the exit device, audit data to the management system; receiving, by the exit device, a transmission deadline from the management system in response to transmitting the audit data to the management system, wherein the transmission deadline identifies a maximum time to elapse following disconnection of the wireless communication connection prior to re-establishing the wireless communication connection; disconnecting, by the exit device, the wireless communication connection with the management system in response to receiving the transmission deadline from the management system; re-establishing, by the exit device, the wireless communication connection with the management system in response to at least one of (i) a determination that the exit device has attempted to change a dogging state of a dogging mechanism of the exit device to an undogged state, (ii) a determination that a tamper of the exit device has been detected, or (iii) a determination that the transmission deadline has elapsed.

In some embodiments, the method may further comprise receiving, by the exit device, an updated dogging schedule from the management system in response to transmitting the audit data to the management system, wherein the updated dogging schedule identifies at least one future time at which to change the dogging state of the dogging mechanism to the undogged state if the dogging mechanism is not already in the undogged state.

There is also provided a method comprising determining, by an exit device secured to a door, a door position status and a dogging status of the exit device based on a plurality of sensors of the exit device, wherein the door position status indicates whether the door is in one of a closed position or an open position, and wherein the dogging status indicates whether a dogging mechanism of the exit device is positioned to hold a pushbar of the exit device in a retracted position; generating, by the exit device, a prop notification indicative of an occurrence of a prop event of the door based on the door position status and the dogging status; and transmitting, by the exit device, the prop notification to a remote management system.

In some embodiments, the method may further comprise determining, by the exit device, the occurrence of the prop event in response to the door position status indicating the door is in the open position and the dogging status indicating the dogging mechanism is not positioned to hold the pushbar in the retracted position.

In some embodiments, determining the occurrence of the prop event may be in response to the door position status indicating the door is in the open position for at least a threshold amount of time.

In some embodiments, the method may further comprise determining, by the exit device, a dogging schedule that identifies one or more times at which dogging of the exit device is permitted; and determining, by the exit device, the occurrence of the prop event in response to the dogging status indicating the dogging mechanism is positioned to hold the pushbar in the retracted position for at least a threshold amount of time outside of a permitted dogging time.

In some embodiments, the method may further comprise determining, by the exit device, a latchbolt status of the exit device; wherein the latchbolt status indicates whether a latchbolt of the exit device is in one of an extended position or a retracted position; and wherein generating the prop notification comprises generating a prop notification based on the door position status, the dogging status, and the latchbolt status.

In some embodiments, the method may further comprise determining, by the exit device, the occurrence of the prop event in response to the door position status indicating the door is in the closed position, the latchbolt status indicating the latchbolt is in the retracted position, and the dogging status indicating the dogging mechanism is not positioned to hold the pushbar in the retracted position.

In some embodiments, transmitting the prop notification may comprise wirelessly transmitting the prop notification to the remote management over a wireless communication channel.

There is also provided an exit device comprising a plurality of sensors adapted to generate sensor data; a processor; and a memory comprising a plurality of instructions stored thereon that, in response to execution by the processor, causes the exit device to determine a door position status and a dogging status of the exit device based on the sensor data, wherein the door position status indicates whether a door is in one of a closed position or an open position, and wherein the dogging status indicates whether a dogging mechanism of the exit device is positioned to hold a pushbar of the exit device in a retracted position; and generate a prop notification indicative of an occurrence of a prop event of the door based on the door position status and the dogging status.

In some embodiments, the exit device may further comprise a wireless communication circuitry, wherein the plurality of instructions further causes the exit device to wirelessly transmit the prop notification to a remote management system via the wireless communication circuitry.

In some embodiments, the plurality of instructions may further cause the exit device to determine the occurrence of the prop event in response to the door position status indicating the door is in the open position and the dogging status indicating the dogging mechanism is not positioned to hold the pushbar in the retracted position.

In some embodiments, the determination of the occurrence of the prop event may be in response to the door position status indicating the door is in the open position for at least a threshold amount of time.

In some embodiments, the plurality of instructions may further cause the exit device to determine a dogging schedule that identifies one or more times at which dogging of the exit device is permitted; and determine the occurrence of the prop event in response to the dogging status indicating the dogging mechanism is positioned to hold the pushbar in the retracted position for at least a threshold amount of time outside of a permitted dogging time.

In some embodiments, the plurality of instructions may further cause the exit device to determine a latchbolt status of the exit device; wherein the latchbolt status indicates whether a latchbolt of the exit device is in one of an extended position or a retracted position; and wherein to generate the prop notification comprises to generate a prop notification based on the door position status, the dogging status, and the latchbolt status.

In some embodiments, the plurality of instructions may further cause the exit device to determine the occurrence of the prop event in response to the door position status indicating the door is in the closed position, the latchbolt status indicating the latchbolt is in the retracted position, and the dogging status indicating the dogging mechanism is not positioned to hold the pushbar in the retracted position.

In some embodiments, the plurality of sensors may comprise a door position sensor, a request-to-exit sensor, a latchbolt sensor, and a dogging status sensor.

In some embodiments, the door position may comprise a magnetometer.

There is also provided a system for wireless door prop notification, the system comprising a management system; and an exit device comprising a plurality of sensors adapted to generate sensor data, the exit device configured to (i) determine a door position status, a dogging status, and a latchbolt status of the exit device based on the sensor data, (ii) generate a prop notification indicative of an occurrence of a prop event of the door based on the door position status, the dogging status, and the latchbolt status and (iii) transmit the prop notification to the management system, wherein the door position status indicates whether a door is in one of a closed position or an open position, wherein the dogging status indicates whether a dogging mechanism of the exit device is positioned to hold a pushbar of the exit device in a retracted position, and wherein the latchbolt status indicates whether a latchbolt of the exit device is in one of an extended position or a retracted position.

In some embodiments, the exit device may be further configured to determine a dogging schedule that identifies one or more times at which dogging of the exit device is permitted; and determine the occurrence of the prop event in response to at least one of (i) the door position status indicating the door is in the open position for at least a first threshold amount of time and the dogging status indicating the pushbar is in the extended position, (ii) the dogging status indicating the pushbar is in the extended position for at least a second threshold amount of time outside of a permitted dogging time, or (iii) the door position status indicating the door is in the closed position, the latchbolt status indicating the latchbolt is in the retracted position, and the dogging status indicating the dogging mechanism is not positioned to hold the pushbar in the retracted position.

In some embodiments, the exit device may comprise a wireless communication circuitry; and wherein the exit device may be configured to wirelessly transmit the prop notification to the management system via the wireless communication circuitry.

In some embodiments, the management system may comprise at least one of a gateway device, a mobile computing device, an access control panel, and a management server.

There is also provided an exit device comprising a drive assembly having an actuated state and a deactuated state, the drive assembly comprising a manually actuated pushbar operable to transition the drive assembly between the actuated state and the deactuated state, and a link bar operably connected with the pushbar, the link bar having an actuated link bar position in the actuated state, and a deactuated link bar position in the deactuated state; a biasing member urging the drive assembly toward the deactuated state; and a dogging mechanism having a undogged state, a ready state, and a dogged state, the dogging mechanism comprising a hook having an actuated hook position and a deactuated hook position, wherein the link bar is configured to urge the hook toward the actuated hook position as the link bar travels toward the actuated link bar position, and to urge the hook toward the deactuated hook position as the link bar travels toward the deactuated link bar position; a trigger having an actuated trigger position, a deactuated trigger position, and a ready trigger position between the actuated trigger position and the deactuated trigger position; and a spring mechanism engaged with the trigger, wherein the spring mechanism is configured to selectively bias the trigger toward each of the actuated trigger position and the deactuated trigger position; wherein in the undogged state, the spring mechanism biases the trigger toward the deactuated trigger position, and the hook is free to move between the actuated hook position and the deactuated hook position; wherein in the ready state, the hook is in the deactuated hook position, the trigger is in the ready trigger position and is engaged with the hook, and the spring mechanism biases the trigger toward the actuated trigger position such that the trigger moves from the ready trigger position to the actuated trigger position in response to movement of the hook from the deactuated hook position to the actuated hook position; and wherein in the dogged state, the hook is in the actuated hook position, the trigger is in the actuated trigger position, and the trigger prevents the hook from moving to the deactuated hook position, thereby retaining the link bar in the actuated link bar position, thereby retaining the drive assembly in the actuated state against the force of the biasing member.

In some embodiments, the trigger may be movable through a deactuated range including the deactuated trigger position and an actuated range including the ready trigger position and the actuated trigger position, wherein the dogging mechanism may further comprise an electrically-operated driver operably connected with the trigger, wherein the driver is operable to move the trigger between the deactuated range and the actuated range.

In some embodiments, the exit device may further comprise a manual dogging actuator operably connected with the trigger, the manual dogging actuator operable to move the trigger between the deactuated range and the actuated range.

In some embodiments, the manual dogging actuator and the electrically-operated driver may be independently operable to move the trigger between the deactuated range and the actuated range such that each of the manual dogging actuator and the electrically-operated driver is at all times capable of moving the trigger between the deactuated range and the actuated range.

In some embodiments, the spring mechanism may be configured to urge the trigger toward the deactuated trigger position when the trigger is in the deactuated range, and to urge the trigger toward the actuated trigger position when the trigger is in the actuated range.

In some embodiments, with the drive assembly in the actuated state, the biasing member may exert a first force on the hook via the link bar; wherein the first force urges the hook toward the deactuated hook position; wherein with the dogging mechanism in the dogged state, the first force on the hook is translated to a second force exerted by the hook on the trigger; and wherein the second force is inoperable to move the trigger from the actuated trigger position toward the deactuated trigger position.

In some embodiments, the trigger may be rotatable about a trigger axis between the deactuated range and the actuated range, wherein the second force results in a torque about the trigger axis, and wherein the trigger is configured to mechanically counteract the second force and the torque.

In some embodiments, the second force may be exerted on the trigger at a point of contact between the hook and the trigger, wherein a line extends between the trigger axis and the point of contact, and wherein the second force is exerted along the line such that the torque about the trigger axis is negligible.

In some embodiments, the driver may comprise a linear actuator including an output shaft; wherein the dogging mechanism further comprises a link plate coupled with the output shaft; wherein the driver is operable to move the link plate between an actuating position, a neutral position, and a deactuating position; wherein the link plate is connected to the trigger via a lost motion connection; wherein the lost motion connection is configured to place the trigger in the actuated range when the link plate is in the actuating position, to place the trigger in the deactuated range when the link plate is in the deactuating position, and to permit the trigger to move between the actuating range and the deactuating range when the link plate is in the neutral position.

In some embodiments, the lost motion connection may be further configured to permit the trigger to remain within the actuated range as the link plate moves from the actuating position to the neutral position, and to permit the trigger to remain within the deactuated range as the link plate moves from the deactuating position to the neutral position.

In some embodiments, the link plate may be constrained to movement along a linear path including the actuating position, the neutral position, and the deactuating position.

There is also provided a dogging assembly comprising a base plate including a first anchor point; a hook mounted to the base plate for rotation about a hook axis, wherein the hook is rotatable about the hook axis between an actuated hook position and a deactuated hook position; a trigger mounted to the base plate for rotation about a trigger axis offset from the hook axis, wherein the trigger includes a second anchor point, wherein a boundary plane extends along the trigger axis and includes the first anchor point, wherein the trigger is rotatable about the trigger axis through a deactuated range in which the second anchor point is located on a first side of the boundary plane and an actuated range in which the second anchor point is located on an opposite second side of the boundary plane, wherein the deactuated range includes a deactuated trigger position, and wherein the actuated range includes an actuated trigger position; an over-center spring mechanism having a first end portion and an opposite second end portion, wherein the first end portion is attached to the base plate at the first anchor point, wherein the second end portion is attached to the trigger at the second anchor point, wherein the over-center spring mechanism is configured to urge the trigger toward the deactuated trigger position when the trigger is in the deactuated range, and to urge the trigger toward the actuated trigger position when the trigger is in the actuated range; and an electrically-actuated driver drivingly connected to the trigger, wherein the driver is operable to move the trigger between the deactuated range and the actuated range; wherein the dogging mechanism is selectively operable in each of a plurality of states, the plurality of states including an undogged state, a ready state, and a dogged state; wherein in the undogged state, the trigger is in the deactuated range, and the hook is free to rotate between the actuated hook position and the deactuated hook position; wherein in the ready state, the trigger is in the actuated range, the hook is in the deactuated hook position, the over-center spring mechanism urges the trigger into contact with the hook, and the hook prevents the trigger from moving to the actuated trigger position; wherein in the dogged state, the trigger is in the actuated trigger position, the hook is in the actuated hook position, and the trigger prevents the hook from moving to the deactuated hook position; wherein the dogging mechanism is configured to transition from the ready state to the dogged state in response to rotation of the hook from the unactuated hook position to the actuated hook position; and wherein the dogging mechanism is configured to transition from the dogged state to the undogged state in response to rotation of the trigger from the actuated trigger position to the deactuated trigger position.

In some embodiments, the dogging assembly may further comprise a link plate slidably mounted to base plate; wherein the driver is connected to the link plate and is operable to move the link plate between an actuating position, a deactuating position, and a neutral position; wherein the link plate is configured to place the trigger in the deactuated range as the link plate moves from the neutral position to the deactuating position; and wherein the link plate is configured to place the trigger in the actuated range as the link plate moves from the neutral position to the actuating position.

In some embodiments, the link plate may be connected to the trigger via a lost motion connection; wherein the lost motion connection is configured to enable the trigger to remain in the deactuated range as the link plate moves from the deactuating position to the neutral position; and wherein the lost motion connection is configured to enable the trigger to remain in the actuated range as the link plate moves from the actuating position to the neutral position.

In some embodiments, the actuating position may be offset from the neutral position in an actuating direction, wherein the deactuating position is offset from the neutral position in a deactuating direction, wherein the driver is configured to move the link plate in the actuating direction in response to an actuating command, and wherein the driver is configured to move the link plate in the deactuating direction in response to a deactuating command.

In some embodiments, the dogging assembly may further comprise an electrical power source and a controller; wherein the controller is in communication with the electrical power source and the driver; wherein the controller is configured to perform a dogging operation in response to a dogging command, the dogging operation comprising issuing the actuating command to the driver such that the driver moves the link plate from the neutral position to the actuating position, and subsequently issuing the deactuating command to the driver such that the driver moves the link plate from the actuating position to the neutral position; and wherein the controller is configured to perform an undogging operation in response to an undogging command, the undogging operation comprising issuing the deactuating command to the driver such that the driver moves the link plate from the neutral position to the deactuating position, and subsequently issuing the actuating command to the driver such that the driver moves the link plate from the deactuating position to the neutral position.

In some embodiments, the dogging assembly may further comprise a wireless communication device, wherein the controller is operable to receive the dogging command and the undogging command via the wireless communication device.

In some embodiments, the dogging assembly may further comprise a dogging status sensor in communication with the controller and associated with the trigger, wherein the trigger is configured to activate the dogging status sensor when in one of the actuating range and the deactuating range, and to deactivate the dogging status sensor when in the other of the actuating range and the deactuating range.

In some embodiments, the trigger may comprise a protrusion including a first surface; wherein the hook comprises a notch including a second surface; wherein in the dogged state, the first surface and the second surface are engaged with one another at a contact point; and wherein engagement between the first surface and the second surface is configured to retain the hook in the actuated hook position and to permit the trigger to move toward the deactuated hook position.

In some embodiments, in the dogged state, the first surface and the second surface may be substantially normal to a line extending between the trigger axis and the contact point.

In some embodiments, the hook may comprise an arm, a finger, and a hook recess formed between the arm and the finger; wherein the arm includes an extension; and wherein in the ready state, a tip of the trigger is engaged with the extension.

In some embodiments, the over-center spring mechanism may comprise a compression spring and an expandable guide mechanism extending through the compression spring.

There is also provided a method of retrofitting an exit device comprising a mounting assembly, a drive assembly, and a latchbolt assembly; wherein the mounting assembly includes a channel member, a header plate, and a header bracket mounted to the header plate; wherein the drive assembly is movably mounted to the mounting assembly and includes a pushbar and a drive rod operatively connected with the pushbar; and wherein the latchbolt assembly is operatively connected with the drive assembly and includes a latchbolt movably mounted to the header bracket, and a retractor pivotally connected with the latchbolt for movement therewith, the retractor including an extension extending through an opening of the header bracket; the method comprising installing a control assembly to the exit device, wherein the control assembly includes a housing assembly and a controller mounted to the housing assembly, and wherein installing the control assembly includes mounting the housing assembly to the channel member such that the drive rod is positioned between the housing assembly and the retractor; installing a header sensor assembly to the exit device, wherein the header sensor assembly includes a base plate and a latchbolt position sensor mounted to the base plate, and wherein installing the header sensor assembly includes mounting the base plate to the header bracket and aligning the latchbolt position sensor with the extension such that the retractor causes the latchbolt position sensor to transition states in response to movement of the latchbolt between a latchbolt-extended position and a latchbolt-retracted position; and installing a wiring assembly to the exit device, wherein the wiring assembly comprises a first plurality of wires, wherein installing the wiring assembly includes connecting the first plurality of wires with the control assembly and the header sensor assembly such that the latchbolt position sensor is in communication with the controller via the first plurality of wires, and placing at least a portion of the wiring assembly in the channel member.

In some embodiments, the latchbolt position sensor may be movably mounted to the base plate, and wherein aligning the latchbolt position sensor with the extension comprises adjusting a position of the latchbolt position sensor relative to the base plate after mounting the base plate to the header bracket.

In some embodiments, installing the header sensor assembly to the exit device may comprise engaging one or more positioning flanges of the base plate of the header sensor assembly with at least one of a proximal edge or a sidewall of the header bracket.

In some embodiments, mounting the base plate to the header bracket may comprise adhering the base plate to a base wall of the header bracket using a double-sided adhesive tape.

In some embodiments, the wiring assembly may comprise a wire harness including the first plurality of wires, a first wire harness connector, and a second wire harness connector in communication with the first wire harness connector via the first plurality of wires; wherein the control assembly further includes a first mating connector in communication with the controller; wherein the header sensor assembly further includes a second mating connector in communication with the latchbolt position sensor; and wherein connecting the first plurality of wires with the control assembly and the header sensor assembly includes engaging the first wire harness connector with the first mating connector and engaging the second wire harness connector with the second mating connector.

In some embodiments, the method may further comprise installing a conduit to the exit device; wherein installing the conduit to the exit device comprises placing the conduit in the channel member such that the conduit is positioned between the drive rod and a sidewall of the channel member; and wherein installing the wiring assembly further includes placing a portion of the wire harness in the conduit such that the first plurality of wires extends through a length of the conduit.

In some embodiments, the method may further comprise installing a request-to-exit (REX) sensor assembly to the exit device; wherein the REX sensor assembly includes a mounting device and a REX sensor mounted to the mounting device; wherein installing the REX sensor assembly includes mounting the mounting device to a component of the mounting assembly and aligning the REX sensor with a component of the drive assembly such that the component of the drive assembly causes the REX sensor to transition states in response to movement of the drive assembly between an actuated state and a deactuated state; wherein the wiring assembly further comprises a second plurality of wires; and wherein installing the wiring assembly further includes connecting the second plurality of wires with the REX sensor assembly and the control assembly such that the REX sensor is in communication with the controller via the second plurality of wires.

In some embodiments, the wire harness may further include the second plurality of wires and a third wire harness connector in communication with the first wire harness connector via the second plurality of wires; wherein the REX sensor assembly further includes a third mating connector in communication with the REX sensor; and wherein connecting the second plurality of wires with the REX sensor assembly and the control assembly includes engaging the first wire harness connector with the first mating connector and engaging the third wire harness connector with the third mating connector.

In some embodiments, the method may further comprise installing a request-to-exit (REX) sensor assembly to the exit device; wherein the REX sensor assembly includes a first REX sensor, a second REX sensor, and a mounting device to which the first REX sensor and the second REX sensor are mounted; wherein installing the REX sensor assembly includes attaching the mounting device to a component of the mounting assembly; aligning the first REX sensor with a first portion of the drive assembly such that the first portion of the drive assembly causes the first REX sensor to transition states in response to movement of the drive assembly through a first transitional position; and aligning the second REX sensor with a second portion of the drive assembly such that the second portion of the drive assembly causes the second REX sensor to transition states in response to movement of the drive assembly through a second transitional position; wherein the first transitional position is different from the second transitional position such that the first REX sensor transitions states at a different time than the second REX sensor transitions states during movement of the drive assembly between an actuated state and a deactuated state; wherein the wiring assembly further comprises a second plurality of wires; and wherein installing the wiring assembly further includes connecting the second plurality of wires with the control assembly and the REX sensor assembly such that each of the first REX sensor and the second REX sensor is in communication with the controller via the second plurality of wires.

In some embodiments, the header sensor assembly may further include at least one additional sensor mounted to the base plate; wherein the wiring assembly further includes a second plurality of wires; and wherein installing the wiring assembly further includes connecting the second plurality of wires with the control assembly and the header sensor assembly such that the at least one additional sensor is in communication with the controller via the second plurality of wires.

In some embodiments, the at least one additional sensor may comprise an inertial sensor; and the method may further comprise transmitting, from the inertial sensor to the controller, signals related to movement of the exit device.

In some embodiments, the at least one additional sensor may comprise a magnetometer; and the method may further comprise transmitting, from the magnetometer to the controller, signals related to a magnetic field generated at least in part by a magnet installed to a door frame; and determining, by the controller, a door position based at least in part upon the signals related to the magnetic field.

In some embodiments, the housing assembly includes a housing having a first set of rails; wherein the channel member includes a first set of passages; and wherein mounting the housing assembly to the channel member includes slidably engaging the first set of rails with the first set of passages.

In some embodiments, the housing assembly may further include a faceplate and a mounting device; wherein the mounting device is formed in part on the faceplate and in part on the housing; wherein the mounting device includes a second set of rails and a second set of passages; and wherein mounting the housing assembly to the channel member further includes slidably engaging the second set of rails with the second set of passages.

There is also provided a retrofit kit for an exit device comprising a mounting assembly, a drive assembly, and a latchbolt assembly; wherein the mounting assembly includes a channel member, a header plate, and a header bracket mounted to the header plate; wherein the drive assembly is movably mounted to the mounting assembly and includes a manually-operable pushbar; and wherein the latchbolt assembly is operably connected with the drive assembly and includes a latchbolt movably mounted to the header bracket; the retrofit kit comprising a conduit configured to be positioned in the channel member, the conduit including a coupling feature configured to engage a corresponding coupling feature of the mounting assembly; a wire harness including a first plurality of wires, a first wire harness connector, and a second wire harness connector in communication with the first wire harness connector via the first plurality of wires, wherein the first plurality of wires is configured to be received in the conduit and to extend through a length of the conduit; a header sensor assembly comprising a base plate including an opening and a positioning flange, wherein the positioning flange is configured to engage one of an edge or a sidewall of the header bracket to aid in positioning of the base plate; a first mounting device operable to couple the base plate with the header bracket; a latchbolt position sensor movably mounted to the base plate, wherein the latchbolt position sensor is operable to transmit latchbolt position signals in response to movement of a component of the latchbolt assembly relative to a sensing region of the latchbolt position sensor, wherein the sensing region is aligned with the opening of the base plate; a first coupling device operable to selectively retain the latchbolt position sensor in each of a plurality of positions relative to the base plate; and a first mating connector in communication with the latchbolt position sensor, wherein the first mating connector is configured to matingly engage the first wire harness connector to electrically connect the first plurality of wires and the latchbolt position sensor; and a control assembly comprising a housing including a first set of rails operable to slidably engage a first set of passages formed in the channel member; a controller mounted to the housing; and a second mating connector in communication with the controller, wherein the second mating connector is configured to matingly engage the second wire harness connector to electrically connect the first plurality of wires and the controller; and wherein the controller is operable to determine an extended/retracted position of the latchbolt based at least in part upon latchbolt position signals received from the latchbolt position sensor.

In some embodiments, the control assembly may further comprise a wireless communication device in communication with the controller, and an onboard power supply operable to supply electrical power to the wireless communication device and the controller; and wherein the controller is further operable to transmit, via the wireless communication device, wireless signals related to the extended/retracted position of the latchbolt.

In some embodiments, the retrofit kit may further comprise a strike operable to engage the latchbolt, the strike including a magnet having a magnetic field; wherein the header sensor assembly further includes a magnetometer mounted to the baseplate and in communication with the first mating connector; wherein the magnetometer is configured to sense the magnetic field and to transmit door position signals related to the sensed magnetic field; and wherein the controller is further operable to determine a door-open/door-closed position based at least in part upon door position signals received from the magnetometer.

In some embodiments, the header sensor assembly may further include an inertial sensor mounted to the baseplate and in communication with the first mating connector; wherein the inertial sensor is configured to transmit movement signals related to movement of the baseplate; and wherein the controller is further operable to determine a movement parameter based at least in part upon movement signals received from the inertial sensor.

In some embodiments, the wire harness may further comprise a second plurality of wires and a third wire harness connector in communication with the second wire harness connector via the second plurality of wires; wherein the retrofit kit further comprises a request-to-exit (REX) sensor assembly comprising a mounting device configured to be mounted to the mounting assembly adjacent a movable component of the drive assembly; a REX sensor mounted to the mounting device and operable to transmit REX signals related to a position of the movable component of the drive assembly; and a third mating connector in communication with the REX sensor, wherein the third mating connector is configured to matingly engage the third wire harness connector to electrically connect the second plurality of wires and the REX sensor; and wherein the controller is further operable to determine a REX-positive/REX-negative condition based at least in part upon REX signals received from the REX sensor.

In some embodiments, the REX sensor assembly may further include an additional REX sensor, wherein the additional REX sensor is mounted to the mounting device, is in communication with the third mating connector, and is operable to transmit additional REX signals related to the position of the movable component of the drive assembly; wherein the REX sensor is configured to transition the REX signals between a first REX-positive signal and a first REX-negative signal in response to the movable component moving through a first transitional position; wherein the REX sensor is configured to transition the additional REX signals between a second REX-positive signal and a second REX-negative signal in response to the movable component moving through a second transitional position different from the first transitional position; and wherein the controller is configured to determine the REX-positive/REX-negative condition based in further part upon additional REX signals received from the additional REX sensor.

What is claimed is:

1. A method of operating an exit device comprising a pushbar, a drive assembly, and a dogging mechanism including a trigger and a movable member operable to engage the drive assembly, the method comprising:
   establishing, by a control system of the exit device, a wireless communication connection between the exit device and a management system remote from the exit device;
   receiving, by the control system of the exit device and via the wireless communication connection, an instruction from the management system to change a dogging state of the exit device by moving a dogging mechanism of the exit device to one of an undogged state or a dog-on-next-exit state; and
   moving, by the control system of the exit device, the dogging mechanism to the one of the undogged state or the dog-on-next-exit state in response to the received instruction,
   wherein, in response to the received instruction comprising an instruction to change the dogging state to the undogged state, the control system maintains the trigger in a first trigger position, thereby allowing free transition of the pushbar between a projected position and a depressed position for actuation of a latch mechanism;
   wherein, in response to the received instruction comprising an instruction to change the dogging state to the dog-on-next-exit state, the control system moves the trigger to a second position to engage the movable member such that depression of the pushbar causes the movable member to retain the drive assembly in an actuated state, thereby maintaining the pushbar in the depressed position and dogging the exit device.

2. The method of claim 1, wherein moving the dogging mechanism to the one of the undogged state or the dog-on-next-exit state in response to the instruction comprises transmitting an electrical signal to the dogging mechanism.

3. The method of claim 1, further comprising transmitting, by the exit device and via the wireless communication connection, a notification of a change in the dogging state in response to moving the dogging mechanism to the one of the undogged state or the dog-on-next-exit state.

4. The method of claim 1, further comprising:
   determining, by the exit device, a security state of the exit device based on sensor data generated by a plurality of sensors of the exit device; and
   providing, by the exit device, a notification of the security state in response to determining the security state.

5. The method of claim 4, wherein determining the security state of the exit device comprises:
   determining a door position status that indicates an open/closed position of a door;
   determining a latchbolt status that indicates an actuated/deactuated state of the latch mechanism; and
   determining a dogging status that indicates the dogging state.

6. The method of claim 5, wherein a determination of the security state indicates that the door is secure in response to the door position status indicating that the door is in a closed position, the latchbolt status indicating that the latch mechanism is deactuated, and the dogging status indicating that the dogging mechanism is not in the dogged state.

7. The method of claim 6, wherein determining the security state of the exit device further comprises determining whether a trim of the door has been tampered; and
   wherein the determination of the security state indicates that the door is secure in response to the door position status indicating that the door is in the closed position, the latchbolt status indicating that the latch mechanism is deactuated, the dogging status indicating that the dogging mechanism is not in the dogged state, and that the trim of the door has not been tampered.

8. The method of claim 5, wherein determining the security state of the exit device further comprises detecting an internal fault of the exit device.

9. The method of claim 4, wherein providing the notification of the security state comprises wirelessly transmitting the notification to the management system.

10. The method of claim 4, wherein providing the notification of the security state comprises displaying the notification on a visual indicator of the exit device.

11. An exit device, comprising:
a dogging mechanism having an undogged state, a dog-on-next-exit state, and a dogged state;
a control assembly that electromechanically controls operation of the dogging mechanism;
a pushbar having a projected position and a depressed position;
a wireless communication circuitry;
a processor; and
a memory comprising a plurality of instructions stored thereon that, in response to execution by the processor, causes the exit device to:
receive, via the wireless communication circuitry, an instruction from a management system to change a dogging state of the exit device by moving the dogging mechanism to one of the undogged state or the dog-on-next-exit state; and
transmit, in response to the instruction, one or more electrical signals to the control assembly to cause the dogging mechanism to move to the one of the undogged state or the dog-on-next-exit state;
wherein the dogging mechanism comprises:
a movable member having a first position correlated with the projected position of the pushbar and a second position correlated with the depressed position of the pushbar; and
a trigger operable to engage the movable member to selectively retain the movable member in the second position;
wherein, with the dogging mechanism in the undogged state, the trigger permits movement of the movable member between the first position and the second position, thereby permitting movement of the pushbar between the projected position and the depressed position;
wherein, with the dogging mechanism in the dogged state, the trigger retains the movable member in the second position, thereby retaining the pushbar in the depressed position; and
wherein, with the dogging mechanism in the dog-on-next-exit state, a next depression of the pushbar causes the dogging mechanism to transition to the dogged state.

12. The exit device of claim 11, further comprising a plurality of sensors adapted to generate sensor data, wherein the plurality of instructions further causes the exit device to:
determine a security state of the exit device based on the sensor data; and
provide a notification of the security state in response to a determination of the security state.

13. The exit device of claim 12, wherein the plurality of sensors comprises a door position sensor, a latchbolt sensor, and a dogging status sensor; and
wherein to determine the security state of the exit device comprises to:
determine a door position status that indicates whether a door is in one of a closed position or an open position based on sensor data generated by the door position sensor;
determine a latchbolt status that indicates whether a latch mechanism is in one of an actuated state or a deactuated state based on sensor data generated by the latchbolt sensor; and
determine a dogging status that indicates whether the dogging mechanism is positioned to hold the pushbar in the depressed position based on sensor data generated by the dogging status sensor.

14. The exit device of claim 13, wherein a determination of the security state indicates that the door is secure in response to the door position status indicating that the door is in the closed position, the latchbolt status indicating that the latch mechanism is in the deactuated state, and the dogging status indicating that the dogging mechanism is not positioned to hold the pushbar in the depressed position.

15. The exit device of claim 12, wherein to provide the notification of the security state comprises to wirelessly transmit the notification to the management system via the wireless communication circuitry.

16. The exit device of claim 12, further comprising a visual indicator, wherein to provide the notification of the security state comprises to display the notification on the visual indicator.

17. The exit device of claim 11, further comprising:
a manual dogging actuator configured to change the dogging state of the exit device by moving the dogging mechanism to the one of the undogged state or the dog-on-next-exit state in response to a manual actuating input; and
an electronic dogging actuator configured to change the dogging state of the exit device by moving the dogging mechanism to the one of the undogged state or the dog-on-next-exit state in response to the one or more electrical signals;
wherein the manual dogging actuator and the electronic dogging actuator are independently operable to change the dogging state of the exit device such that each of the manual dogging actuator and the electronic dogging actuator is capable of moving the dogging mechanism to the one of the undogged state or the dog-on-next-exit state when the dogging mechanism has been set to the other of the undogged state or the dog-on-next-exit state by the other of the manual dogging actuator and the electronic dogging actuator.

18. A method, comprising:
determining, by an exit device, a door position status that indicates whether a door is in one of a closed position or an open position based on sensor data generated by a door position sensor,
determining, by the exit device, a latchbolt status that indicates whether a latch mechanism is in one of an actuated state or a deactuated state based on sensor data generated by a latchbolt sensor,
determining by the exit device, a dogging status that indicates whether a dogging mechanism of the exit device is in a dogging state based on sensor data generated by a dogging status sensor, wherein the dogging mechanism includes a trigger element and a movable member, and in the dogging state, a pushbar of the exit device is depressed making a drive assembly operatively connected to a pushbar of the exit device to move the movable member into engagement with the trigger element, retaining the pushbar of the exit device in a depressed position,
determining, by the exit device, a security state of the exit device based on the door position status, the latchbolt status, and the dogging status, and
transmitting, by the exit device, a notification of the security state to a management system over a wireless communication connection established between the exit device and the management system,
wherein a determination of the security state indicates that the door is secured in response to the door position status indicating that the door is in the closed position, the latchbolt status indicating that the latchbolt is in the deactuated state, and the dogging status indicating that the dogging mechanism is not positioned such that the pushbar is held in the depressed position.

19. The method of claim 18, further comprising displaying another notification of the security state on a visual indicator of the exit device.

20. The method of claim 19, wherein the visual indicator comprises one or more light emitting diodes.

21. The method of claim 19, wherein the exit device comprises a window through which a portion of the visual indicator is visible; and wherein the visual indicator comprises:
- a mechanical indicator having a plurality of indicia defined thereon, wherein each of the plurality of indicia is indicative of a separate message to be conveyed to a user in a vicinity of the exit device; and
- a motor configured to move the mechanical indicator to align an indicium of the plurality of indicia with the window, the indicium conveying the another notification of the security state.

* * * * *